United States Patent
Mitani et al.

(10) Patent No.: US 7,164,601 B2
(45) Date of Patent: Jan. 16, 2007

(54) MULTI-LEVEL NONVOLATILE SEMICONDUCTOR MEMORY DEVICE UTILIZING A NONVOLATILE SEMICONDUCTOR MEMORY DEVICE FOR STORING BINARY DATA

(75) Inventors: Hidenori Mitani, Hyogo (JP); Tadaaki Yamauchi, Hyogo (JP); Taku Ogura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 215 days.

(21) Appl. No.: 10/936,615

(22) Filed: Sep. 9, 2004

(65) Prior Publication Data
US 2005/0057995 A1    Mar. 17, 2005

(30) Foreign Application Priority Data
Sep. 12, 2003    (JP)    ............... 2003-321528

(51) Int. Cl.
*G11C 16/00* (2006.01)
*G11C 16/08* (2006.01)

(52) U.S. Cl. ............................ 365/185.03; 365/230.06; 365/185.11; 365/230.03; 711/200; 711/202; 711/103

(58) Field of Classification Search ........... 365/185.03, 365/230.03, 230.06, 230.08, 230.04, 185.11; 711/200, 202, 209, 103
See application file for complete search history.

(56) References Cited

U.S. PATENT DOCUMENTS

| | | | | |
|---|---|---|---|---|
| 5,450,363 A | * | 9/1995 | Christopherson et al. | ..... 341/98 |
| 5,515,317 A | * | 5/1996 | Wells et al. | ................. 711/100 |
| 5,671,388 A | * | 9/1997 | Hasbun | ...................... 711/103 |
| 5,973,958 A | * | 10/1999 | Parker | ................... 365/185.03 |
| 6,363,009 B1 | * | 3/2002 | Fukuzumi | .............. 365/185.03 |

FOREIGN PATENT DOCUMENTS

| | | |
|---|---|---|
| JP | 6-309890 | 11/1994 |
| JP | 7-37393 | 2/1995 |
| JP | 10-55688 | 2/1998 |
| JP | 10-92186 | 4/1998 |
| JP | 11-25682 | 1/1999 |
| JP | 2001-6375 | 1/2001 |

* cited by examiner

*Primary Examiner*—J. H. Hur
(74) *Attorney, Agent, or Firm*—McDermott Will & Emery LLP

(57) ABSTRACT

A multi-level semiconductor memory device for storing multi-level data having three or more values is implemented by utilizing a nonvolatile memory device for storing 2-valued data. Identification of successive 16-bit data externally applied is performed with external address bit AA [2], and a storage block is selected with external address bit AA [23]. Upper word data LW and lower word data UW are compressed into byte data of 8 bits, respectively, and stored in a memory cell array.

13 Claims, 43 Drawing Sheets

FIG.11

|  | IPCBL | IPCIBL | DCLR | DSET |
|---|---|---|---|---|
| PRECHARGING | 0 | 0 | 0 | 0 |
| STANDING BY FOR READING OR WRITING | 1 | 1 | 0 | 0 |
| CLEARING OF ENTIRE DATA | 0 | 1 | 1 | 0 |
| SETTING OF ENTIRE DATA | 1 | 0 | 0 | 1 |

| PBLOAD | INVRDE | PBCHK | MODE |
|---|---|---|---|
| H | L | L | OVER-ERASURE VERIFICATION |
| H | L | H | 0 FIXING VERIFICATION |
| L | L | H | LOWER SIDE Vth CHECKING |
| L | H | L | 1 FIXING VERIFICATION |
| H | H | H | UPPER SIDE Vth CHECKING |
| H | H | L | WRITE-IN OF CELL DATA IN PB |

F2P: H: WRITE-IN OF CELL DATA IN PB

MULTI-LEVEL NONVOLATILE SEMICONDUCTOR MEMORY DEVICE UTILIZING A NONVOLATILE SEMICONDUCTOR MEMORY DEVICE FOR STORING BINARY DATA

BACKGROUND OF THE INVENTION

1. Field of the Invention

The present invention relates to a semiconductor memory device and, in particular, relates to a nonvolatile semiconductor memory device that can store multi-level data having three or more levels in a nonvolatile manner. More specifically, the present invention relates to a configuration for implementing a multi-level nonvolatile semiconductor memory device that stores multi-level data by utilizing an internal configuration of a nonvolatile semiconductor memory device for storing binary data.

2. Description of the Background Art

In a nonvolatile semiconductor memory device for storing data in a nonvolatile manner, a memory cell is formed of a single transistor. Such a memory cell transistor has a floating gate that is formed between a control gate and a substrate region. This floating gate is electrically isolated from its surrounding and the threshold voltage of the memory cell transistor is determined depending on the amount of charges (electrons) accumulated in the floating gate. In a memory cell (Single Level Cell: SLC) for storing binary data of "1" and "0," the states of a high threshold voltage and a low threshold voltage are correlated with each data value of the binary data. Generally, the state of a low threshold voltage is referred to as an erased state and is correlated with data "1", while the state of a high threshold voltage is referred to as a programmed state (written state) and is correlated with the state where data "0" is stored.

A nonvolatile memory cell is formed of one transistor and therefore, has an advantages that the area occupied by the cell is small and data can be stored in a nonvolatile manner.

In order to store a large amount of data such as audio data and video data, it is required to increase the storage capacity. In order to satisfy such requirement, the specification of a multi-level memory cell (MLC: Multi-Level Cell) for storing data of two or more bits in one memory cell has been implemented. Multi-level data (data formed of two or more bits) instead of binary data is stored in a memory cell and therefore, the storage capacity can be increased while suppressing an increase in the area of the memory device. Such a nonvolatile semiconductor memory device for storing multi-level data is disclosed in, for example, Prior Art Document 1 (Japanese Patent Laying-Open No. 2001-6375), Prior Art Document 2 (Japanese Patent Laying-Open No. 11-25682) and others.

Document 1 discloses a configuration for storing multi-level data by compressing data supplied via the same data terminal at different timings, to produce compressed data for writing into a memory cell.

In the configuration disclosed in Document 2, predetermined operational processing is applied to 2 bit data at the time when storage data is produced, so that the data is converted to 4-level data that correspond to threshold voltage levels. Data writing is performed by extracting charges (electrons) from the floating gate in accordance with bit "1" that is included in this 4-level data. The storage data of a latch circuit that is arranged corresponding to a corresponding sense amplifier is set at bit "0" when writing is completed. Writing is competed when the entire data of the latch circuits are set to the writing completed state. Read out of data is performed by changing the voltage of a word line in multiple stages in data reading out.

Furthermore, Prior Art Document 3 (Japanese Patent Laying-Open No. 10-92186) discloses a configuration in which each of the threshold voltages is correlated with gray code data sequentially starting from the lowest threshold voltage when multi-level data is stored. Data detection in binary searching method in data read out is made easy by correlating the gray-coded data to the threshold voltages. A latch circuit is provided corresponding to each of the bit lines, so that latch data in the latch circuit is verified in accordance with the latched data of the latch circuit and the read-out data for verification in data writing and then the latched data is set at the write-in completed state when the latched data and the read-out data coincide with each other so as to carry out the programming only on memory cells where programming is required.

Prior Art Document 4 (Japanese Patent Laying-Open No. 10-55688) discloses a NAND type flash memory provided with a page buffer in order to carry out data writing in page units. In this Document 4, data read-out is performed by one value at a time by varying the word line voltage sequentially and after this read-out, an addition circuit is used to convert the multi-level data into multi-bit data for storage in the page buffer.

Prior Art Document 5 (Japanese Patent Laying-Open No. 7-37393) discloses a serial sense circuit that reads out data serially from one memory cell by using a sense amplifier in read-out of multi-level data. In this serial sense circuit, a reference voltage and a memory cell read-out potential are compared, and the next comparison reference voltage is selected in accordance with the result of the comparison and is again compared with the memory cell read-out voltage. Thus, storage data, or 2-bit data in the case of 4-level data, in a single memory cell are sequentially read-out.

Prior Art Document 6 (Japanese Patent Laying-Open No. 6-309890) discloses a nonvolatile semiconductor memory device that switches the storage between 4-level data and 2-level (binary) data in accordance with a control signal. In the configuration shown in the Document 6, a sense circuit is provided exclusively to each mode for 2-level data and 4-level data and the write voltage levels for bit lines are switched between 2-value mode and 4-value mode in accordance with the control signal instructing 4 levels or 2 levels in the program circuit. Document 6 shows a configuration for accessing one memory cell.

It is desirable to implement an SLC configuration and an MLC configuration in the same chip from the view points of product management and design efficiency. However, in Documents 1 and 2, only the configuration of a multi-level memory is taken into account while the structure for coexisting an SLC configuration and an MLC configuration is not taken into consideration.

In addition, data conversion is performed such that bits in the same positions of different data are written in one memory cell in Documents 1, 2 and 6. In such a case, one memory cell stores data bits of different addresses to make the allocations of addresses complicated and therefore, it becomes difficult to coexist an SLC configuration and an MLC configuration that are different in number of address bits In the configuration shown in Document 3, the data stored in a memory cell is converted into a gray code in accordance with threshold voltages. However, the configuration shown in this Document 3, relates to a circuit for carrying out data writing in page (word line) units by storing write data in latch circuit provided corresponding to each bit line, and the configuration for data writing in byte units is not taken into consideration. In addition, allocation of addresses for switching between an SLC configuration and an MLC configuration or coexistence of SLC configuration and MLC configuration is not taken into consideration.

In Document 4, a page buffer is utilized for converting two-bit data to four values to perform data writing one level (value) at a time, while one value is read out at a time by sequentially varying the word line voltage upon data read out so that two-bit data is generated based on the result of this read-out. In data read out the word line voltage is changed and a problem arises that a long period of time is required for data read-out. In addition, allocation of addresses is not taken into consideration in this Document 4, too.

In Document 5, a sense amplifier is used and the comparison basis potential serving as the comparison reference for the memory cell potential is changed to read out data in the same memory cell in a serial manner. However, the configuration for stably generating the basis voltage for the comparison is not taken into consideration. In addition, allocation of addresses for allowing the coexistence of an SLC configuration and an MLC configuration is not taken into consideration.

Document 6 shows a configuration for switching an SLC configuration and an MLC configuration by means of a control signal. However, input/output of data is performed in units of one bit or two bits in the configuration disclosed in this Document 6 and a configuration for writing in and for reading out data words in byte units is not taken into consideration. In addition, a sense amplifier for reading out 4-level data and a sense amplifier for reading out 2-level data are separately provided in the configuration shown in this Document 6 and therefore, the circuit configuration is redundant and a problem of increased circuit layout area arises. Moreover, efficient allocation of addresses for allowing the coexistence of SLC configuration and an MLC configuration is not taken into consideration.

Further, Documents 1 to 3 and 6 show a NAND type flash memory in which data writing is performed in page units and do not show a configuration of an NOR-type flash memory wherein data writing is performed by utilizing channel hot electrons. In addition, a configuration for implementing both the page mode operation and the random access operation in such a memory device is not taken into consideration.

SUMMARY OF THE INVENTION

An object of the present invention is to provide a nonvolatile semiconductor memory device of an MLC configuration, compatible with an SLC configuration, for allowing writing and reading of multi-level data at high speed.

Another object of the present invention is to provide a nonvolatile semiconductor memory device of an MLC configuration allowing stable data read out in a page mode according to a serial sense scheme.

According to a first aspect of the present invention, a semiconductor memory device includes an address conversion circuit that uses a first bit of an address signal as a block selecting address bit in a first operation mode, uses the first bit of the address signal as an address bit indicating the order in which multi-bit data are supplied in a second operation mode, and uses the second bit of the address signal as a block selecting address bit in the second operation mode.

According to a second aspect of the present invention, a semiconductor memory device includes: a plurality of memory cells aligned in rows and columns; a plurality of reference cells; and a current/voltage conversion circuit which averages currents flowing through these reference cells and converts the averaged current into a voltage for generating a reference voltage.

According to a third aspect of the present invention, a semiconductor memory device includes: a plurality of memory cells arranged in rows and columns; a plurality of word lines arranged corresponding to the respective memory cell rows and having the memory cells in the corresponding rows connected; a circuit for dividing a first voltage at a predetermined voltage level that is transmitted onto a selected word line; a reference cell that is selectively made conductive in accordance with the divided voltage; a reference voltage generation circuit for generating a reference voltage in accordance with a current that flows through the reference cell; and a sense amplifier circuit for generating a comparison reference current in accordance with the reference voltage and comparing this comparison reference current with the current that flows through the selected memory cell to sense the memory cell data.

According to a fourth aspect of the present invention, a semiconductor memory device includes: a plurality of memory cells divided into a plurality of blocks; a memory cell selection circuit for selecting a memory cell; a plurality of sense amplifier circuits arranged corresponding to each of the blocks for sensing data of the memory cell selected by the memory cell selection circuit; a first latch circuit for latching sensed data from the plurality of sense amplifier circuits in accordance with a first operation timing signal; and a second latch circuit for latching and storing the sensed data from the plurality of sense amplifier circuits in accordance with a second operation timing signal.

The semiconductor memory device according to the fourth aspect of the present invention further includes a sense control circuit for activating the sense amplifier circuits in accordance with first and second operation timing with respect to a common address.

According to a fifth aspect of the present invention, a semiconductor memory device includes: a sense amplifier circuit for comparing a cell current driven by a selected memory cell with a reference current to sense data of the selected memory cell in accordance with a result of comparison; a sense control circuit for activating the sense amplifier circuit a number of times for a common address; and a circuit for setting a second time reference current amount in accordance with first time sense data of the sense amplifier circuit.

The first bit and the second bit of an address signal are switched in the second operation mode and thereby an increase in the address signal bit in the case when the SLC configuration is utilized for the MLC configuration can be easily accommodated without changing the internal configuration. In addition, a block address bit is utilized so that data in successive addresses can be stored in each block even in the MLC configuration.

Currents that flow through a plurality of reference cells are averaged and a reference voltage is generated in accordance with the averaged currents. Thus, a reference voltage at a desired voltage level can be stably generated without being affected by variation of the characteristics of the reference cells.

A divided voltage is transmitted so that an averaged current at a desired level can be generated to produce a reference voltage without changing the sizes and the threshold voltages of the reference cells.

A sense amplifier circuit is arranged corresponding to each memory block and the data from the sense amplifier circuit is transferred to the first and second latch circuits for the same address. Thus, read out of data can be performed in the serial sense scheme even in storage of multi-bit data, and in addition, data read out in a page mode can be easily implemented.

When memory cell data is detected in the serial sense scheme, second time reference current is set in accordance with first time sensed data and thereby, data can be precisely sensed by the sense amplifier circuit for each word bit without changing the word line voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a diagram showing the correspondence relationship between the logic levels of the page buffer array control signals shown in FIG. 9 and the operation modes;

DESCRIPTION OF THE PREFERRED EMBODIMENTS

First Embodiment

Figure 1:
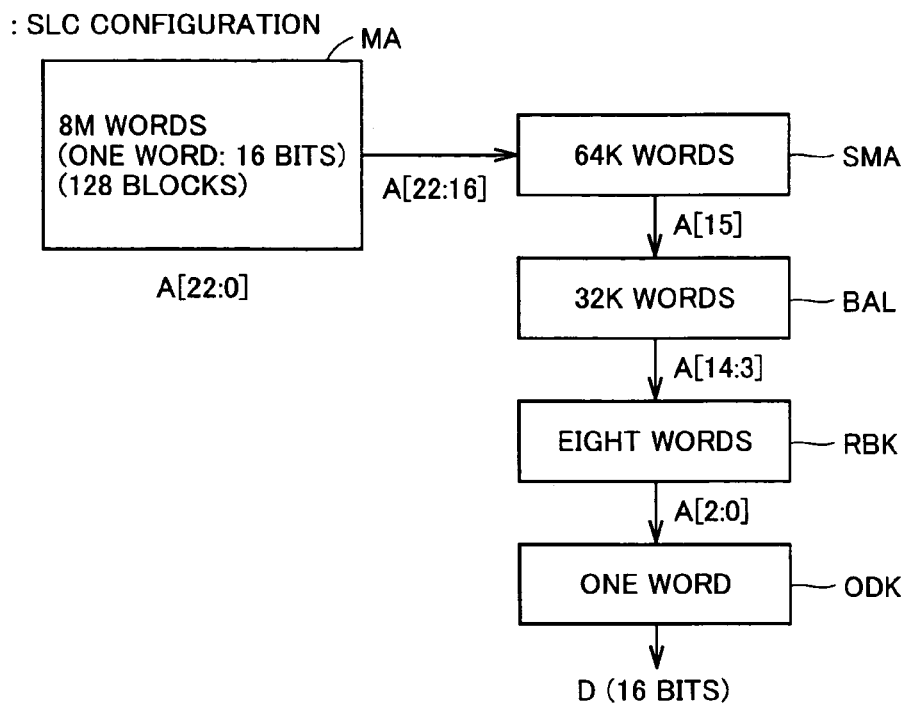
FIG. 1 is a diagram schematically showing the allocation of address bits of a word in an SLC configuration.

FIG. 1 is a diagram schematically showing the configuration of a memory array and the configuration of an address of a memory cell of a semiconductor memory device to which the present invention is applied. In FIG. 1, a memory array MA has memory cells of 8M words×16 bits. Here, 1 word is formed of 16 bits.

In memory array MA, 128 blocks of 64K words are provided. Accordingly, an address A [22:0] of 23 bits is used for selecting 1 word from these 8M words. Memory array MA is typically divided into two memory mats. Address bits A [22:16] are used for selecting a block SMA of 64K words. 64K word block SMA includes two 32K word blocks BAL. The 32K word block BAL is typically used as a sector and utilized as an erasure unit of data.

A read out data block RBK of 8 words is selected from 32K word block BAL in data reading out. Address bits A [14:3] are utilized for selecting the 8 words from 32K word block BAL. Address bits A [2:0] are utilized for finally selecting a read out data block ODK by selecting 1 word from read out data block RBK of 8 words and thus data D of 16 bits is ultimately outputted.

Figure 2:
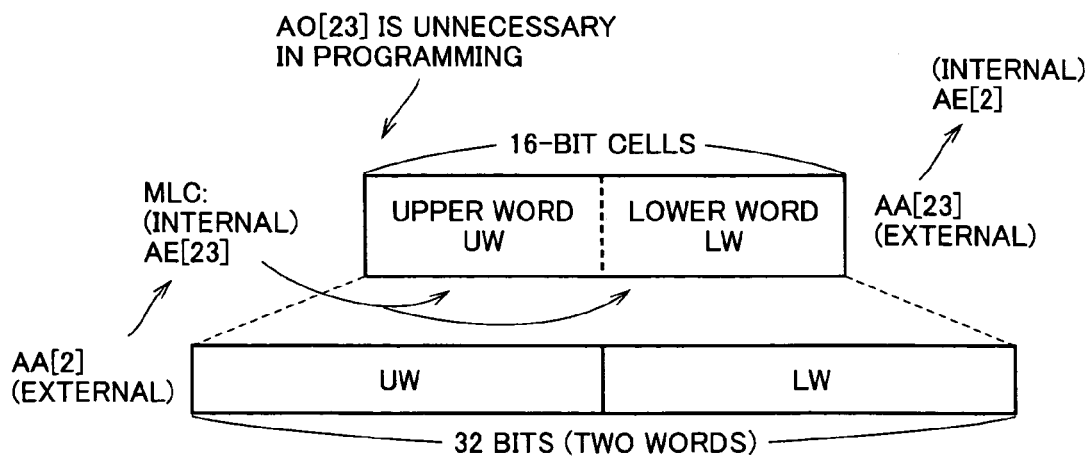
FIG. 2 is a diagram schematically showing the allocation of address bits of a word in an MLC configuration.

Data of 16 bits is stored in memory cells of 16 bits in the SLC configuration of the memory array shown in FIG. 1. It is now be considered to utilize the semiconductor memory device of this SLC configuration as a semiconductor memory device of the MLC configuration. In particular, 4-level data or 2-bit data is assumed to be stored in one memory cell in the MLC configuration. In this case, as shown in FIG. 2, data of 32 bits is stored in memory cells of 16 bits. Specifically, an upper word UW and a lower word LW are stored in the memory cells of 16 bits. These upper word UW of 16 bits and lower word LW of 16 bits are words having different addresses in an external logical space, but are stored in memory cells of the same address in the memory space.

If the address allocation as shown in this FIG. 1 is utilized for the MLC configuration for storing multi-level data, the storage capacity of data becomes doubled and therefore additional address bit A [23] becomes necessary. It is now considered utilize this address bit [23] without adversely affecting the SLC configuration. In this case, as described later, 32K word block BAL is divided into 2 blocks by address bit A [2]. For this block selection, external address bit AA [23] is converted into internal block address bit A [2] so as to be utilized as a block selection bit. On the other hand, external address bit AA [2] is utilized as an internal address bit AE [23] for selecting upper word UW and lower word LW.

With such address bit allocation, internal address bit AE [23] is utilized in a data read out part for selection of upper word UW and lower word LW. In the programming operation for writing data, 32-bit data of upper word UW and lower word LW is compressed into data of 16 bits and programming is performed. Accordingly, the same memory address space is shared between the SLC configuration and the MLC configuration with respect to the programming of data and therefore-address bit AO [23] for designating the upper and lower words is unnecessary in programming.

With such address allocation, only the configuration is required for controlling the operation of selecting upper word UW and lower word LW by using a new internal address bit AE [23] when 1 word is selected from the 8 words shown in FIG. 1. The other address bits are the same between the SLC configuration and the MLC configuration, and an MLC configuration for storing 4-level data can be implemented by utilizing the SLC configuration.

Figure 3:
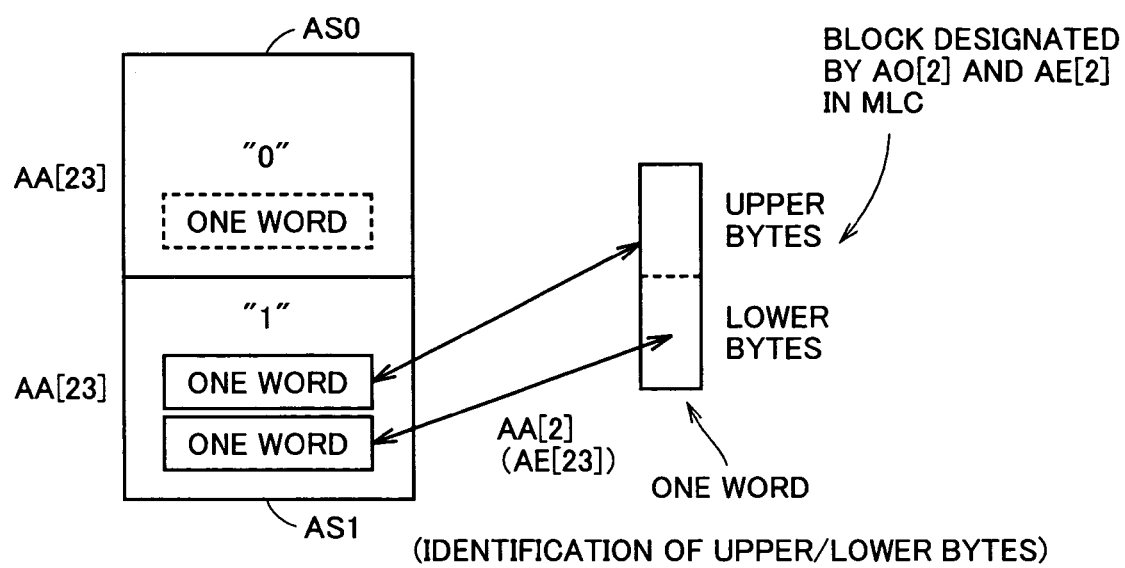
FIG. 3 is a diagram schematically showing the correspondence relationship between words of separation and exchange in an external processing device and words of storage data.

In addition, as shown in FIG. 2, upper word UW and lower word LW are s each written into different 8-bit cells in 16-bit cells and accordingly, data at the same value of address bit AA [23] can be stored in an upper byte data storage region and a lower byte data storage region within the common block. Accordingly, as shown in FIG. 3, with address bit AA [23] being converted into internal address bits AE [2] and AO [2], the upper address space and the lower address space in a logical space AS are respectively made-corresponding to separate blocks in the memory address space. Specifically, as shown in FIG. 3, successive 2 words in the same sub-logic space in sub-logic spaces AS0 and AS1 respectively designated by address bit AA [23] being "0" and "1" can be stored respectively in the upper sub-logic space word storage block region and in the lower sub-logic space word block region in the memory array. Successive external 2 words in the same sub-logic space can be distributedly stored in the upper byte region and lower byte region, respectively, at the same address of the block region of the memory array.

In memory cells of 1 word, the upper byte region and the lower byte region are designated by internal address bit AE [23] corresponding to external address bit AA [2]. As a result, allocation of addresses of the internal address bits becomes simplified and in addition, the matching of addresses between the memory space and the logic space can be established in the MLC configuration. In addition, as described in detail later, the upper word and the lower word of successive 2 words can be readily identified when memory cell data is read out in accordance with the serial sense scheme and the data can be read out easily in the page mode.

Figure 4:
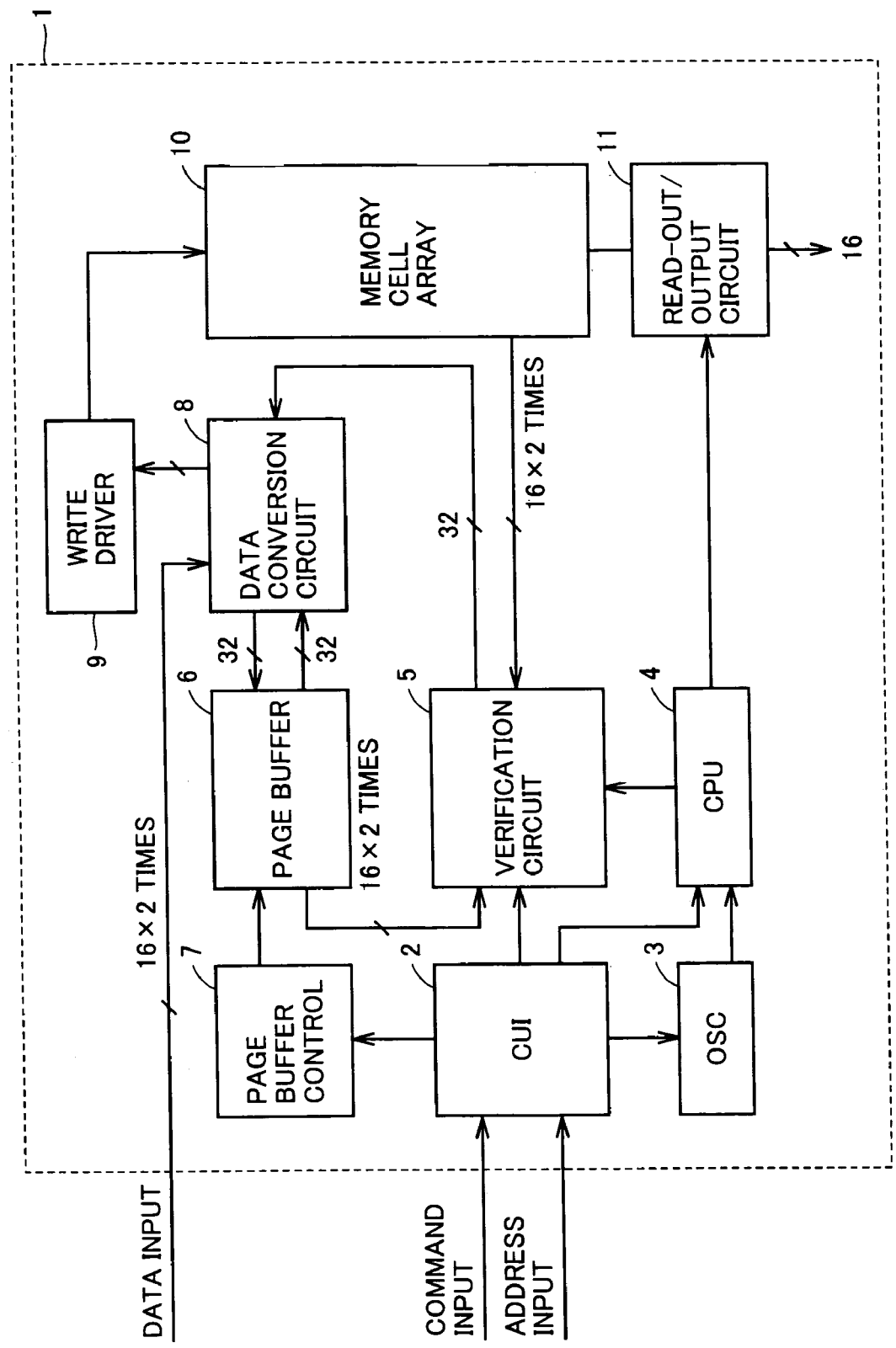
FIG. 4 is a diagram schematically showing the entire configuration of a nonvolatile semiconductor memory device according to the present invention.

FIG. 4 schematically shows an entire configuration of the nonvolatile semiconductor memory device according to the first embodiment of the present invention. In FIG. 4, a nonvolatile semiconductor memory device 1 includes: a memory cell array 10 having a plurality of nonvolatile memory cells arranged in rows and columns; a command user interface (CUI) 2 receiving a command and an address externally applied for generating various control signals required for an internal operation; an OSC circuit 3 including an oscillator that oscillates at a predetermined period under control of command user interface (CUI) 2 for generating an internal clock signal; and a control unit (CPU) 4 for performing operations required for a variety of internal operations, such as erasure, verifications and programming, in synchronization with oscillation signal (clock signal) from OSC circuit 3. The CPU 4 controls the generation of internal signals and internal voltages which are necessary for erasure, programming, verifications and read-out in accordance with an operational mode instruction supplied from command user interface (CUI) 2.

Non-volatile semiconductor memory device 1 further includes a data conversion circuit 8 that transform the bit positions of externally applied 16-bit data (word data) in units of 2 words for storage in a page buffer 6 and compresses 32-bit data read out from page buffer 6 into 16-bit data for application to a write driver 9. This data conversion circuit 8 carries out data conversion such that the bits of the same word in 2-word data supplied successively are aligned and stores the converted data in page buffer 6, and in addition, compresses 32-bit data (2 words) stored in the page buffer into 16-bit data. As a result, upper word UW and lower word LW, as shown in FIG. 2, supplied successively are stored, respectively in the upper byte position and lower byte position of the 16-bit memory cells.

Write driver 9 writes 16-bit data supplied from the data conversion circuit 8 in selected memory cells of memory cell array 10.

The nonvolatile semiconductor memory device 1 further includes a verification circuit 5 that verifies whether write-data is precisely written into the address upon data writing. Although the operation of verification circuit 5 will be described later in detail, this verification circuit 5 receives write-in data of two words from page buffer 6 and verification-read data of two words from memory cell array 10, and detects the coincidence/non-coincidence for all bits of the received data and writes data in page buffer 6 with the value of bits indicating the write (programming) completion based on the determination result. Data conversion circuit 8 again carries out data conversion upon programming for application to write driver 9. Therefore, write driver 9 applies a high voltage to bit lines only for the memory cells that require programming in data writing.

Programming is performed in units of 16-bit memory cells in memory cell array 10 while utilizing channel hot electrons (CHE). Programming indicates an operation of increasing a threshold voltage while erasure indicates an operation of decreasing a threshold voltage.

The data writing operation (that includes verification operation) to memory cell array 10 will first be briefly described, and then the configurations of the circuits will be described in detail, and thereafter, external read-out of data will be described.

Figure 5:
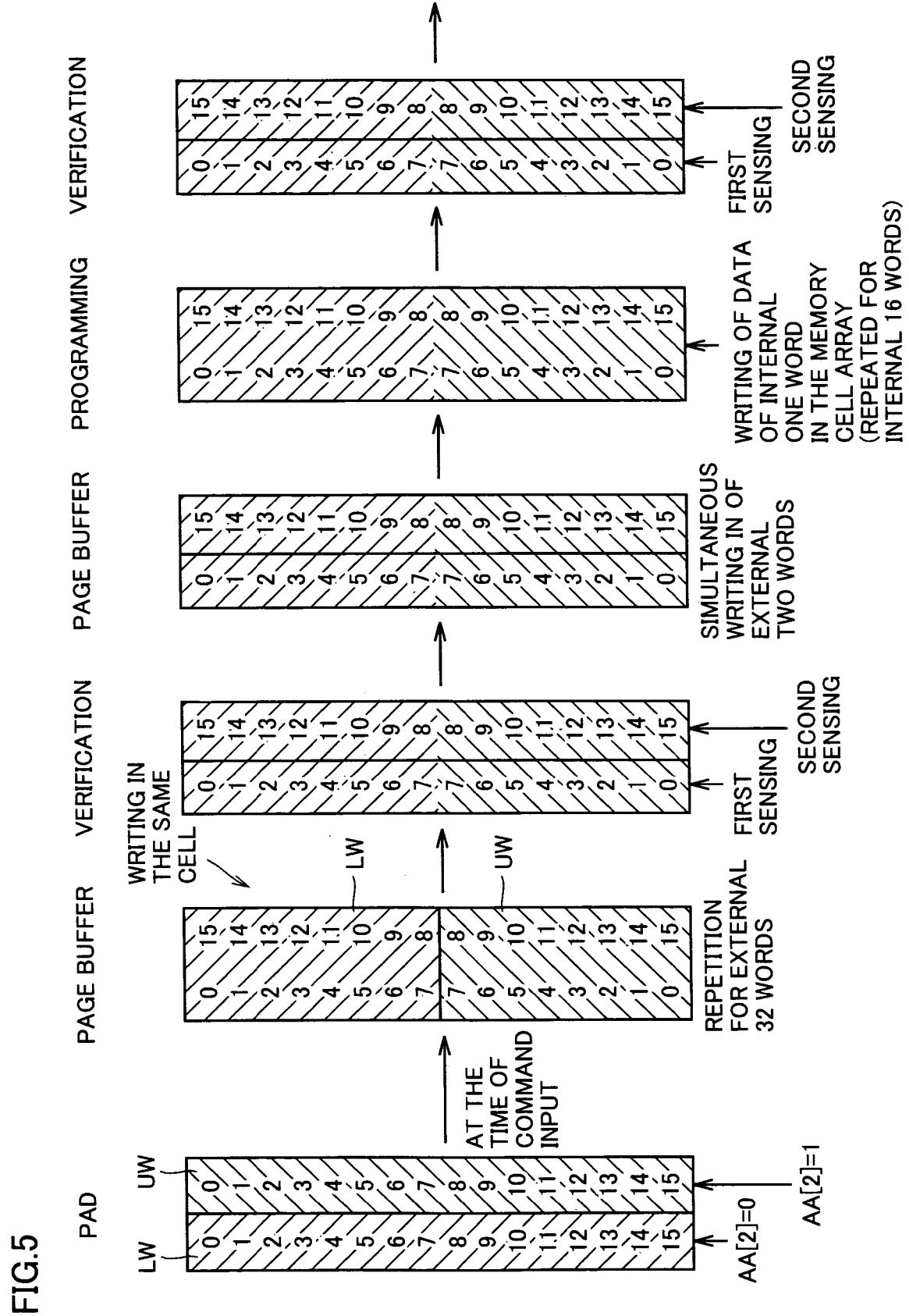
FIG. 5 is a diagram illustrating the correspondence relationship between the external data and the internal data of the MLC configuration as well as the writing operation according to the present invention.

FIG. 5 is a diagram showing an example of an operation sequence for storing 4-level data in memory cells. In data writing, 16-bit data is successively supplied externally. Address bit AA [2] externally supplied designates whether the supplied 16-bit data is upper data (word) or lower data (word) of the 32-bit data of the write-in unit. When external address bit AA [2] is "0," the lower 16-bit word is designated and when external address bit AA [2] is "1," the upper 16-bit word is designated. The identification of the upper word UW or the lower word LW is required only in writing data into page buffer 6. Writing of data in memory cell array 10 and verification read-out are performed in 16-bit units and therefore the address bit AA[2] is not utilized in identification of upper word UW and lower word LW. When data is read out externally, address bit AA [2] externally supplied is utilized for identification between the upper word data and the lower word data.

Two words having different values of external address bit AA [2] supplied externally via pads are written in page buffer 6 after the positions of the two-word data bits are changed in data conversion circuit 8 shown in FIG. 4. In this conversion of the data bit positions in writing into page buffer 6, these bit positions are changed such that data bits at symmetrical positions in the lower byte and in the upper byte are written in the same memory cells.

According to such change in bit positions of the words UW and LW, when reading out, for example, 1 external word from the page buffer, read-out operation from the page buffer is performed twice and thereby 16-bit data or 16-bit external word, can be read out internally, and in data writing into 1 memory cell, 2 bits of the same external data word can be compressed to be written into the same memory cell. In addition, the SLC configuration can be accommodated only by utilizing either region, lower word LW or upper word UW in the page buffer.

Here, for aligning the corresponding bits of the same word, the adjacent data terminals, or data bits D [0] and D [1], may be aligned. In this case, a semiconductor memory device can be implemented by which write-in and read-out of external data are performed in a byte mode.

Transformation of word and bit positions in data conversion circuit 8 as well as write-in to page buffer 6 are repeatedly performed on 32 words externally supplied. Then, 32-bit data is compressed to 16-bit data to be written in memory cell array 10 via write driver 9 in data conversion circuit 8. Before the write-in, first, the verification operation is performed so that coincidence or non-coincidence between the data stored in the memory cells and the data stored in the page buffer is verified. Programming is performed, in accordance with new write data, only on memory cells that require the programming operation, to reduce the current consumption.

Data read out from memory cell array 10 is performed in accordance with the serial sense scheme in which the sensing operation is successively performed twice on a selected memory cell. In the first sensing, the lower byte data of each word is read out and at the time of the second sensing operation, the upper byte data of each word is read out. Coincidence or non-coincidence between the data read out from the memory cell array 10 and the data read out from page buffer 6 is verified in verification circuit 5 shown in FIG. 4. When non-coincidence is detected, data is again written in memory cell array 10 via write driver 9 through data conversion circuit 8.

In the verification operation, verification circuit 5 stores the bit indicating the write-in completion at a corresponding position in page buffer 6 for each data bit. Thus, write-in can be performed again on the data bits other than the normally written bits in each word. Write-in to page buffer 6, write-in (programming) to memory cell array 10 and verification are repeatedly performed by updating the addresses sequentially for the internal 16 words and when the data write-in is completed precisely for all the internal 16 words, the write-in of data of 32 words externally supplied is completed: Data writing in units of the internal 16 words is performed and the address generation sequence in the data writing and verification can be facilitated, and accordingly, the configuration of the address generation part can be simplified.

Figure 6:
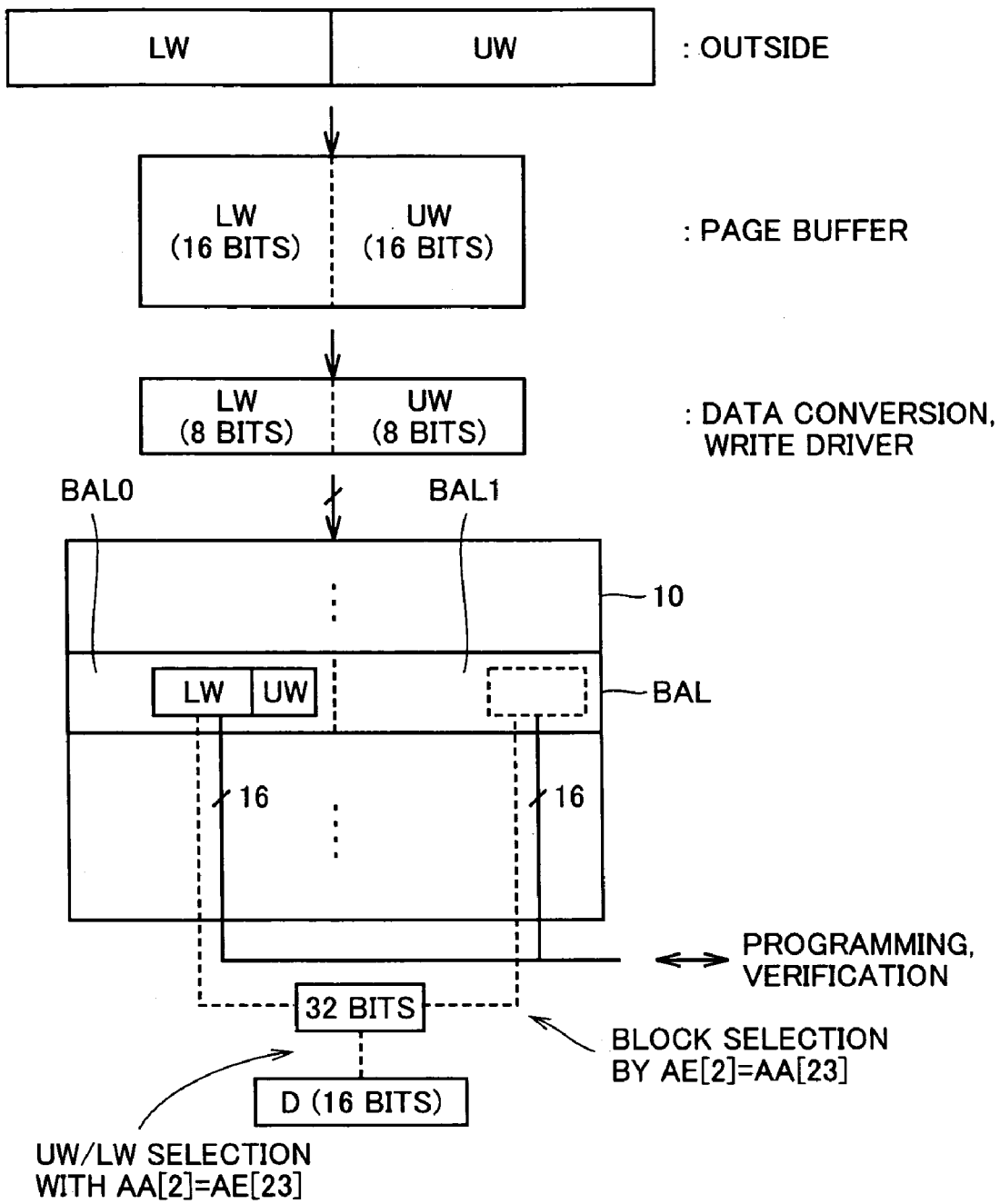
FIG. 6 is a diagram schematically showing the correspondence relationship between the storage data and external words of the semiconductor memory device according to the present invention.

FIG. 6 is a diagram schematically showing the flow of data. As shown in FIG. 6, lower word LW and upper word UW are sequentially supplied. In the data conversion circuit, these sequentially supplied 16-bit words LW and UW are changed in their positions and are stored in the page buffer as 32-bit data. For each 32-bit data of 2 words stored in this page buffer, upper word UW and lower word LW are compressed by the data conversion circuit into 8-bit data, respectively, to be transmitted to memory cell array 10 via the write driver as 16-bit memory cell data. In memory cell array 10, the lower word data and upper word data are respectively stored as the upper byte data and the lower byte data in the designated address of the block designated by address bit AA [23] between blocks BAL0 and BAL1 in the selected memory block BAL.

In data writing and verification operation, 8-bit data LW and UW written in this selected block BAL are read out in parallel and the verification operation and the rewriting are performed. In the data read-out, the region BAL1 that corresponds to the upper logic address space and BAL0 that corresponds to the lower logic address space in this block BAL are selected by internal address bit AE [2] (external address bit AA [23]). In the internal reading-out for the verification, the address bit AA [2] is not utilized. The verification operation is performed in 2-word (32 bits) units. In the external data read-out, the final 16-bit data D is generated and externally read out in accordance with internal address bit AE [23] that corresponds to address bit AA [2].

Since the upper word and the lower word are stored in 16-bit memory cells, it is necessary to normally, externally apply the upper data (upper word) and the lower data (lower word) alternately, and it is necessary to normally toggle the external address bit AA [2].

Figure 7:
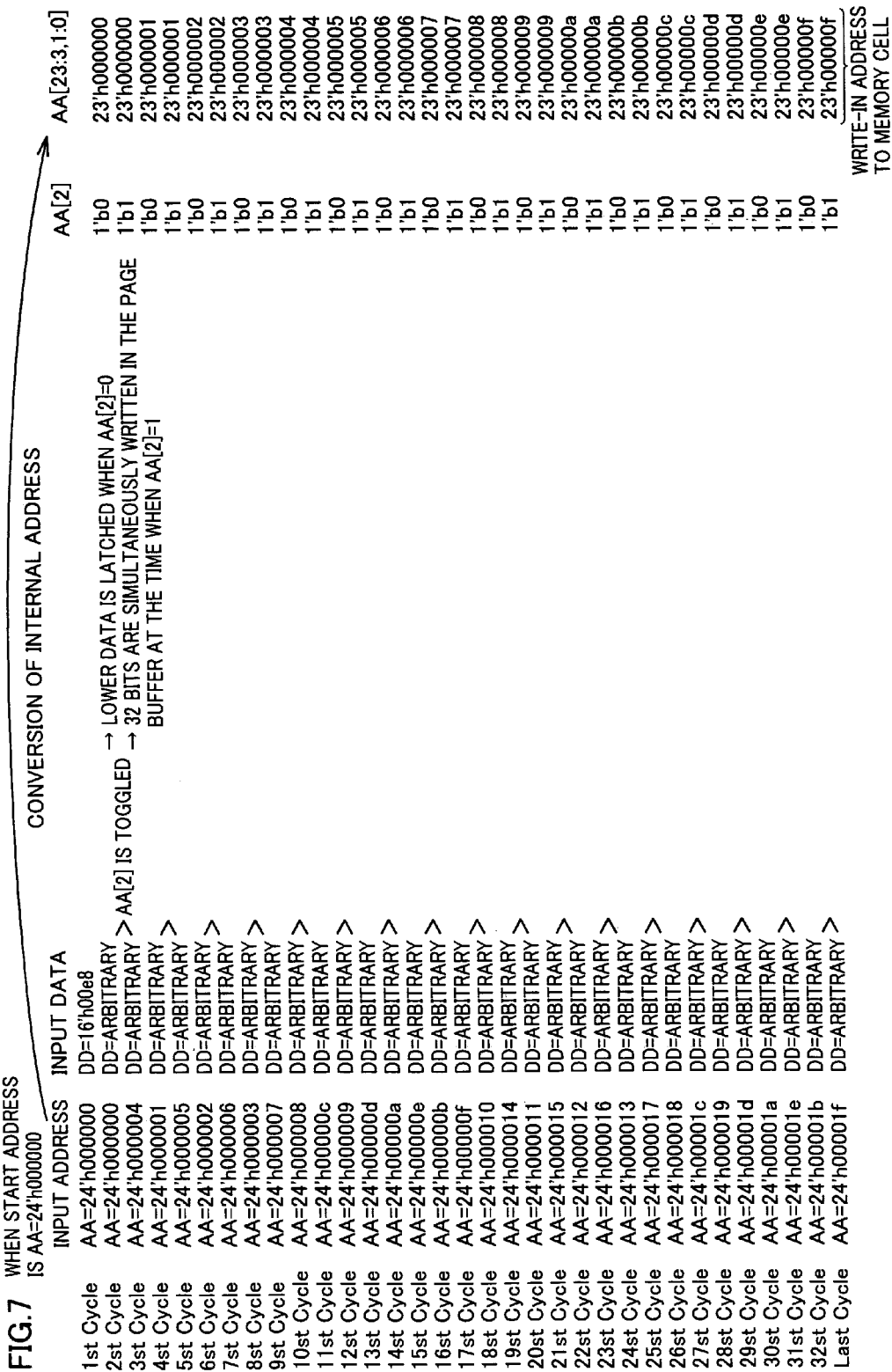
FIG. 7 is a diagram showing an example of a changing sequence of external addresses and internal addresses in data setup in a page buffer.

FIG. 7 is a diagram showing an example of an alteration sequence of the inputted address in the data writing. In FIG. 7, the sequence of the address alteration in the case when the starting address is an external address AA [24'h000000] as an example. Here in FIG. 7, "24'" indicates 24-bit signal/data and "h" indicates a hexadecimal notation. In addition, in FIG. 7 "1'b" indicates 1-bit signal and in the same manner "23'" indicates a 23-bit signal.

In FIG. 7, command "16'h00e8" is provided instructing data writing in the first cycle. The command is typically transferred using a data bus. Subsequently, write-in data is transferred together with an address signal from the next cycle. When external address bit AA [2] is 0, the lower word data is latched and when the subsequently supplied address bit AA [2] is "1," the upper word data and the lower word data of 32 bits are simultaneously written in the page buffer (data position alteration is performed).

Thereafter, external address bit AA [2] is sequentially toggled and the remaining external address bits AA [23:3, 1:0] are sequentially incremented to be supplied together with the write-in data. When 32 words are supplied, one write-in unit is completed. The data write-in is performed in units of 32 words. Address bit AA [2] is not particularly required to be always toggled by a device that makes an access to this nonvolatile semiconductor memory device. The device that accesses nonvolatile semiconductor memory device 1 may sequentially increment the address signal and the lowest address bit AA [0] may be switched to address bit AA [2] inside the semiconductor memory device 1. In this nonvolatile semiconductor memory device, the write-in address to memory cell array 10 is incremented by 1 for the write-in data in the case when external address bits AA [23:3, 1:0] are incremented by 1 address for each 2 cycles.

Figure 8:
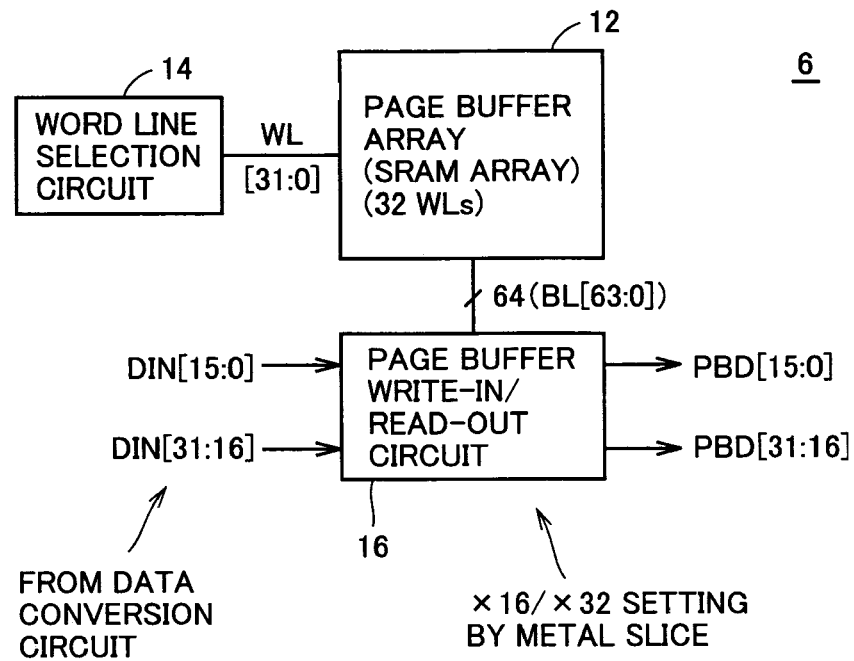
FIG. 8 is a diagram schematically showing the configuration of a page buffer shown in FIG. 4.

FIG. 8 is a diagram schematically showing an example of the configuration of page buffer 6 shown in FIG. 4. In FIG. 8, page buffer 6 includes a page buffer array 12 for storing write-in data and verification expected value data; a page buffer write-in/read-out circuit 16 for writing data DIN [15:0] and DIN [31:16] in the page buffer array and for reading out data PBD [15:0] and PBD [31:16] from page buffer array 12; and a word line selection circuit 14 for selecting a word line in the page buffer array 12. Page buffer array 12 is formed of an SRAM array in which SRAM cells are arranged in 32 rows and 64 columns and 32 word lines WL and 64 pairs of bit lines BL are arranged.

As described later, word line selection circuit 14 selects one word line from among 32 word lines WL in accordance with word line pre-decoded signals RAL, RAM and RAU generated by pre-decoding a page buffer address PA [13:4], which in turn is generated on the basis of write-in address AO [4:3,1:0] in writing. Upon word line selection, external address bit AA [2] is not utilized in the MLC configuration (this configuration is described later).

Page buffer write-in/read-out circuit 16 can be set to 32-bit data write-in/read-out or to 16-bit data write-in/read-out set by means of metal slice. When page buffer write-in/read-out circuit 16 is set to the 16 bit configuration, this semiconductor memory device operates in the SLC configuration, and in the case where the circuit 6 is set to the 32 bit configuration, this semiconductor memory device operates in the MLC configuration.

Data DIN [31:16] and DIN [15:0] supplied to page buffer write-in/read-out circuit 16 is supplied by data conversion circuit 8 shown in FIG. 4.

Figure 9:
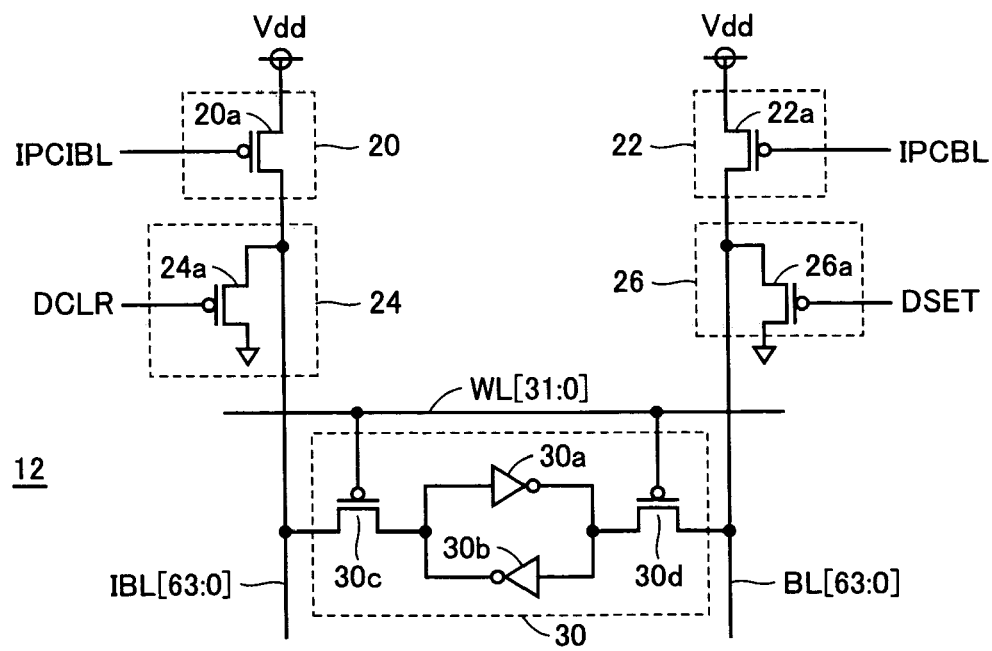
FIG. 9 is a diagram schematically showing the configuration of the page buffer array shown in FIG. 8.

FIG. 9 is a diagram schematically showing the configuration of page buffer array 12 shown in FIG. 8. In FIG. 9, page buffer array 12 includes SRAM cells 30 arranged in 32 rows by 64 columns. Word lines WL [31:0] are provided corresponding to the respective rows of SRAM cells 30 and bit line pairs BL [63:0] and IBL [63:0] are provided corresponding to the respective columns of SRAM cells 30. Bit lines BL [i] and IBL [i] are provided in pair so as to transfer complementary data. Here "i" is an any integer ranging from 0 to 63.

An SRAM cell 30 includes inverters 30a and 30b forming a latch circuit for storing data, and transfer gates 30c and 30d for connecting input nodes of inverters 30a and 30b to corresponding bit lines BL [k] and IBL [k] in response to the signal on a corresponding word line WL [i].

Page buffer array 12 further includes, as bit line peripheral circuitry: a bit line precharging circuit 20 for precharging bit lines IBL [63:0] to the power supply voltage level in accordance with a complementary bit line precharging signal IPCIBL; a bit line precharging circuit 22 for precharging bit lines BL [63:0] to the power supply voltage Vdd level in accordance with a bit line precharging signal IPCBL; a bit line clearing circuit 24 for discharging complementary bit lines IBL [63:0] to the ground voltage level in accordance with a data clearing signal DCLR; and a bit line setting circuit 26 for setting bit lines BL [63:0] to the ground voltage level in accordance with a data setting signal DSET.

Bit line precharging circuits 20 and 22 are formed of P-channel MOS transistors 20a and 22a having gates receiving bit line precharging signals IPCIBL and IPCBL, respectively. Bit line clearing circuit 24 is formed of an N-channel MOS transistor 24a that is made conductive in accordance with data clearing signal DCLR. Bit line setting circuit 26 includes an N-channel MOS transistor 26a rendered conductive to discharge bit lines BL [63:0] to the ground voltage level in accordance with data setting signal DSET.

All bit lines IBL [63:0] and BL [63:0] are precharged to the common power supply voltage Vdd level in the bit line precharging circuits 20 and 22 and all bit lines IBL [63:0] and BL [63:0] are simultaneously set to the ground voltage level in accordance with clearing signal DCLR and data setting signal DSET by bit line resetting circuit 24 and in bit line setting circuit 26. These MOS transistors 20a, 24a and 26a may be provided in common to all bit lines IBL.[63:0], or may be provided individually to each bit line.

A bit line clearing circuit 24a and a bit line setting circuit 26a are provided in the bit line peripheral circuitry and thereby resetting and setting of the page buffer are collectively performed on the memory cells in page buffer array 12.

One word line is selected in accordance with an externally supplied address supplied from among 32 word lines WL [31:0] and 32 pairs of bit lines are selected from among the 64 pairs of bit lines and data writing/reading is performed.

Figure 10:
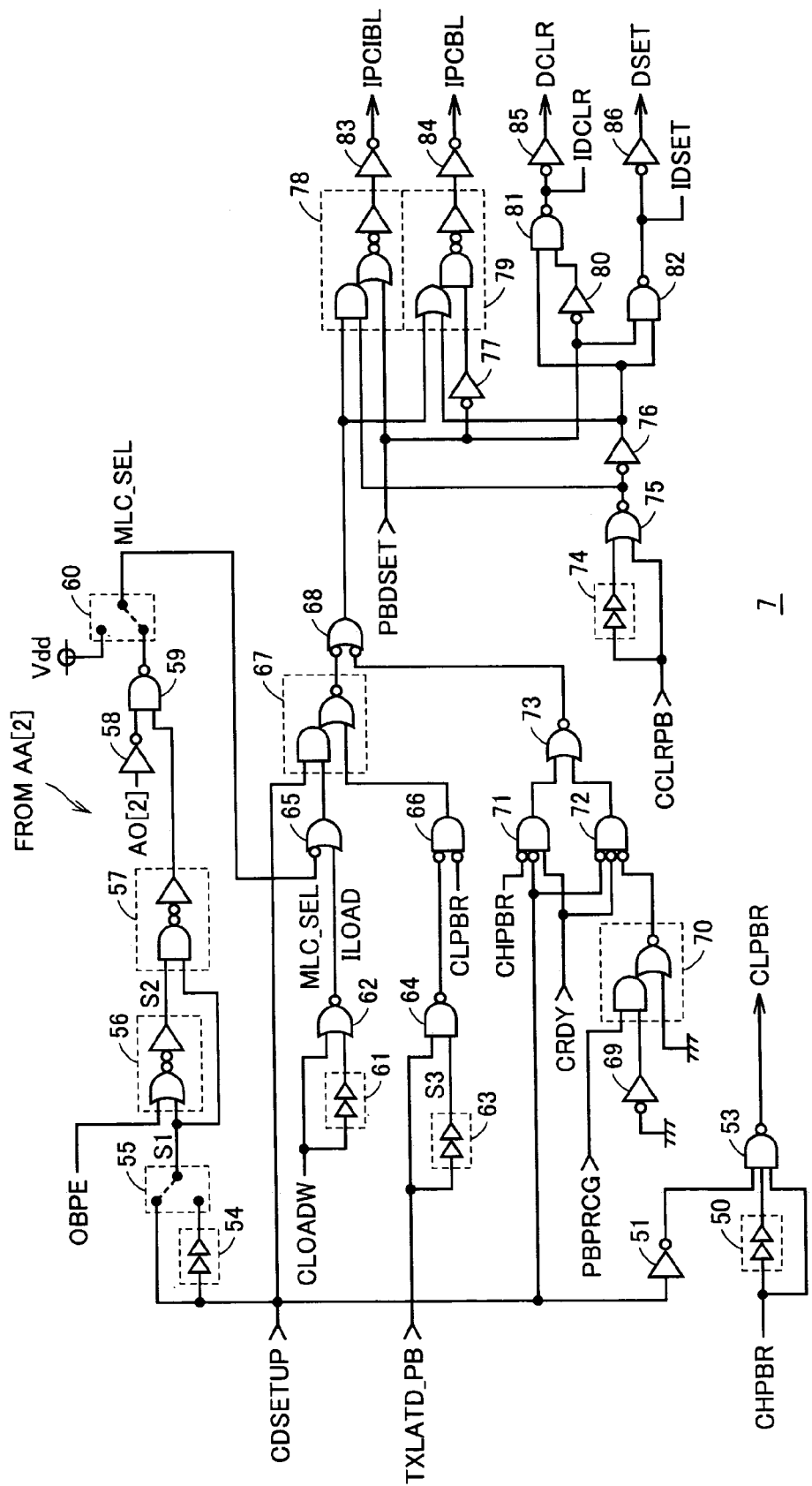
FIG. 10 is a diagram showing an example of the configuration of a page buffer control signal generation part in the page buffer control circuit shown in FIG. 4.

FIG. 10 is a diagram showing a configuration of the part for generating the control signals to the page buffer array shown in FIG. 9. This circuit for generating the control signals to the page buffer array shown in FIG. 10 is included in page buffer control circuit 7 shown in FIG. 4.

In FIG. 10, page buffer control circuit 7 includes: a delay circuit 50 for delaying a page buffer read-out instruction signal CHPBR by a predetermined period of time; an inverter 51 for inverting a data setup instruction signal CDSETUP that instructs the storage of write-in data in the page buffer; a NAND gate 53 for receiving an output signal of delay circuit 50, page buffer read-out instruction signal CHPBR and output signal CIDSETUP of inverter 51 to generate a page buffer read-out control signal CLPBR; a delay circuit 54 for delaying data setup instruction signal CDSETUP by a predetermined period of time; a metal switch 55 for selecting either the output signal of delay circuit 54 or data setup instruction signal CDSETUP by means of a metal interconnection; an OR circuit 56 receiving an operation bank pointer enabling signal OBPE that designates the bank in the operation state and an output signal S1 of metal switch 55; an AND circuit 57 that receives an output signal S2 of OR circuit 56 and output signal S1 of metal switch 55 to generate a data setup permitting signal SETUP_MLC for permitting data writing into the page buffer; an inverter 58 for receiving internal address bit AO [2]; a NAND gate 59 that receives the output signal of inverter 58 and data setup permitting signal SETUP_MLC; and a metal switch that selects either the output signal of NAND gate 59 or the power supply voltage and 60 for generating an MLC mode array selection signal MLC_SEL permitting data write-in to the page buffer of the corresponding bank.

This nonvolatile semiconductor memory device has a multi bank configuration and a page buffer and a page buffer control circuit are provided to each bank and operation bank pointer enabling signal OBTE attains an H level when a corresponding bank is in the active state to permit an access to the page buffer, and in addition, the external read-out of the data in the memory cell array is designated. In the operation for writing data in the page buffer, operation bank pointer enabling signal OBPE is set at an L level and the data writing to the page buffer for a corresponding bank is performed while data setup instruction signal CDSETUP is at H level.

When operation bank pointer enabling signal OBPE is at the L level, the storage data of the page buffer can also be read out externally. Accordingly, in the data writing into the memory cell array, the corresponding operation bank pointer enabling signal OBPE is set at the H level. The write-in of the program data to the page buffer is performed when no access is made to the corresponding bank. Program address bit AO [2] corresponds to external address bit AA [2].

Metal switch 55 selects the output signal of delay circuit 54 in the SLC configuration and selects data setup instruction signal CDSETUP in the MLC configuration. Metal switch 60 selects the power supply voltage Vdd in the SLC configuration and selects the output signal of NAND circuit 59 in the MLC configuration.

Control circuit 7 further includes: a delay circuit 61 for delaying a data load instruction signal CLOADW by a predetermined period of time; a NOR gate 62 for receiving an output signal of delay circuit 61 and a data load instruction signal CLOADW to generate a data load control signal ILOAD; a delay circuit 63 for delaying a timing signal TXLATD_PB generated in accordance with a transition in the address signal (clock signal) by a predetermined period of time in internal read-out of data; a NAND gate 64 that receives an output signal S3 of delay circuit 63 and timing signal TXLATD_PB; a gate circuit 65 that receives MLC selection signal MLC_SEL from metal switch 60 and data load control signal ILOAD; and a NOR gate 66 that receives the output signal of NAND gate 64 and page buffer read-out control signal CLPBR from NAND gate 53.

Delay circuit 61 and NOR gate 62 form a fall delay circuit that generates a one-shot pulse signal falling to the L level upon rise of data load instruction signal CLOADW to the H level and the rising of this one-shot pulse signal is set to the timing after elapse of the delay time determined by delay circuit 51 since the fall of data load instruction signal CLOADW. Delay circuit 63 and NAND gate 64 also form a one-shot pulse generation circuit which generates a one-shot pulse signal falling to the L level with a delay to the rising point of timing signal TXLATD_PB.

Page buffer control circuit 7 further includes a composite gate 70 that receives the ground voltage and the output signal of inverter 69 receiving the ground voltage and page buffer precharge control signal PBPRCG. A test mode instruction signal is typically supplied to inverter 69 and the input signal of this inverter 69 is fixed at the L level in the normal operation mode. Similarly, another test mode instruction signal is supplied in place of the ground voltage in another test mode, and this test mode instruction signal is also fixed at the ground voltage level in the normal operation mode. Accordingly, this composite gate 70 operates as an inverter that inverts page buffer precharge control signal PBPRCG in the normal operation mode.

Page buffer control circuit 7 further includes a gate circuit 71 that receives a page buffer read-out instruction signal CHPBR, a data setup instruction signal CDSETUP and a data ready instruction signal CRDY; a NOR gate 72 that receives data setup instruction signal CDSETUP, data ready instruction signal CRDY and the output signal of composite gate 70; a NOR gate 73 that receives the output signal of gate circuit 71 and the output signal of NOR gate 72; a composite gate 67 that receives the output signal of gate circuit 65 and an output signal of NOR gate 66; a NOR circuit 73 that receives the output signals of gate circuit 71 and NOR gate 72; and a NAND circuit 68 that receives an output signal of NOR circuit 73 and an output signal of composite gate 67.

Composite gate 67 is equivalently formed of an AND gate receiving data setup instruction signal CDSETUP and the output signal of gate circuit 65, and a NOR gate receiving the output signal of NOR gate 66 and the output signal of that AND gate. Gate circuit 71 generates a signal at the H level when page buffer read-out instruction signal CHPBR is at the L level, data setup instruction signal CDSETUP is at the L level and data ready instruction signal CRDY is at the H level.

Page buffer control circuit 7 further includes a delay circuit 74 for delaying page buffer clear instruction signal CCLRPB by a predetermined period of time; a NOR circuit 75 that receives an output signal of delay circuit 74 and page buffer clear instruction signal CCLRPB; an inverter 76 for inverting an output signal of NOR circuit 75; an inverter 77 that receives page buffer data set control signal PBDSET; a composite gate circuit 78 that receives an output signal of NAND circuit 68, the output signal of NOR circuit 75 and page buffer data set control signal BPDSET; a composite gate circuit 79 that receives the output signal of NAND circuit 68, the output signal of inverter 76 and the output signal of inverter 77; an inverter 80 that receives page buffer data set control signal BPDSET; a NAND circuit 81 that receives the output signal of inverter 80 and the output signal of inverter 76; a NAND circuit 82 that receives page buffer data set control signal PBDSET and an output signal of inverter 76; an inverter 13 that receives the output signal of composite gate 78 to generate complementary bit line precharge instruction signal IPCIBL; an inverter 84 that inverts the output signal of composite gate circuit 79 to generate bit line precharge instruction signal IPCBL; an inverter 85 that inverts the output signal of NAND circuit 81 so as to generate data clearing signal DCLR; and an inverter 86 that inverts an output signal of NAND circuit 84 to generate data set instruction signal DSET.

Composite gate 78 equivalently includes: a first AND gate that receives the output signal of NAND circuit 68 and the output signal of NOR circuit 75; and a second AND gate that receives the output signal of the first AND gate and page buffer data set instruction signal PBDSET. Composite gate circuit 79 equivalently includes: an OR gate that receives the output signal of NAND circuit 68 and the output signal of inverter 76; and an AND gate that receives the output signal of this OR gate and the output signal of inverter 77.

Operation mode instruction signals CHPBR, CCLRPB and CDSETUP are signals set, from command user interface (CUI) 2 shown in FIG. 4, in accordance with an operation mode. Control signals PBDSET and PBPRCG are generated in each operation cycle in accordance with the clock signal from the oscillation circuit within the page buffer control circuit described later.

In the operation mode of writing multi-level data in a memory cell, data setup instruction signal CDSETUP is at the H level and operation bank pointer enabling signal OBPE is at the L level when writing data in the page buffer to set up the write-in data. Accordingly, the output signal of OR circuit 56 is at the H level, the output signal from metal switch 55 is also at the H level and data setup instruction signal SETUP_MLC from AND circuit 57 is at the H level. Accordingly, each time address bit AO [2] attains "0" (L level), MLC mode array selection signal MLC_SEL outputted by NAND circuit 59 attains the L level.

In storage of write-in data in the page buffer, data setup instruction signal CDSETUP is at the H level and therefore, the output signal of composite gate circuit 67 is at the L level, and responsively, the output signal of NAND circuit 68 is at the H level. Page buffer clear instruction signal CCLRB is at the L level and the output signal of NOR circuit 75 is at the H level. In addition, page buffer data set control signal PBDSET is also at the L level. Accordingly, bit line precharge instruction signals IPCIBL and IPCBL turn L level when the address bit AO [2] attains "0", and the bit lines are precharged in the page buffer.

When operation bank pointer enabling signal OBPE is at the L level and data setup instruction signal CDSETUP is at the L level, the output signal of AND circuit 57 is at the L level and MLC mode array selection signal MLC_SEL is fixed at the H level. In this state, bit line precharge instruction signals IPCIBL and IPCBL are set at the L level in accordance with timing signal TXLATD_PB generated according to the operation mode. This is because, in read-out of the page buffer data, page buffer read-out instruction signal CHPBR is at the H level and the signal CLPBR is set at the L level for a predetermined period of time.

When write-in data is present or data to be written is present in the verification operation, data ready signal CRDY is set at the H level. In this state, bit line precharge instruction signals IPCIBL and IPCBL are selectively activated in accordance with the output signal of NOR gate circuit 73.

When precharge control signal PBPRCG is at the H level, bit line precharge instruction signals IPCIBL and IPCBL are selectively activated through the route of NOR gate circuits 72, 73 and NAND circuit 68.

Where the whole of storage contents of the page buffer is to be reset, page buffer clear control signal CCLRPB is activated. Accordingly, the output signal of NOR circuit 75 turns L level and the output signal of inverter 76 turns H level. At this time, page buffer data set control signal PBDSET is at the L level and bit line precharge instruction signal IPCIBL attains the H level and complementary bit line precharge instruction signal IPCBL attains the H level. Moreover, the output signal IDCLR of NAND circuit 81 attains the L level and responsively, data clear instruction signal DCLR turns H level. Data set instruction signal DSET is at the L level.

Page buffer data set instruction signal PBDSET is set at the H level, data clear instruction signal CCLRPB is at the L level, the output signal of NOR circuit 75 is at the H level, and the output signal of inverter 76 is at the L level. In this state, complementary bit line precharge instruction signal IPCIBL from inverter 83 attains the L level and bit line precharge instruction signal IPCBL attains the H level. Data clear instruction signal DCLR is at the L level and data set instruction signal DSET attains the H level because the output signal of inverter 76 is at the L level.

FIG. 11 shows, in a list form, the relation between an operation modes and the logic levels of the control signals to the page buffer bit line peripheral circuitry. The precharging mode indicates the operation when the precharging operation is instructed and indicates standby state in the data write-in, data read-out and data access to the page buffer. In the data setting and data clearing, all the word lines are driven to the selected state in the page buffer and the data setting and the data clearing are performed on the whole memory cells of the page buffer.

By utilizing the configuration of this page buffer control circuit 7, the page buffer array can be precharged in accordance with the address bit AO [2] in the data writing into the memory cell array and accurate data writing can be achieved only in the data writing. In addition, selective data writing/reading can be performed on this page buffer in accordance with control signal CHPBR.

Figure 12:
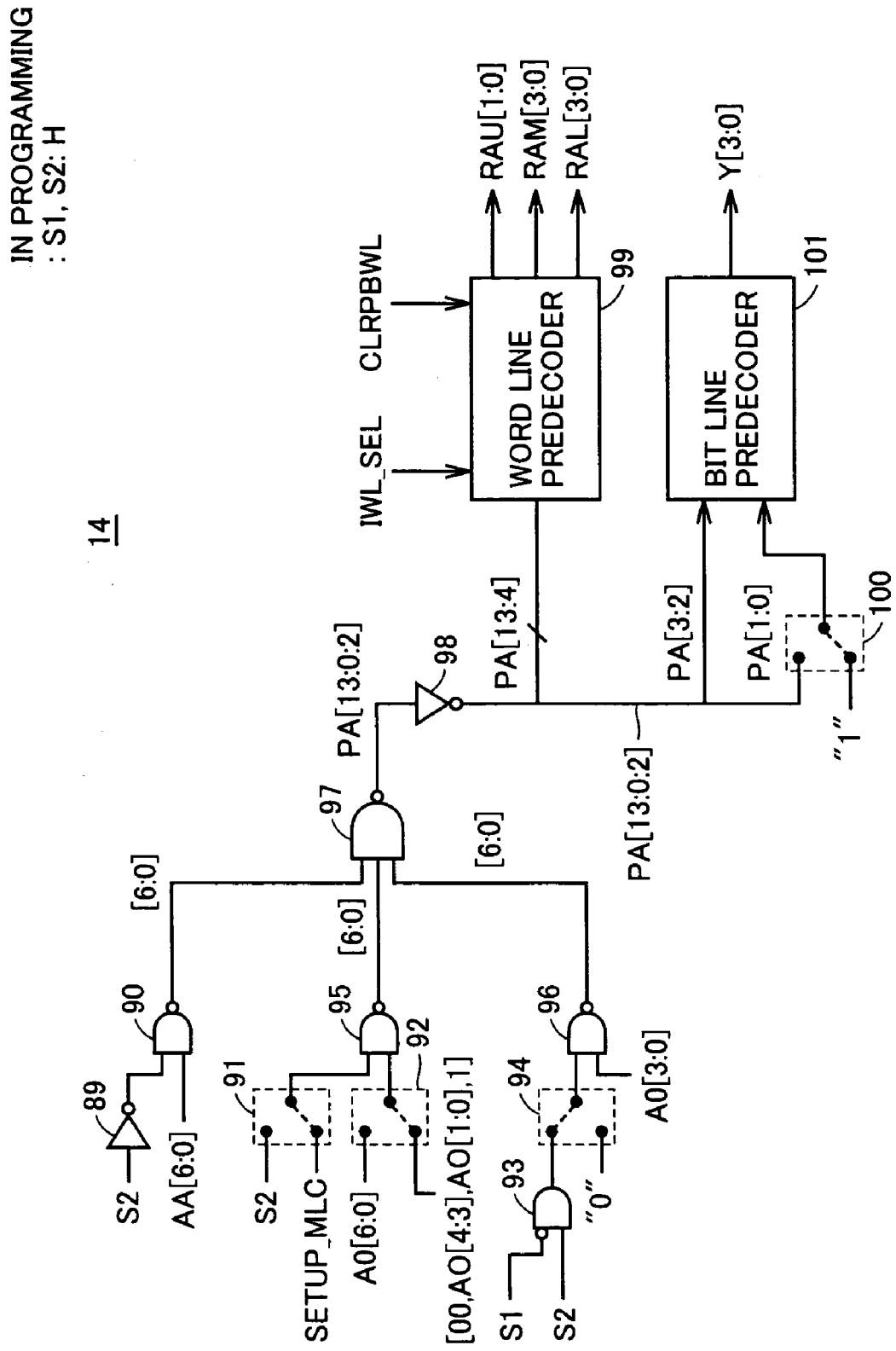
FIG. 12 is a diagram schematically showing the configuration of the word line selection circuit shown in FIG. 8.

FIG. 12 is a diagram schematically showing the configuration of the address conversion part included in page buffer control circuit 7 shown in FIG. 4. In FIG. 12, page buffer control circuit 7 includes: an inverter 89 that receives the output signal S2 of OR gate circuit 56 shown in FIG. 10; a NAND gate circuit 90 that receives 7-bit address AA [6:0] externally supplied and the output signal of inverter 89; a metal switch 91 for selecting either control signal S2 shown in FIG. 10 or data setup permission instruction signal SETUP_MLC from the AND circuit shown in FIG. 10; a metal switch 92 for selecting either internal address signal AO [6:0] or [00, AO [4:3], AO [1:0], 1]; a NAND gate circuit 95 that receives the output signals of the metal switches 91 and 92; a gate circuit 93 that receives control signals S1 and S2; a metal switch 94 for selecting either the output signal of gate circuit 93 or the ground voltage ("0"); and a NAND gate circuit 96 that receives the output signal of metal switch 94 and 7-bit address [00A [3:0] 1].

Metal switch 91 selects MLC data setup permission instruction signal SETUP_MLC in the MLC configuration and metal switch 92 selects 7-bit address [00AO [4:3], AO [1:0] 1] in the MLC configuration. Metal switch 94 selects the output signal of gate circuit 93 in the MLC-configuration. The gate circuit 93 outputs a signal of the H level when output control signal S1 is at the L level and output control signal S2 is at the H level.

NAND gate circuits 90, 95 and 96 each operate as an inverter when enabled, to invert the received 7-bit address to generate selected 7-bit address [6:0].

Page buffer control circuit 7 further includes: a NAND gate circuit 97 that receives the output signals of NAND gate circuits 90, 95 and 96 to generate a complementary 14-bit write-in address signal; and an inverter 98 that receives the output signal of NAND gate circuit 97 so as to generate complementary14-bit address signals PA [12:0], [13:12]. Here, symbol PA [13:0:2] indicates the formation of seven pairs of complementary signals in 2-bit units from the complementary signals generated from each bit of P [6:0].

Page buffer control circuit 7 further includes: a word line predecoder 99 that pre-decodes complementary internal address signal PA [13:4] from inverter 98 to generate word line pre-decoded signals RAU [1:0], RAM [3:0] and RAL [3:0] for designating a word line of the page buffer; a metal switch 100 for selecting either complementary internal address signal PA [1:0] or the logic "1" (power supply voltage Vdd level); and a bit line predecoder 101 that pre-decodes complementary internal address signal PA [3:2] and the address bit from metal switch 10 so as to generate a bit line selecting signal Y [3:0].

Word line predecoder 99 carries out the pre-decoding operation at the time of the activation of word line selection signal IWL_SEN, and drives all the pre-decoded signals to the selected state at the time of the activation of page buffer word line clear instruction signal CLRPBWL activated in data clearing.

Word line pre-decoding signal RAU [1:0] is generated on the basis of internal address bits PA [13:12] and word line pre-decoded signal RAM [3:0] is generated on the basis of complementary internal address signals PA [11:8]. Word line pre-decoding signal RAL [3:0] is generated on the basis of complementary internal address signal PA [7:4]. In each of these pre-decoded signals RAU [1:0], RAM [3:0] and RAIL [3:0], one signal is driven to the selected state.

Bit line predecoder 101 performs the pre-decoding operation in accordance with complementary internal address signals PA [3:2] in the MLC configuration, drives 2-bit bit line selection signal in 4-bit bit line selection signal Y [3:0] to the selected state to select thirty-two pairs of bit lines to transfer 32-bit data. In the SLC configuration, one-bit bit line selection signal in four-bit bit line selection signal Y [3:0] is driven to the selected state in accordance with complementary internal address signals PA [3:0]. Accordingly, in this case, ¼ selection is carried out on sixty-four pairs of bit lines and thus, sixteen pairs of bit lines are selected.

As for word lines, ½ selection is effected by the pre-decoded signal RAU [1:0] and ¼ selection is effected in each of pre-decoded signals RAM [3:0] and RAL [3:0], and in total, 1/32 selection is effected on entire word lines and as a result, one word line in thirty-two word lines WL [31:0] is driven to the selected state.

By way of example, the page buffer has a hierarchical word line configuration and includes four main word lines and eight sub word lines arranged corresponding to each main word line. One main word line is selected in accordance with pre-decoded signal RAL [3:0] and one sub word line in eight sub word lines is selected in accordance with pre-decoded signals RAU [1:0] and RAM [3:0].

In writing data in a memory cell, control signals S1 and S2 are both set at the H level as shown in FIG. 10. In this condition, all bits of the output signal of NAND gate circuit 90 are at the H level. The output signal of NAND gate 93 is at the L level and the output signal of NAND gate circuit 96 is also at the H level (for 7 bits). Accordingly, NAND gate circuit 97 selects address bits [00, AO [4:3], AO [1:0], 1] from NAND gate circuit 95 to generate complementary internal address signal PA [13:0:2] of 14 bits in accordance with the selected address bits. In the MLC configuration, address bit AO [2] is not utilized. Specifically, even if data writing and data reading are performed on the page buffer, data write-in/read-out is performed to the region designated by address bits AO [4:3] and AO [1:0]. In this case, a word line and a bit line are selected in accordance with 4-bit address and therefore, a region having the total of sixteen addresses is designated and 2-word data of 32 bits externally supplied is sequentially stored in sixteen successive addresses of the page buffer, respectively.

When the operation bank pointer enabling signal (see FIG. 10) is at the H level, the control signal S2 is at the H level. In this state, when control signal S1, or data setup instruction signal CDSETUP is at the L level, the output signal of gate circuit 93 is at the H level and complementary internal address PA [13:0:2] is generated by NAND gate circuit 96 in accordance with address bits [00AO [3:0] 1]. In this case, data writing into the page buffer is performed in accordance with address bits AO [3:0]. Write-in of data to a memory cell array is not performed and therefore, an address region in the page buffer is simply designated even when address bit AO [2] is used and therefore, no particular problem arises since there is no need to identify the upper data and the lower data. In this case, external 16-bit word data is sequentially stored in the page buffer.

When operation bank pointer enabling signal OBPE is at the L level and control signal S1 is at the L level, control signal S2 is at the L level. In this state, complementary internal address signal PA [13:0:2] is generated by NAND gate circuit 90 in accordance with external address AA [6:0] and data read-out from the page buffer is performed.

As shown in FIG. 12, in writing the data into a memory cell, an internal address excluding the address bit AO [2] corresponding to external address signal bit AA [2] is generated by metal switch 92 and thereby, at the time of the MLC configuration, data write-in to the page buffer and to the memory cell can be performed with address bit AA [2] being used for the identification of the upper or lower word data of 32-bit data (write-in address of the page buffer is equal to the write-in address of the memory cell).

Figure 13:
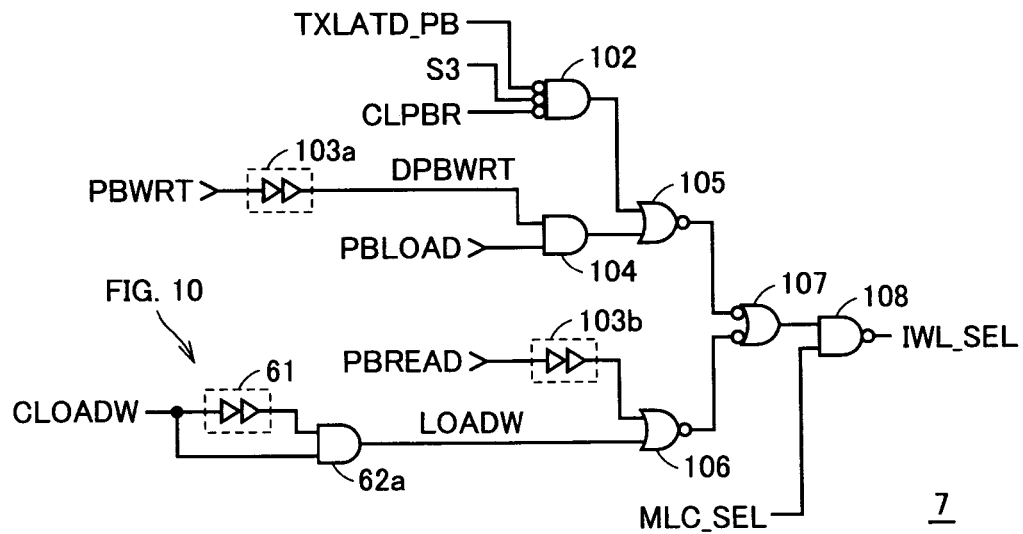
FIG. 13 is a diagram showing an example of the configuration of the part that generates a word line selection signal shown in FIG. 12.

FIG. 13 is a diagram showing the configuration of the part that generates word line selection activation signal IWL_SEL supplied to word line predecoder 99 shown in FIG. 12. Word line selection activation signal IWL_SEL is also generated by page buffer control circuit 7 shown in FIG. 4.

In FIG. 13, page buffer control circuit 7 includes a three-input NOR gate circuit 101 that receives timing signal TXLATD_PB indicating a transition in the page buffer address, control signal S3 shown in FIG. 4 and page buffer read-out control signal CLPBR shown in FIG. 4; a delay circuit 102 for delaying page buffer write-in signal PBWRT defining data write-in timing to the page buffer by a predetermined period of time; a NAND gate circuit 104 that receives delay page buffer write-in control signal DPBWRT from delay circuit 102 and page buffer load control signal PBLOAD instructing data load to the page buffer; a NOR gate circuit 105 that receives the output signals of NOR gate circuit 101 and AND gate circuit 104; a delay circuit 103 for delaying page buffer read-out control signal PBREAD that controls the timing of data read-out from the page buffer by a predetermined period of time; a NOR gate circuit 106 that receives the output signal of delay circuit 103 and data load instruction signal LOADW permitting data load to the page buffer; a NAND gate circuit 107 that receives the output signals of NOR gate circuits 105 and 106; and a NAND gate circuit 108 that receives the output signal of NAND gate circuit 107 and MLC selection signal MLC_SEL to generate word line selection activation signal IWL_SEL.

Control signals PBWRT, PBLOAD and PBREAD each are a control signal that defines the data write timing to the page buffer and are generated in OSC circuit 3 shown in FIG. 4. Data load instruction signal LOADW is a signal instructing the permission of data loading and is applied from command user interface circuit 2.

When page buffer write-in control signal and page buffer load control signal PBLOAD both attain the H level, the output signal of AND gate circuit 104 attains the H level. Responsively, the output signal of NAND gate circuit 107 attains the H level, and word line selection activation signal IWL_SEL is driven to the active state at L level. In data reading-out from the page buffer (in the verification operation), when page buffer read-out control signal PBREAD attains the H level (load permission instruction signal LOADW is at the L level), the output signal of NOR gate circuit 106 attains the L level and word line selection activation signal IWL_SEL is driven to the activated state.

Accordingly, upon data write-in to a memory cell and the verification operation utilizing the page buffer, write-in and read-out of data to the page buffer are controlled in accordance with these control signals PBWRT, PBLOAD and PBREAD. In only the read-out operation to the page buffer or only the write-in operation to the page buffer, MLC mode array selection signal MLC_SEL is set at the H level (independent of address bit AO [2]) in accordance with operation bank pointer enabling signal OBPE and data setup instruction signal CDSETUP. Under such condition, upon data write-in, a word line selection is performed in accordance with load instruction signal LOADW and data read-out is performed in accordance with page buffer read-out control signal CLPBR. Upon data read out, data read-out timing is set in accordance with timing control signal TXLATD_PB corresponding to the detection of a transition in the address signal (by creating timing that corresponds to the transition of the internal clock signal).

Figure 14:
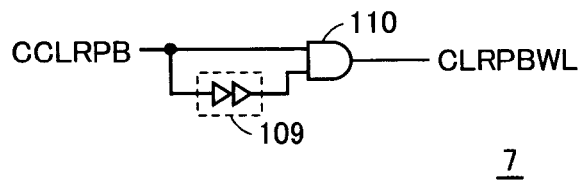
FIG. 14 is a diagram showing an example of the configuration of a page word line clear control signal generation part shown in FIG. 12.

FIG. 14 is a diagram schematically showing the configuration of the part that generates clear page buffer word line signal CLRPBWL shown in FIG. 12. This part shown in FIG. 14 is included in page buffer control circuit 7. Page buffer control circuit 7 includes: a delay circuit 109 for delaying page buffer clear instruction signal CCLRPB externally applied; and an AND gate circuit 110 that receives an output signal of delay circuit 109 and page buffer clear instruction signal CCLRPB. Delay circuit 109 and AND-gate circuit 110 form a rise delay circuit and when clear page buffer word line instruction signal CCLRPBWL outputted from AND gate circuit 110 is activated to be at the H level, all the word lines of the page buffer are simultaneously driven to the selected state, and the data stored in the page buffer is cleared.

Figure 15:
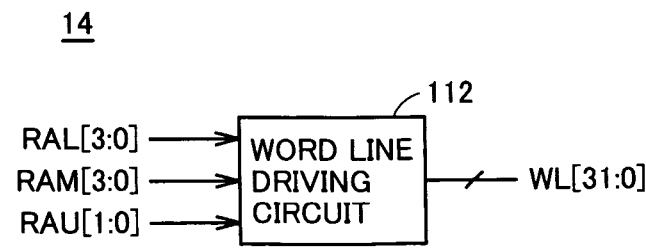
FIG. 15 is a diagram schematically showing the configuration of the word line selection circuit shown in FIG. 8.

FIG. 15 is a diagram schematically showing the part of word line drive circuit 112 that is included in word line selection circuit 14 shown in FIG. 8. The word line drive circuit 112 drives one word line in thirty-two word lines WL [31:0] to the selected state in accordance with pre-decoded signals RAL [3:0], RAM [3:0] and RAU [1:0] of the address generation circuit shown in FIG. 12. The word line drive circuit 112 operates statically and drives a corresponding word line to the selected state in accordance with the supplied pre-decoded signals.

The word line drive circuit 112 includes four main word line selection signals and eight word line drivers arranged corresponding to each main word line selection signal, although not particularly limited to such arrangement. One of the four main word line selection signals is driven to the selected state in accordance with row address pre-decoded signal RAL [3:0]. One word line driver in eight word line drivers is driven to the selected state in accordance with row pre-decoded signals RAM [3:0] and RAU [1:0]. The corresponding word line is driven to the selected state by the activated main word line selection signal and the selected word line driver.

The word line drive circuit 112 is required to drive the word line to the selected state in a static manner in accordance with the supplied pre-decoded signals and the internal configuration thereof is not specifically limited. The reason why word lines WL [31:0] are driven in a static manner is that page buffer 6 is formed of an SRAM and write-in/read-out to the page buffer in verification operation are successively performed at high speed in accordance with the address transition (edge of the clock signal).

Figure 16:
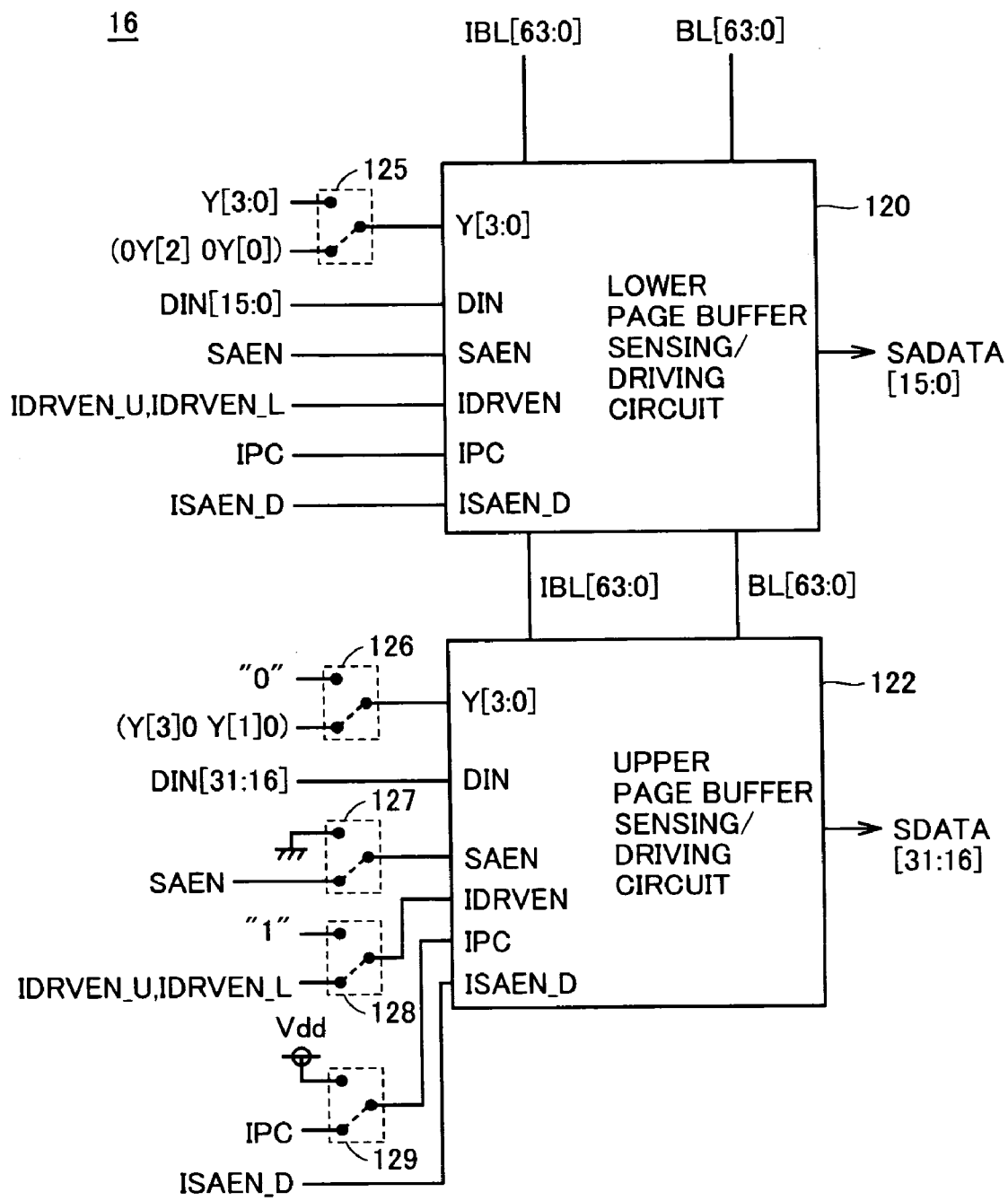
FIG. 16 is a diagram schematically showing the configuration of a page buffer write-in/read-out circuit shown in FIG. 8.

FIG. 16 is a diagram schematically showing the configuration of page buffer write-in/read-out circuit 16 shown in FIG. 8. In FIG., 16, the page buffer write-in/read-out circuit includes a lower page buffer sensing/driving circuit 120 that performs write-in and read-out of the lower 16-bit data DIN [15:0] and SADATA [15:0]; and an upper page buffer sensing/driving circuit 122 that writes and reads the upper 16-bit data DIN [31:16] and SDATA [31:16]. DataDIN [15:0] and data DIN [31:16] are write-in data to this page buffer while data SADATA [15:0] and data SDATA [31:16] are read-out data from the page buffer.

Lower page buffer sensing/driving circuit 120 and upper page buffer sensing/driving circuit 122 have the same configuration. Lower page buffer sensing/driving circuit 120 receives the output signal of metal switch 125 for selecting either bit line selection signals of 4 bits Y [3:0] or [0,Y [2], 0,Y [0]] as a bit line selection signal and also receives lower 16-bit data DIN [15:0] at data input DIN. In addition, lower page buffer sensing/driving circuit 120 receives sense amplifier activation signal SAEN and inverted and delayed sense amplifier activation signal ISAEN_D for data read-out and in addition, receives bit line precharging instruction signal IPCIPL shown in FIG. 10 as a precharging instruction signal IPC. Furthermore, lower page buffer sensing/driving circuit 120 receives upper byte selection signal IDRVEN_U and lower byte selection signal IDRVEN_L, to perform data writing in a byte unit. Data writing and reading can be performed in a byte unit for 16-bit words in accordance with the byte selection signals IDRVEN_U and IDRVEN_L.

Upper page buffer sensing/driving circuit 122 receives, as a bit line selection signal, the signal selected by metal switch 126 that selects either 4-bit data of "0" or bit line selection signal [Y [3], 0,Y [1], 0] of 4 bits. Data input DIN is supplied with upper 16-bit data DIN [31:16]. The sense amplifier activation signal input is supplied with the output of metal switch 127 which selects either the sense amplifier activation signal SAEN or the ground potential. The output signal of metal switch 128, which selects either 16-bit data of "1" or upper byte data drive signal IDRVEN_U and IDRVEN_L, is supplied as a byte data selection signal IDRVEN. The output signal of metal switch 129, which selects either power supply voltage Vdd or precharging instruction signal IPC (corresponding to bit line precharging instruction signal IPCBL), is supplied as a precharging instruction signal. Inverted and delayed sense amplifier activation signal ISAEN_D is supplied as an inverted and delayed sense amplifier activation signal.

FIG. 16 shows the connection paths in metal switches 126 to 129 established in the MLC configuration. Accordingly, in the SLC configuration, all the bits of the output signal of metal switch 126 assume "0", sense amplifier activation signal SAEN is set at the L level (ground voltage level) of the inactive state and a byte data selection signal in the inactive state is normally supplied as a data drive selection signal IDRVEN. In addition, precharging instruction signal IPC is normally maintained in the inactive state. Specifically, in the SLC configuration, the upper page buffer sensing/driving circuit 122 is not used while lower page bias sensing/driving circuit 120 is used to carry out write-in and read-out of 16-bit data.

This lower page buffer sensing/driving circuit 120 performs the bit line selection operation in accordance with bit line selection signals Y [2] and Y [0] and upper page buffer sensing/driving circuit 122 performs the bit line selection operation in accordance with bit line selection signals Y [3] and Y [1]. In the MLC configuration, internal address signal PA [1:0] is set at "1." Accordingly, bit line predecoder 101 shown in FIG. 12 carries out the ½ selection operation to drive upper bit line selection signal Y [3:2] or lower bit line selection signal Y [1:0] to the selected state. Thus, bit line pairs of 16 bits are selected in each of lower page buffer sensing/driving circuit 120 and upper page buffer sensing/driving circuit 122, and write-in or read-out of data of 16 bits each, or the total of data of 32 bits, is simultaneously performed.

Figure 17:
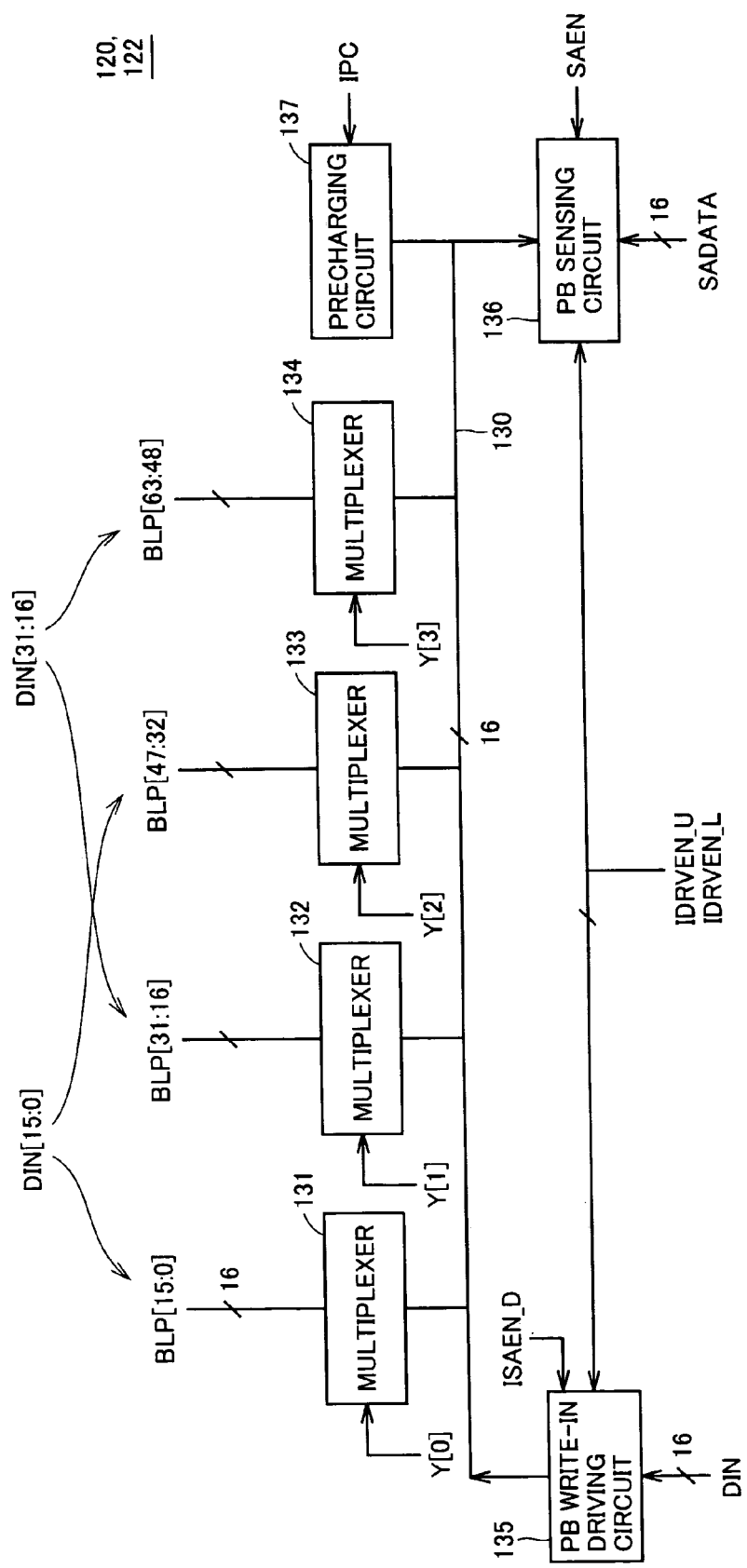
FIG. 17 is a diagram schematically showing the configuration of a page buffer sense/drive circuit shown in FIG. 16.

FIG. 17 is a diagram schematically showing the configurations of lower page buffer sensing/driving circuit 120 and upper page buffer sensing/driving circuit 122 shown in FIG. 16. The lower page buffer sensing/driving circuit 120 and upper page buffer sensing/driving circuit 122 have the same configuration and therefore, only the configuration of one of these circuits is shown in FIG. 17.

In FIG. 17, each of page buffer sensing/driving circuits 120 and 122 includes: a 16-bit internal data bus 130; a multiplexer 131 for selecting bit line pairs BLP [15:0] in accordance with bit line selection signal Y [0] and connecting the selected bit line pairs to internal data bus 130; a multiplexer 132 for selecting bit line pairs BLP [31:16] in accordance with bit line selection signal Y [1] and connecting the selected bit line pairs to internal data bus 130; a multiplexer 133 for selecting bit line pairs BLP [47:32] in accordance with bit line selection signal Y [2] and connecting the selected bit line pairs to internal data bus 130; and a multiplexer 134 for selecting bit line pairs BLP [63:48] in accordance with bit line selection signal Y [3] and connecting the selected bit line pairs to internal data bus 130. Bit line pairs BLP [63:0] includes bit lines BL [63:0] and IBL [63:0].

Each of these page buffer sensing/driving circuits 120 and 122 further includes: a PB write drive circuit 135 that is selectively activated in accordance with inverted and delayed sense activation signal ISAEN_D as well as data byte selection signals IDRVEN_U and IDRVEN_L, to drive, when activated, the selected bit line pairs via internal data bus 130 in accordance with received 16-bit data DIN; and a PB sense circuit 136 that is selectively activated in accordance with sense amplifier activation signal SAEN as well as data byte selection signals IDRVEN_U and IDRVEN_L to sense and amplify the data on internal data bus 130 to generate 16-bit read-out data SADATA.

The activation and deactivation of PB sense circuit 136 and PB write drive circuit 135 are controlled in units of bytes in accordance with data byte selection signals IDRVEN_U and IDRVEN_L. In lower page buffer sensing/driving circuit 120 in the MLC configuration, multiplexers 131 and 133 performs the selection operations in accordance with bit line selection signals Y [2] and Y [0], while multiplexers 132 and 134 remain non-conductive. On the other hand, in upper page buffer sensing/driving circuit 122 in the MLC configuration, multiplexers 132 and 134 perform the selection operations in accordance with bit line selection signals Y [3] and Y [1].

Internal data bus 130 is precharged to a predetermined voltage level by precharging circuit 137 that receives precharging signal IPC corresponding to the bit line precharging instruction signal upon completion of the data write-in/read-out.

Figure 18:
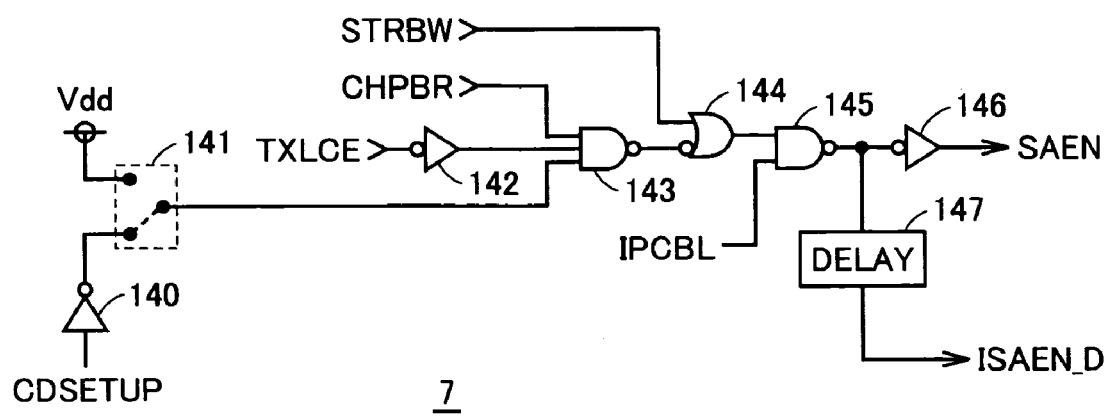
FIG. 18 is a diagram showing an example of the configuration of the part that generates a page buffer setup activation signal shown in FIG. 14.

FIG. 18 is a diagram showing the configuration of the part that generates sense amplifier activation signals SAEN and ISEN_D shown in FIG. 16. The configuration shown in this FIG. 18 is included in page buffer control circuit 7 shown in FIG. 4.

In FIG. 18, the page buffer sense amplifier control part in page buffer control circuit 7 includes: an inverter 140 that receives a data setup instruction signal CDSETUP; a metal switch 141 for selecting either an output signal of inverter 140 or power supply voltage Vdd; an inverter 142 that receives an access mode activation signal TXLCE; a NAND gate circuit 143 that receives a page buffer read-out instruction signal CHPBR, an output signal of inverter 142 and an output signal of metal switch 141; and a gate circuit 144 that receives an output signal of NAND gate circuit 143 and data strobe control signal STRBW. This gate circuit 144 outputs a signal of the H level when data strobe control signal STRBW is at the H level or the output signal of NAND gate circuit 143 is at the L level.

The page buffer control part in page buffer control circuit 7 further includes: a NAND gate circuit 145 that receives the output signal of gate circuit 144 and bit line precharging instruction signal IPCBL; an inverter 146 that receives an output signal of NAND gate circuit 145 to generate sense amplifier activation signal SAEN; and a delay circuit 147 for generating inverted and delayed sense activation signal ISAEN_D by delaying the output signal of NAND gate circuit 145 by a predetermined period of time.

Metal switch 141 selects the output signal of inverter 140 in the MLC configuration. Data setup instruction signal CDSETUP is set at the H level in data writing. Accordingly, in this case, the output signal of NAND gate circuit 143 is fixed at the H level and activation and inactivation of sense amplifier activation signals SAEN and ISAEN_D are effected in accordance with strobe timing control signal STRBW. Strobe timing control signal STRBW is activated at a predetermined timing in accordance with the clock signal internally generated in data read-out from the page buffer.

In the case where the data is read out externally from the page buffer, page buffer read-out instruction signal CHPBR is set at the H level. In this state, if the page buffer corresponding to the corresponding bank is permitted to operate, access enabling signal TXLCE is set at the L level (generated on the basis of the bank operating pointer). Therefore, in this condition, the output signal of NAND gate circuit 143 is at the L level and responsively, the output signal of OR gate circuit 144 is at the H level. When bit line precharging instruction signal IPCLBL changes from the L level to the H level and the precharging of the page buffer bit line and the internal data line completes, sense amplifier activation signal SAEL is activated. In data writing to the page buffer, page buffer read-out instruction signal CHPBR is at the L level, sense amplifier activation signal SAEN is fixed at the L level, inverted and delayed sense amplifier activation signal SISAEN_D from delay circuit 147 is in the active state and data writing to the page buffer is performed in accordance with strobe timing control signal STRBW.

Figure 19:
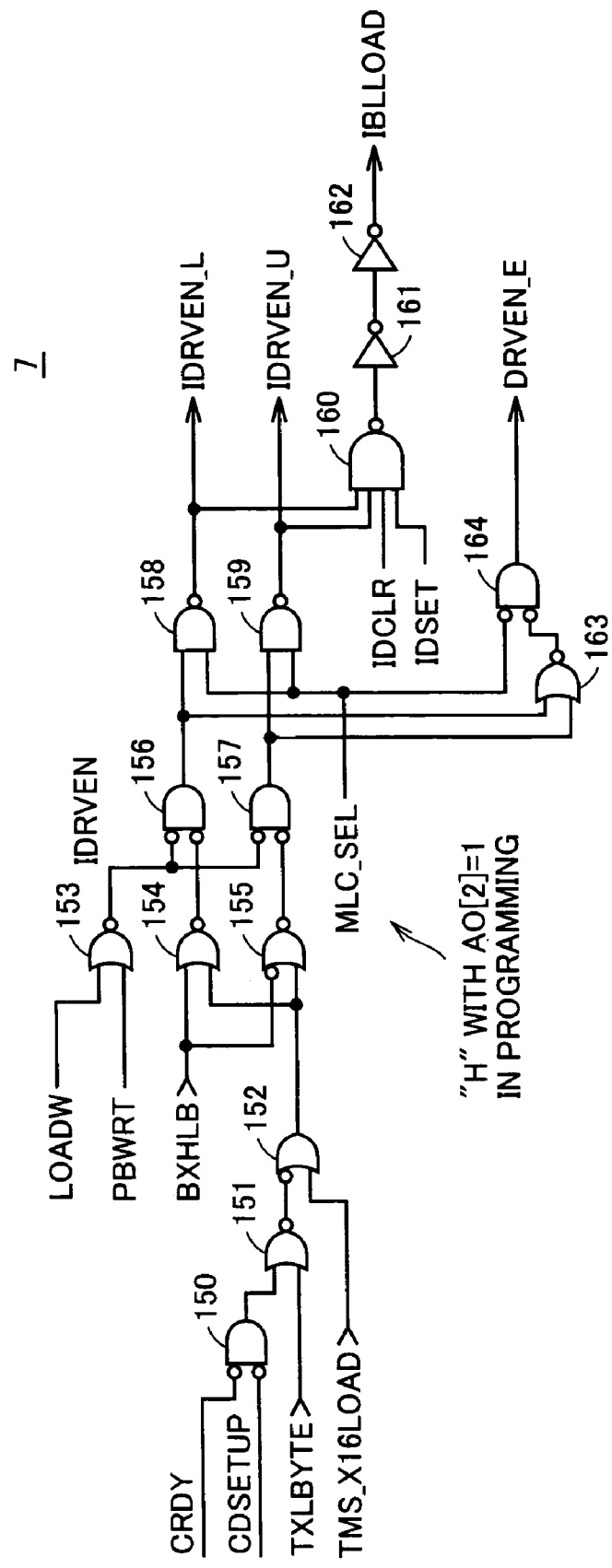
FIG. 19 is a diagram showing an example of the configuration of the part that generates a bit line drive control signal shown in FIG. 16.

FIG. 19 is a diagram showing the configuration of the portion that generates byte selection signals IDRVEN_U and IDRVEN_L shown in FIG. 16. The circuit shown in this FIG. 19 is also included in page buffer control circuit 7 shown in FIG. 4.

In FIG. 19, page buffer control circuit 7 includes: a NOR gate circuit 150 that receives data ready instruction signal CRDY and data setup instruction signal CDSETUP; a NOR gate circuit 151 that receives the output signal of NOR gate circuit 150 and byte mode instruction signal TXLBYTE; and a gate circuit 152 that receives NOR gate circuit 151 and word mode instruction signal TMS_X16LOAD. This byte mode instruction signal TXLBYTE indicates whether data writing to the page buffer is performed in byte mode and when it is set at the L level, data writing to the page buffer is performed in byte mode. Word mode instruction signal TMX_X16LOAD indicates data writing in a word unit and when it is set at the H level, data writing is performed in a word unit. Gate circuit 152 outputs a signal at the H level when the output signal of NOR gate circuit 151 is at the L level or word mode instruction signal TMS_X16LOAD is at the H level.

Page buffer control circuit 7 further includes: a NOR gate circuit 155 that receives upper/lower byte instruction signal BXHLB and the output signal of gate circuit 152; a NOR gate circuit 153 that receives data load instruction signal LOADW and page buffer write in control signal PBWRT to generate a drive enable signal IDRVEN; and a gate circuit 155 that receives the output signal of gate circuit 152 and upper/lower byte instruction signal BXHLB.

As shown in FIG. 13, data load instruction signal LOADW is activated for a predetermined period of time when data load instruction signal CLOADW is activated. Page buffer write-in control signal PBWRT is activated at the time of data writing to the page buffer. Upper/lower byte instruction signal BXHLB has the logic level set in accordance with an external signal and designates the lower byte data when set at the H level, and designates the upper byte data when set at the L level.

Page buffer control circuit 7 further includes: NOR gate circuit 156 that receives the output signal of NOR gate circuit 153 and the output signal of NOR gate circuit154; a NOR gate circuit 157 that receives the output signal of NOR gate circuit 153 and the output signal of gate circuit 155; a NAND gate circuit 158 that receives MLC selection signal MLC_SEL and the output signal of NOR gate circuit 156 to generate lower byte drive enable signal IDRVEN_L; a NAND gate circuit 159 that receives MLC selection signal MLC_SEL and the output signal of NOR gate circuit 157 to generate upper byte selection signal IDRVEN_U; a NAND circuit 160 that receives the output signals of NAND gate circuits 158 and 159, data clear signal IDCLR and data set signal IDSET; inverters 161 and 162 cascaded in two stage and receiving the output signal of NAND gate circuit 160; a NOR gate circuit 163 that receives the output signal of NOR gate circuits 156 and 157; and a NOR gate circuit 164 that receives the output signal of NOR gate circuit 163 and MLC mode array selection signal MLC_SEL to generate a data take-in activation signal DRVEN_E.

Bit line load instruction signal IBLLOAD from inverter 162 is activated when a data access is not performed on the page buffer. The bit line load instruction signal IBLLOAD is activated in accordance with load control signal CLOAD that is activated in accordance with data load instruction signal CLOADW shown in FIG. 13 in an operation mode different from the data setup.

Page buffer write instruction signal PBWRT is activated upon the verification operation.

In the MLC configuration, upper/lower byte data selection signal BXHLB is set at the H level and word mode instruction signal TMS_X16LOAD is also set at the H level. Accordingly, the output signals of gate circuits 154 and 155 are fixed at the L level. Drive activation signal IDRVEN for bit lines is activated in accordance with load instruction signal LOADW or page buffer write-in instruction signal PBWRT. In data writing to the page buffer, drive activation signal IDRVEN is activated in accordance with data load instruction signal LOADW. In the MLC configuration, MLC mode array selection signal MLC_SEL attains the H level when address bit AO [2] is "1" (see FIG. 10). Accordingly, bit line drive enable (byte selection signals) signals IDRVEN_L and IDRVEN_U are activated to be at the L level when address bit AO [2] assumes "1." In this state, data writing to the page buffer is performed.

Figure 20:
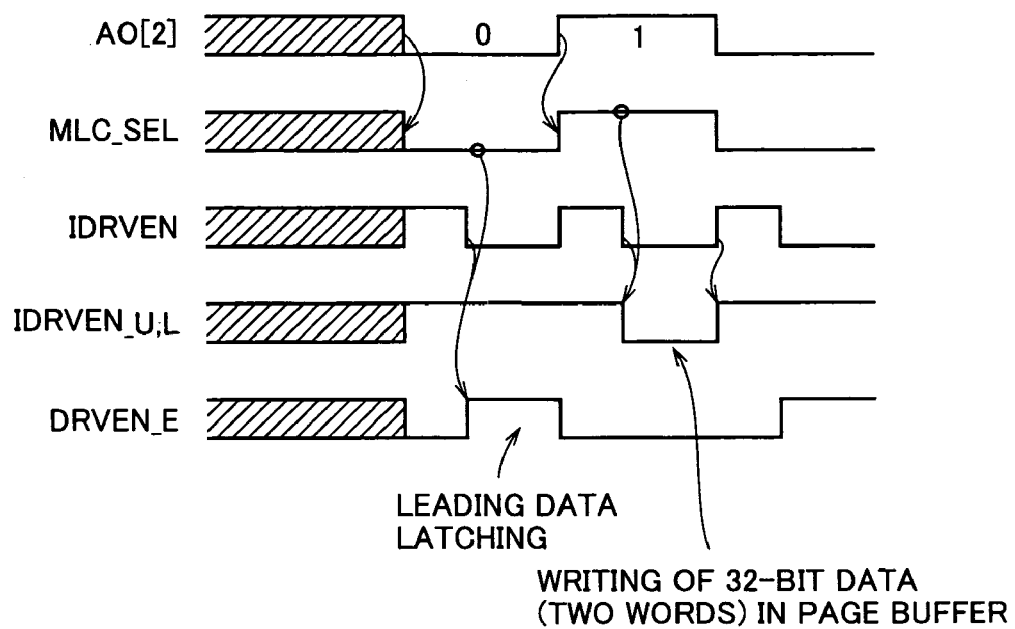
FIG. 20 is a signal waveform diagram representing an operation of the circuit shown in FIG. 19.

On the other hand, drive enable signal DRVEN_E is set at the H level in accordance with drive activation signal IDRVEN, because MLC selection signal MLC_SEL is at the L level when address bit AO [2] is "0" as shown in FIG. 20. When address bit AO [2] is "1," MLC mode array selection signal MLC_SEL is at the H level and drive activation signal DRVEN_E is set at the L level (active state). In other words, drive activation signal DRVEN_E designates take-in/latching of the first data of two successive 16-bit data and when the second data of the two successive 16-bit data is applied, bit line drive enable signals (byte selection signals) IDRVEN_U and IDRVEN_L are activated and write-in to the page buffer is performed.

Figure 21:
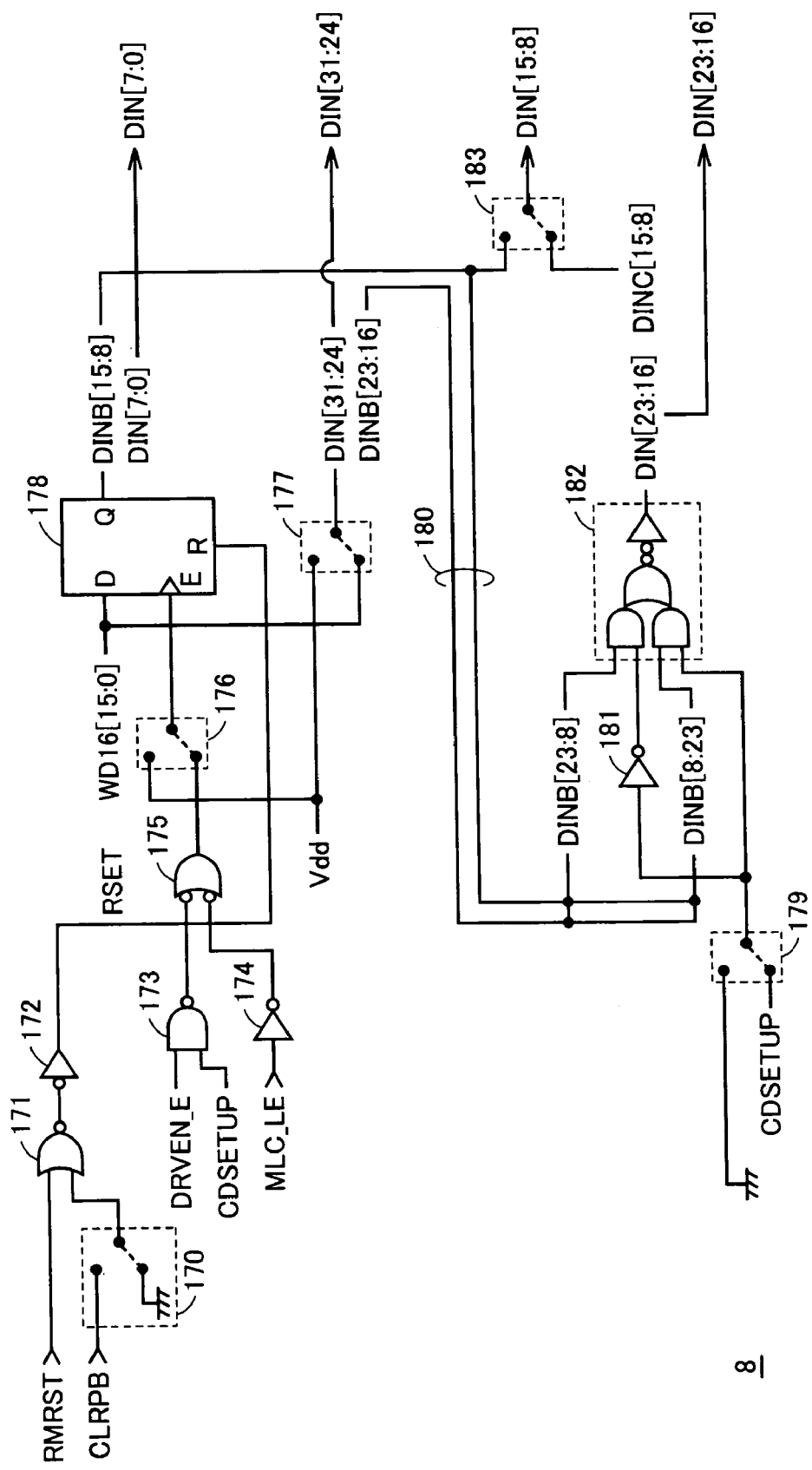
FIG. 21 is a diagram showing an example of the configuration of a data conversion circuit shown in FIG. 4.

FIG. 21 is a diagram schematically showing the configuration of the part that generates page buffer write-in data DIN [31:0] in data conversion circuit 8 shown in FIG. 4. In FIG. 21, data conversion circuit 8 includes: a NAND gate circuit 173 that receives drive activation signal DRVEN_E and data setup instruction signal CDSETUP; an inverter 174 that receives data latch instruction signal MLC_LE; a NAND gate circuit 175 that receives an output signal of NAND gate circuit 173 and an output signal of inverter 174; a metal switch 176 that selects either the output signal of NAND gate circuit 175 or power supply voltage Vdd; a register circuit 178 responsive to the rise of the output signal of metal switch 176, for taking in and latching write-in data WD 16 [15:0] externally applied; and a metal switch 177 that selects either power supply voltage Vdd or write-in data WD16 [15:0] externally applied.

16-bit data DINB [15:8] and DIN [7:0] are generated by register circuit 178 and 16-bit data DIN [31:24] and DINB [23:16] are generated by metal switch 177. This metal switch 177 selects write-in data WD16 [15:0] in the MLC configuration and selects power supply voltage Vdd in the SLC configuration.

To this register circuit 178, there are provided: a metal switch 170 that receives either page buffer clear instruction signal CLRPB or the ground voltage; an OR gate circuit 171 that receives an output signal of metal switch 170 and a main reset signal RMRST; and an inverter 172 that receives an output signal of OR gate circuit 171, to generate a reset signal RSET. The storage data of register circuit 178 is reset in accordance with reset signal RSET outputted by the inverter 172.

Data conversion circuit 8 further includes interconnection 180 that converts the order of arrangement of data DINB [15:0] and DINB [23:16] to data DINB [23:8] and DINB [8:23]; a metal switch 179 that selects either the ground voltage or data setup instruction signal CDSETUP; an inverter 181 that receives the output signal of metal switch 179; and a composite gate circuit 182 that selects either 16-bit data DINB [23:8] or DINB [8:23] in accordance with the output signal of inverter 181.

Metal switch 179 selects data setup instruction signal CDSETUP in the MLC configuration and selects the ground voltage in the SLC configuration. Composite gate circuit 182 selects data bits DINB [8:23] when the output signal of inverter 181 is at the L level and selects the data bits [23:8] when the output signal of inverter 181 is at the H level. Arrangement positions of bits are in reversed relation between data bits DINB [8:23] and data bits DINB [23:8].

In the programming operation, data setup instruction signal CDSETUP is set at the H level, data bits DINB [8:23] are selected and data DIN [23:16] and DINC [15:8] are generated. Metal switch 183 selects data DINC [15:8] to generate data bits DIN [15:8] in the MLC configuration. Accordingly, in the MLC configuration, data bits DIN [23:8] are outputted with the bit positions thereof being converted.

In data writing, data take-in activation signal (drive activation signal) DRVEN_E is activated when the first write-in data is supplied (when address bit AO [2] is "0") so that the output signal of NAND gate circuit 173 turns L level and responsively, he output signal of NAND gate circuit 175 attains the H level and register circuit 173 takes in and stores write-in data WD16 [15:0] externally applied. Accordingly, the first data is stored in register circuit 178 and subsequently successive data is generated by metal switch 177 in accordance with the successive external word data (upper word). When the second data is supplied, the data positions of 32-bit data are changed accordingly.

Figure 22:
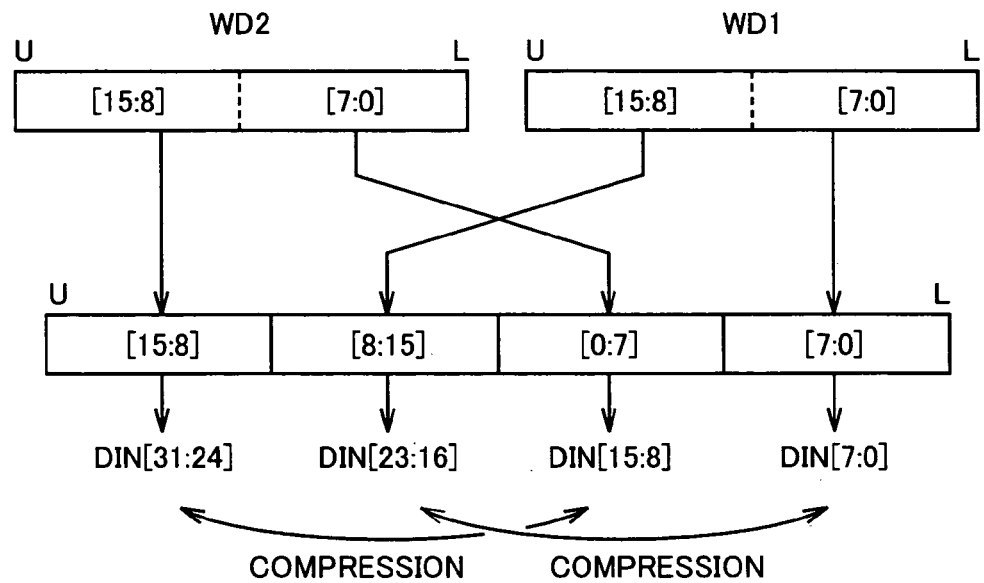
FIG. 22 is a diagram schematically showing the operation of a data conversion circuit shown in FIG. 21.

FIG. 22 is a diagram schematically illustrating the data bit position converting operation in data conversion circuit 8 shown in the above FIG. 21. Now, it is assumed that write-in data WD1 and WD2 are sequentially and successively supplied. The bit position orders of upper byte data [15:8] of write-in data WD1 and lower byte data [7:0] of write-in data WD2 are changed by composite logic gate circuit 182 shown in FIG. 21 and the data byte positions thereof are also changed. Accordingly, when 32-bit data is generated, the upper byte data of write-in data WD2 turns write-in data DIN [31:24] to the page buffer, and the data having the bit positions of the upper byte data of write-in data WD1 changed turns write-in data DIN [23:16] to the page buffer. In addition, data [0:7] having the bit positions of lower byte data [7:0] of write-in data WD2 reversed turns write-in data DIN [15:8] to the page buffer. Lower byte data [7:0] of write-in data WD1 becomes write-in data DIN [7:0] to the page buffer. Accordingly, this composite logic gate achieves the change in the data bit positions upon writing into page buffer shown in FIG. 5.

Figure 23:
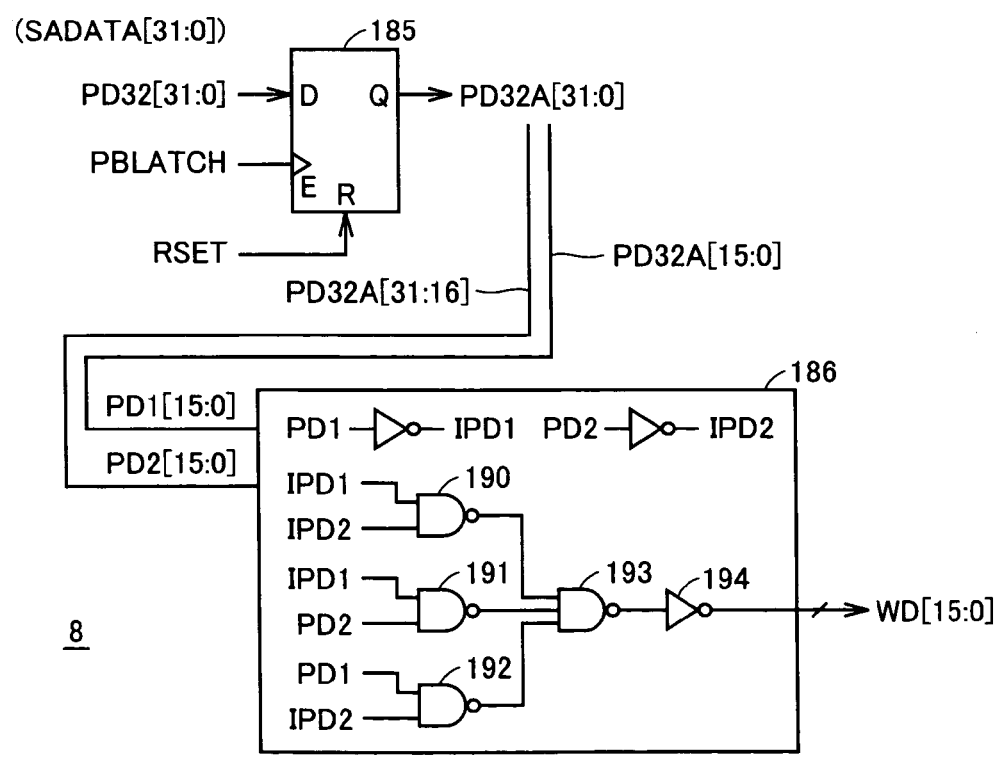
FIG. 23 is a diagram showing an example of the configuration of a data degeneration part that is included in the data conversion circuit shown in FIG. 4.

FIG. 23 is a diagram schematically showing the configuration of the part that generates write-in data to memory cells in data conversion circuit 8 shown in FIG. 4. In FIG. 23, data conversion circuit 8 includes: a register circuit 185 that takes in and latches 32-bit data PD32 [31:0] read out from the page buffer in accordance with data latch control signal PBLATCH; and a data compressing circuit 186 that receives 32-bit output data PD32A [31:16] and PD32A [15:0] of the register circuit 185 as 16-bit data PD2 [15:0] and PD1 [15:0] respectively to compress the received data to 16-bit data WD [15:0] for outputting.

Register circuit 185 is formed of a latch circuit and enters a through state when latch instruction signal PBLATCH is at the L level and enters a latching state when latch instruction signal PBLATCH is at the L level. In addition, register circuit 185 has the storage data reset in accordance with reset signal RSET.

The data degenerating circuit 186 processes the compression operation of the bits at corresponding positions in 16-bit data PD1 [15:0] and PD2 [15:0]. FIG. 23 shows, as a representative, the configuration for generating 1-bit compressed data. Data compression circuit 186 includes: a NAND gate circuit 190 that receives inverted data bit IPD1 and inverted data bit IPD2; a NAND gate circuit 191 that receives inverted data bit IPD1 and data bit PD2; a NAND gate circuit 192 that receives data bits PD1 and IPD2; a NAND gate circuit 193 that receives the output signals of these gate circuits 190 to 192; and an inverter 194 that inverts the output signal of NAND gate circuit 193 so as to generate a compressed data bit. Inverted data bit IPD1 and IPD2 are inverted bits of data bits PD1 and PD2, respectively.

In data compressing circuit 186 shown in FIG. 23, the compressed data bit is set at the H level ("1") when all of the output signals of NAND gate circuits 190 to 192 are at the H level. This condition is satisfied when data bits PD1 and PD2 are both "1." If at least one of data bits PD1 and PD2 is "0," the compressed data bit assumes "0" (L level). Accordingly, 2-bit data (1, 1) corresponds to the state of the H level and the remaining 2-bit data (0, 0), (0, 1) and (1, 0) are made corresponding to the state of storing data "0".

Figure 24:
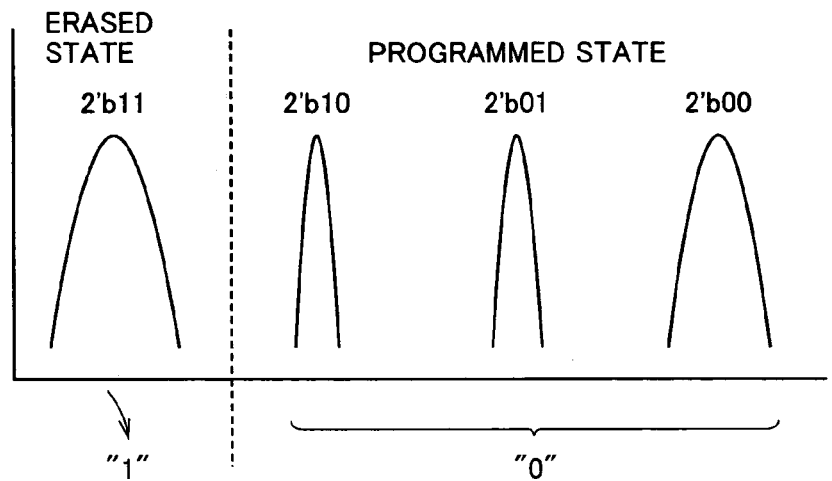
FIG. 24 is a diagram showing the correspondence relationship between 4-level data and the threshold voltages of a memory cell.

Specifically, as shown in FIG. 24, the state where data bits (1, 1) are stored is made corresponding to the erased state and the states where data "10", "01", and "00" are stored are made corresponding to the programmed state.

Accordingly, in data writing, first, the erasure verification operation is performed before data writing to a memory cell, to compare the storage data with write-in data. After the verification, if the threshold voltage of the memory cell corresponds to the write-in data, the corresponding 2-bit data in the page buffer is changed to "11". Subsequently, the programming operation increases the threshold voltages by one value. In the verification operation, when the storage data coincides with the write-in data, the bit is set to "1". As a result, data writing is performed in accordance with the compressed data bit only on the memory cells that requires further increase of the threshold voltage.

This data writing is simultaneously performed in units of 16 bits, and therefore a high voltage is supplied to bit lines from the write driver so that the data writing is performed by the channel hot electrons (CHE). Data writing requires erasure and erasure verification before writing as well as a program verification operation, and in addition, it is necessary to adjust the program voltage of word lines upon writing, and these operations are simultaneously performed with 32-word data (16-word data for memory cells) being a unit. As a result, data can be written into 16 memory cells connected to the same word line successively without changing the word line voltage once set and external 32-word data can be successively written. Further, the verification operation is performed in units of internal 16 words.

Figure 25:
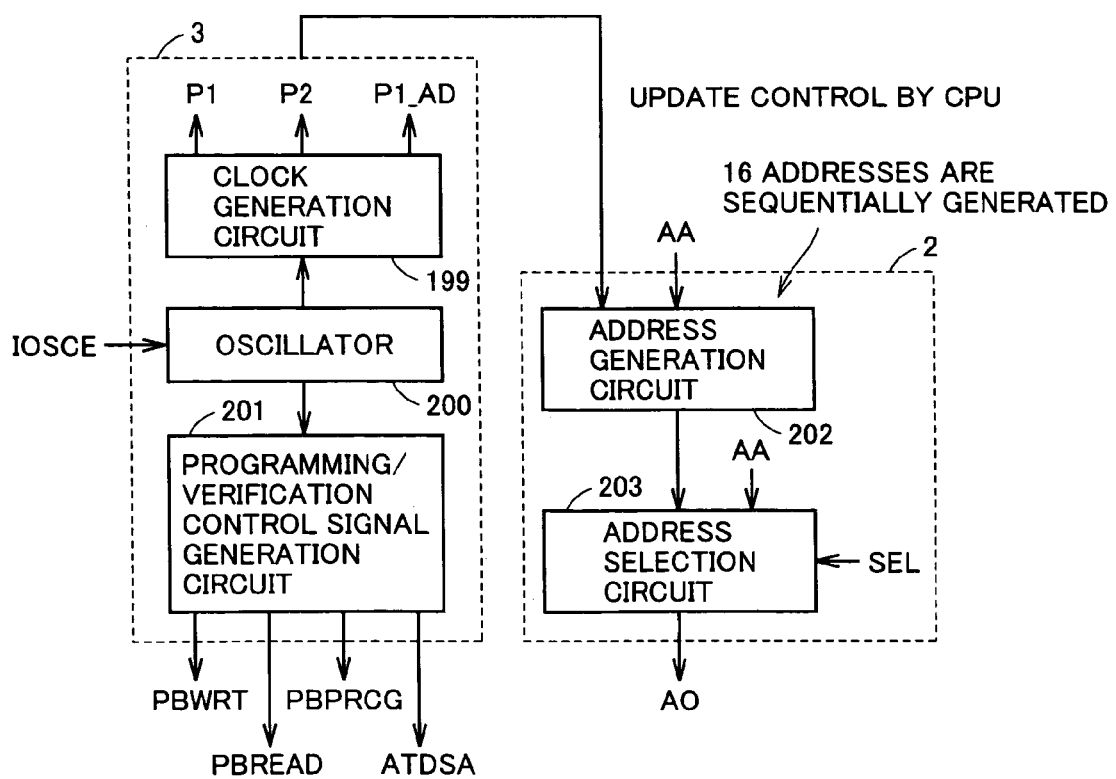
FIG. 25 is a diagram schematically showing the configuration of the main portion of an OSC circuit and a command user interface shown in FIG. 4.

FIG. 25 is a diagram schematically showing the configuration of the part related to data program included in OSC circuit 3 and in the command user interface (CUI) shown in FIG. 4. In FIG. 25, OSC circuit 3 includes: an oscillator 200 that oscillates in accordance with oscillation enable signal IOSCE and generates a clock signal of a predetermined period; and a program/verification control signal generation circuit 201 that generates control signals required for the programming and verification operations in accordance with the clock signal outputted from oscillator 200. The generated control signals include page buffer write-in control signal PBWRT, page buffer read-out control signal PBREAD, page buffer precharge control signal PBPRCG and verification sense amplifier activation signal ATDSA. Verification of data in a memory cell is performed before programming (after erasure verification). If the storage data of the page buffer is the same as the data in the memory cell, the programming operation is not performed on this memory cell.

Command user interface 2 includes a clock generation circuit 199 that generates 2-phase clock signals P1, P2 and P1_AD in accordance with the oscillation signal from this oscillator 200; an address generation circuit 202 that sequentially updates the address value in accordance with clock signal P1_AD under the control of the CPU not shown; and an address selection circuit 203 that selects either the address generated by address generation circuit 202 or external address signal AA in accordance with selection signal SEL to generate a programming address signal AO.

Address generation circuit 202 is formed of a count circuit that performs the counting operation sequentially starting at the initial value set at, for example, external address signal AA. Address selection circuit 203 selects the address signal from address generation circuit 202 in place of external address signal AA upon the programming and verification operations to generate program address signal AO. When write-in data is written in the page buffer externally, the address selection circuit 203 selects external address signal AA. Address signal AO from the address selection circuit 203 is supplied to the row and column selection circuitry of the page buffer and the memory cell array.

An address is updated in accordance with clock signal P1_AD and thus, data write-in and read-out to the page buffer can be performed while utilizing the clock signal as an address transition detection signal.

Figure 26:
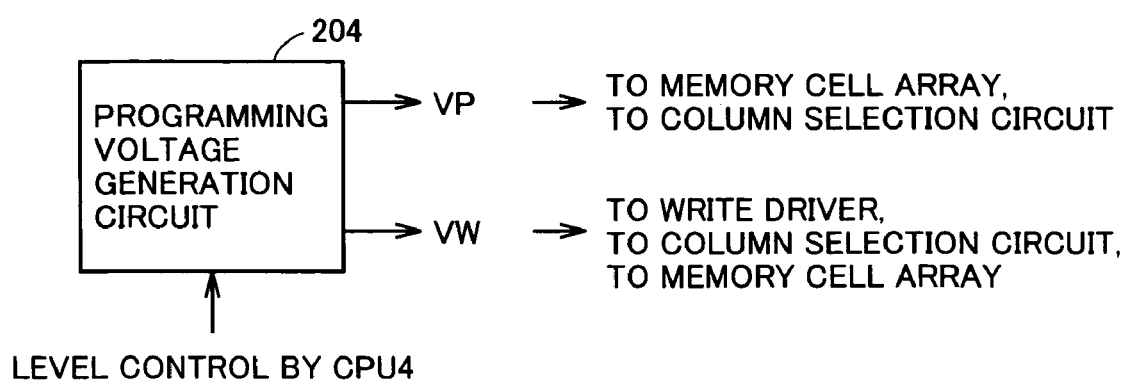
FIG. 26 is a diagram schematically showing the configuration of the part that generates a voltage at the time of programming.
Figure 27:
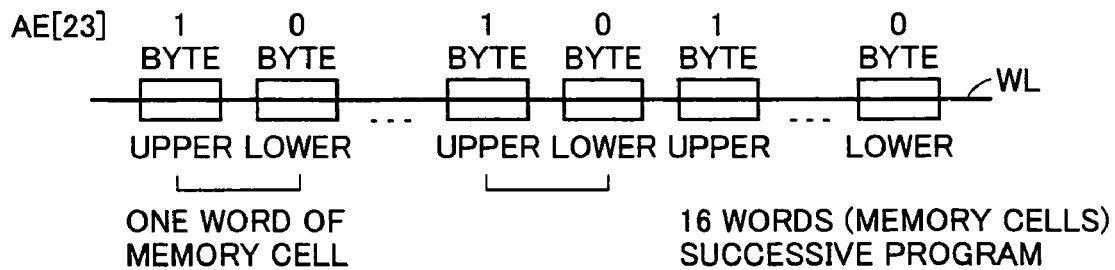
FIG. 27 is a diagram showing the write-in sequence of a data word in the data writing into the memory cell array.

FIG. 26 is a diagram schematically showing the configuration of the part that generates the voltage used in programming. Program voltage generation circuit 204 shown in FIG. 26 adjusts the voltage levels of the voltage VP transmitted onto a word line and the voltage VW supplied to a bit line in writing (programming) under the control of CPU4 shown in FIG. 4. This voltage VP is transmitted to a word line via the row selection circuit of the memory cell array and the voltage VW is applied to write driver 9 and the column selection circuit of the memory cell array. In the programming and in verification, as shown in FIG. 27, one word line WL is selected and 16 data are successively stored. The byte data corresponding to the lower data or the byte data corresponding to the upper data are simultaneously stored in the region at which address bit AE [23] =0 or 1. As shown in FIG. 27, lower byte and upper byte corresponding to the upper word and the lower word are successively written in a word (16 bits) unit for one word line.

With one word line being held in the selected state, data is successively written and programming and verification can be performed on external 32-word data while maintaining the voltage of word line WL at a predetermined level, and thus it becomes unnecessary to change word lines in units of words and write-in can be performed at a high speed.

Figure 28:
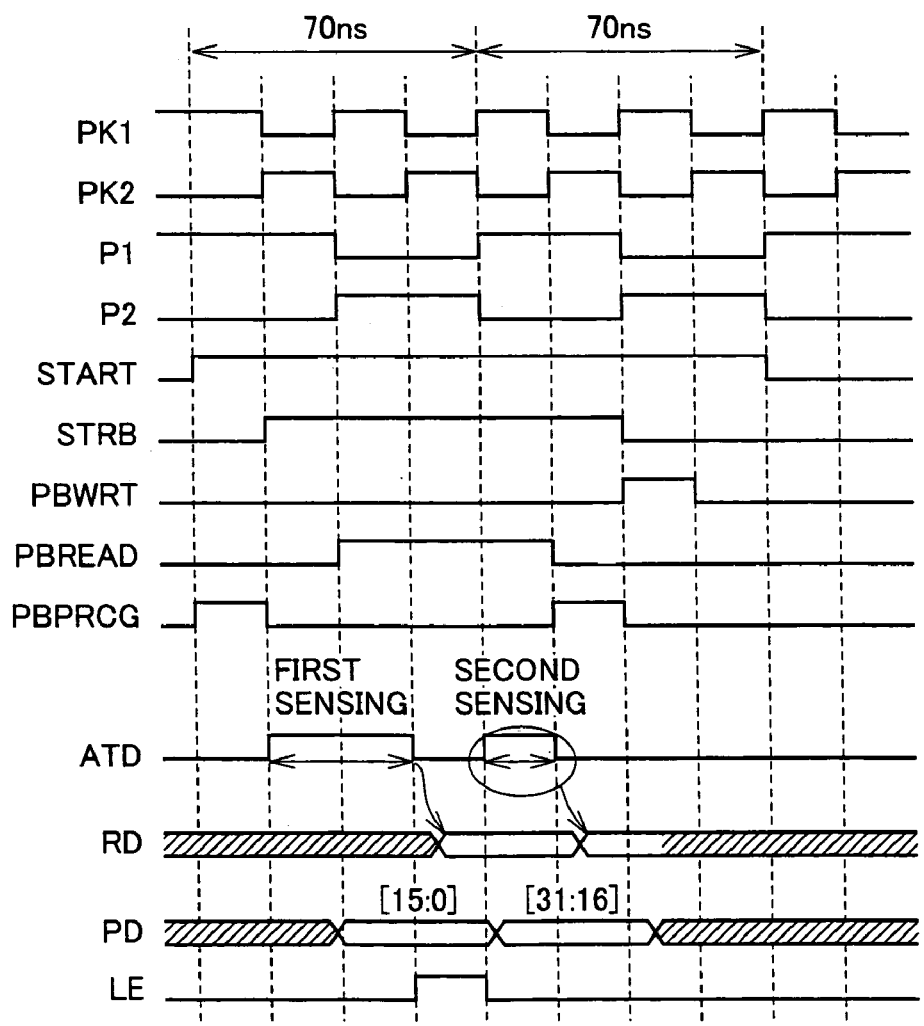
FIG. 28 is a timing chart representing an operation of the data reading out from the memory cell array in verification.

FIG. 28 is a timing chart representing an operation in verification. In the following, the verification operation is briefly described with reference to FIG. 28. In the verification operation, verification start instruction signal START is set to the H level. Two clock cycles of clock signals P1 and P2 are allocated to the verification operation of writing data into memory cells of 16 bits. These clock signals P1 and P2 are clock signals generated by clock generation circuit 199 shown in FIG. 25 that frequency-divides two-phase clock signals PK1 and PK2 generated by oscillator 200 shown in FIG. 25.

Upon start of the verification operation, first, page buffer precharge control signal PBPRCG attains the H level and precharging is performed on the page buffer. Subsequently, strobe control signal STRB attains the H level, the data read-out from the page buffer is instructed, and the page buffer data corresponding to the data to be verified is produced in accordance with page buffer read-out control signal PBREAD. 32-bit data is read out from the page buffer and is converted to serial 16-bit data PD [15:0] and PD [31:16] in accordance with this page buffer read-out control signal PBREAD. The sensing operation is performed within the memory cell array in parallel to the data read-out from this page buffer in accordance with address transition activation signal (sense amplifier activation signal) ATD and thereby memory cell data RD is read out. Page buffer read-out control signal PBREAD is activated during the first sensing period and is inactivated in the second sensing operation.

Data is read out twice from the same memory cells of 16 bits so that 2-bit data stored in each memory cell is read out. The second read-out data RD and page buffer data PD [15:0] are latched in accordance with latch enable signal LE (MLC_LE) and the verification result thereof is also latched. Subsequently, coincidence or non-coincidence between the data read out through the second sensing operation and page buffer data PD [31:16] are subject to verification on coincidence/non-coincidence. After precharging is performed on the page buffer in accordance with page buffer precharge instruction signal PBPRCG, data according to this verification result are written into the corresponding memory cells. When this verification is achieved, data "1" is written in the memory cell to which programming completes, and write-in to the memory cell is prohibited afterwards.

The programming and verification operations are repeatedly performed until verification result indicates the accurate data writing. With respect to clock signals P1 and P2, two clock cycles are allocated to 16-bit memory cells and programming is performed successively on 32 words and verification is also performed successively on memory cells of 16 words (external 32 words).

In data read-out from a memory cell, precharging time period between the first sensing operation and the second sensing operation is sufficiently short as compared with the conventional precharging period of time. In data read-out from a memory cell, a bit line is once set at the read-out voltage level in the first sensing operation and the voltage change of the bit line is small in data reading and a potential change on the verification read-out data line is extremely small, if present. Thus, bit lines and internal verification read-out data lines can be sufficiently precharged to the precharging level even if the precharging period of time is shortened. The bit lines and the verification data read-out lines are first precharged in each of the sensing periods, and thereafter the sensing operation is performed. Therefore, the sense period includes the precharging period and the sensing operation period and accordingly the second sensing period of time is shorter than the first sensing period time, reducing the time period required for the verification.

Alternatively, the second sensing operation may be made shorter. Data sensing is performed in accordance with a binary search methodology and therefore the potential of the read-out memory cell is one of the binary values "1" and "0" on the basis of the comparison reference potential. Thus, the memory read-out potential is binary levels, unlike the case where the threshold voltage is different even for the same bit value and it is required to detect the different memory cell read-out potentials as in the first sensing. Therefore, data can be precisely read out even if the period of time for the sensing operation is reduced in the second sensing.

Figure 29:
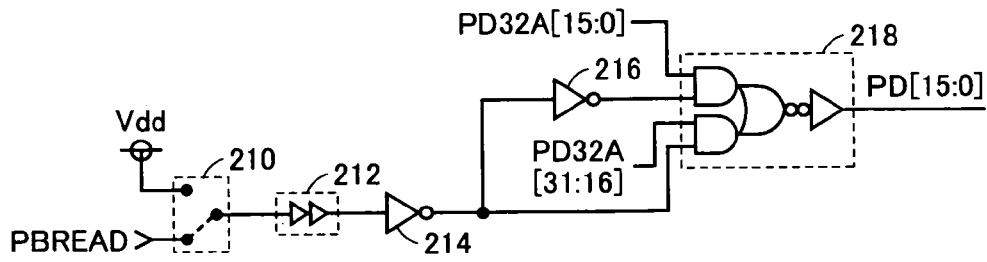
FIG. 29 is a diagram showing an example of the configuration of the part that generates page buffer data included in a verification circuit shown in FIG. 4.

FIG. 29 is a diagram schematically showing the configuration of the parallel/serial conversion part of the page buffer data included in verification circuit 52 shown in FIG. 4. In FIG. 29, the data parallel/serial conversion part includes: a metal switch 210 that selects either page buffer read-out control signal PBREAD or power supply voltage Vdd; a delay circuit 212 that delays an output signal of metal switch 210 by a predetermined period of time; an inverter 214 that inverts an output signal of delay circuit 212; an inverter 216 that inverts an output signal of inverter 214; and a composite logic gate 218 that selects either page buffer read-out data PD32A [15:0] or PD32A [31:16] in accordance with the output signals of inverters 214 and 216 to generate page buffer data PD [15:0].

Composite logic gate circuit 218 selects lower page buffer readout data PD32A [15:0] when the output signal of inverter 216 is at the H level and selects upper page buffer read-out data PD32A [31:16] when the output signal of inverter 214 is at the H level. Accordingly, during the time when page buffer read-out control signal PBREAD is at the H level, the first sensing operation is performed in the memory cell array so that the lower bit data of each word is read out, and at this time, page buffer read-out data PD32A [15:0] is selected and page buffer data PD [15:0] is produced. When page buffer read-out control signal PBREAD attains the L level and the second sensing operation is performed in the memory cell array, page buffer data PD [15:0] is generated in accordance with page buffer read-out data PD32A [31:16].

Through the use of page buffer read-out control signal PBREAD, either the upper byte data or the lower byte data of the page buffer read-out data can be easily selected in correspondence to the memory cell read-out data from the memory cell array.

Figure 30:
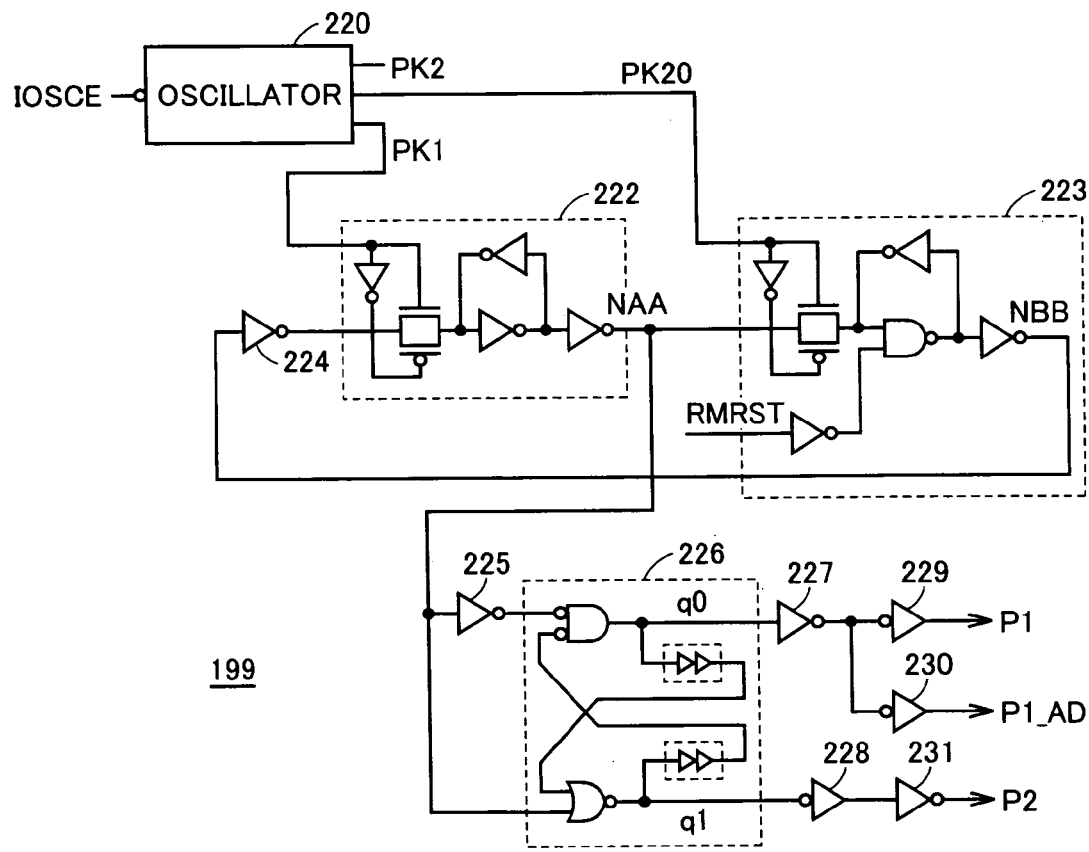
FIG. 30 is a diagram showing one example of the configuration of the portion that generates the clock signal shown in FIG. 25.

FIG. 30 is a diagram showing an example of the configuration of clock generation circuit 199 shown in FIG. 25. In FIG. 30, clock generation circuit 199 includes: an oscillator 220 that performs the oscillation operation in accordance with oscillator enable instruction signal IOSCE to generate clock signals PK1, PK2 and PK20; a latch circuit 222 that selectively enters the latching state in accordance with clock signal PK1; a latch circuit 223 with a resetting function for selectively entering the latching state in accordance with clock signal PK20; an inverter 224 that inverts an output signal of latch circuit 223 for transference to latch circuit 222; an inverter 225 that inverts the output signal of latch circuit 223 with the resetting function; a set/reset flip flop 226 that is set when the output signal of inverter 225 is at the H level and is reset when the output signal of latch circuit 223 with the resetting function is at the H level; an inverter 227 that receives an output signal q0 of the set/reset flip flop 226; an inverter 228 that receives an output signal q1 of the set/reset flip flop 226; an inverter 229 that inverts an output signal of inverter 227 to generate the clock signal P1; an inverter 2230 that inverts the output signal of inverter 227 for generating CPU clock signal P1_AD; and an inverter 231 that inverts the output signal of inverter 228 to generate the clock signal P2.

Clock signals PK1 and PK20 are 2-phase, complementary clock signals and latch circuit 222 enters the latching state when clock signal PK1 is at the L level and enters the through state when clock signal PK1 is at the H level. Latch circuit 223 with a resetting function enters the through state when clock signal PK20 is at the H level and enters the latching state when clock signal PK20 is at the L level. This latch circuit 223 with a resetting function has its internal node NBB reset to the L level in response to reset instruction signal RMRST.

These latch circuits 222 and 223 form a dividing circuit of clock signals PK1 and PK20. Flip flop 226 is set or reset in accordance with the signal of output node NAA of latch circuit 222. The flip flop 226 includes NOR gate circuits having outputs and first inputs are cross-coupled and the output signal of one NOR gate circuit is supplied to the other NOR gate circuit via a delay circuit. Accordingly, non-overlapping, 2-phase clock signals q0 and q1 are outputted from this set/reset flip flop 226. Responsively, clock signals PK1 and PK2 are non-overlapping, 2-phase clock signals. Clock signal P_AD is supplied to CPU and address update timing and address generation timing of address generation circuit 202 shown in FIG. 25 are set in accordance with this clock signal P_AD by the CPU.

Figure 31:
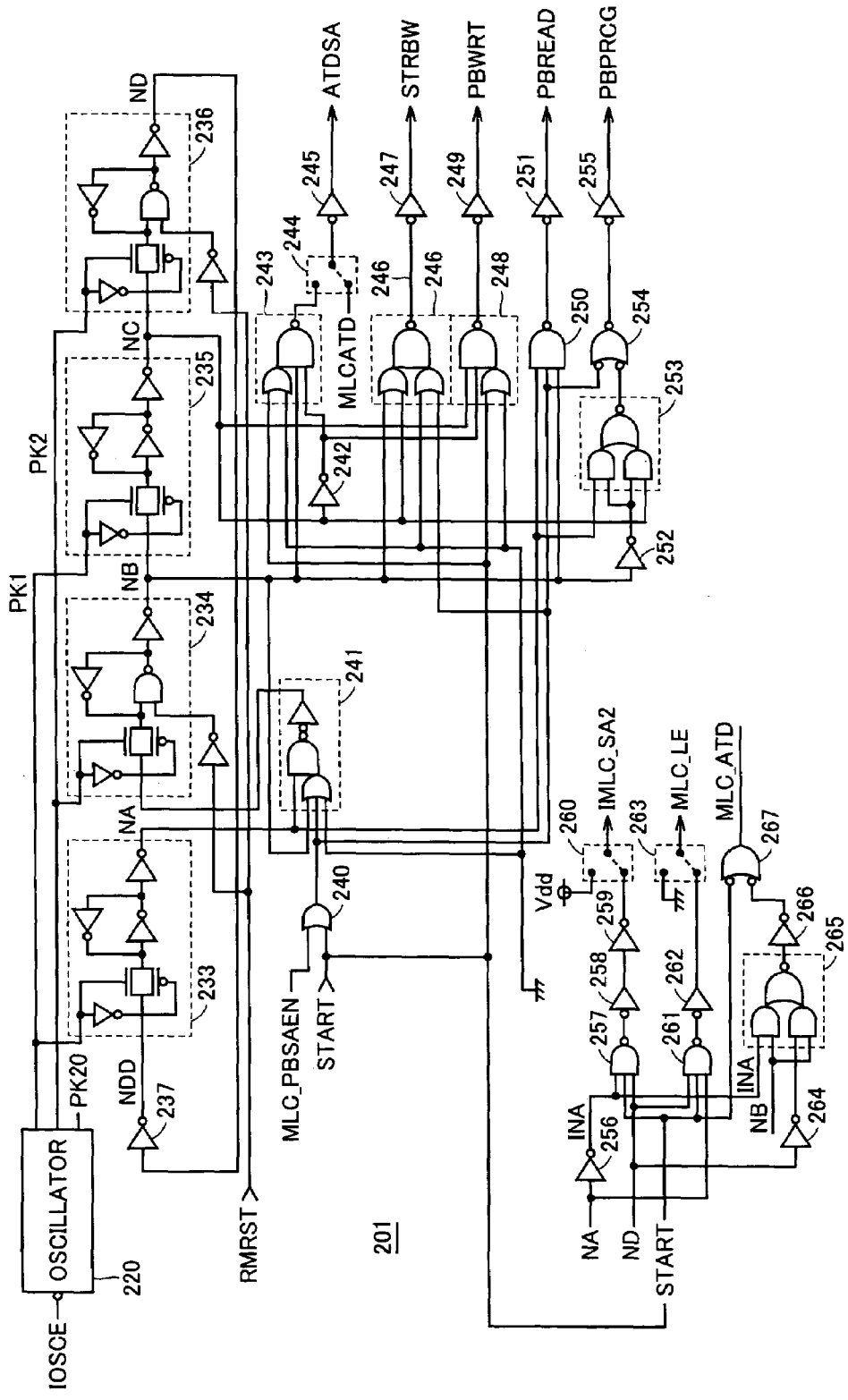
FIG. 31 is a diagram showing an example of the configuration of the part that generates a verification control signal of the verification circuit shown in FIG. 4.

FIG. 31 is a diagram showing an example of the configuration of programming/verification control signal generation circuit 201 shown in FIG. 25. In FIG. 31, programming/verification control signal generation circuit 201 includes: latch circuits 223 to 226 that selectively enters the latching state in accordance with 2-phase clock signals PK1 and PK2 from oscillator 220; and an inverter 237 that inverts the signal from output node ND of latch circuit 236 for transmission to latch circuit 233.

Latch circuits 233 and 235 enters the through state when clock signal PK1 is at the H level and enters the latching state when clock signal PK1 is at the L level. Latch circuits 234 and 236 enter the through state when clock signal PK2 is at the H level and enter the latching state when clock signal PK2 is at the L level. Latch circuits 234 and 236 have a resetting function and internal output nodes NB and ND are initialized at the L level in accordance with reset signal RMRST. The output signal of latch circuit 236 is inverted by inverter 237 and is transferred to input node NDD of latch circuit 233 at the first stage and therefore a dividing circuit for bi-dividing each of clock signals PK1 and PK2 is implemented by these latch circuits 233 to 236.

Programming/verification control signal generation circuit 201 further includes: an OR gate circuit 240 that receives programming start instruction signal MLCPB-SEAN and verification operation start instruction signal START; a composite logic gate 241 that transmit the signal from internal output node NA of latch circuit 233 to latch circuit 234 when the output signal of OR gate circuit 240 is at the H level; an inverter 242 that inverts the signal of internal output node NC of latch circuit 235; a composite logic gate circuit 243 that receives verification operation start instruction signal START, the ground voltage and the output signal of inverter 242; a metal switch 244 that selects either the output signal of composite logic gate circuit 243 or access timing signal MLC_ATD; and an inverter 245 that inverts the output signal of metal switch 244 to generate memory cell array sense amplifier activation signal ATDSA. This metal switch 244 selects access timing signal MLC_ATD in the MLC configuration. An access cycle for the memory cell array is set in accordance with this timing signal MLC_ATD. Sense amplifier activation signal ATDSA determines the sensing period and corresponds to timing signal ATD shown in FIG. 28.

Programming/verification control signal generation circuit 201 further includes: a composite gate circuit 246 that receives the output signal latch circuit 234, the output signal of latch circuit 235 and the output signal of OR gate circuit 240; and an inverter 247 that inverts the output signal of composite gate circuit 246 to generate page buffer data read-out control signal STRBW. Composite gate circuit 246 outputs a signal at the L level when one of the output signals of latch circuits 234 and 235 is at the H level and the output signal of OR circuit 240 is at the H level.

Programming/verification control signal generation circuit 201 further includes: a composite logic gate circuit 248 that generates an output signal in accordance with verification start instruction signal START and the output signal of inverter 242; and an inverter 249 that inverts the output signal of composite logic gate circuit 248 to generate page buffer write-in control signal PBWRT. The composite logic gate circuit 248 outputs a signal at the L level when the output of inverter 242 is at the H level and verification start instruction signal START is at the H level.

Here, the ground voltage is supplied to composite logic gate circuits 241, 243, 246 and 248 because a test mode signal, which is not utilized in a normal operation mode, is supplied.

Programming/verification control signal generation circuit 201 further includes: a NAND gate circuit 250 that receives the output signal of latch circuit 233, the output signal of OR gate circuit 240 and the output signal of latch circuit 234; an inverter 251 that inverts the output signal of NAND gate circuit 250 to generate page buffer read-out control signal PBREAD; an inverter 252 that receives the output signal of latch circuit 234; a composite logic gat circuit 253 that selects and inverts either the output signal of latch circuit 233 or the output signal of latch circuit 235 in accordance with the output signal of inverter 252; an AND gate circuit 254 that receives the output signal of composite logic gate circuit 253 and the output signal of OR gate circuit 240; and an inverter 255 that inverts the output signal of AND gate circuit 254 to generate page buffer precharge control signal PBPRCG. Composite logic gate circuit 253 outputs a signal at the H level when the output signal of inverter 252 is at the H level, or the output signal of latch circuit 234 is at the L level and the output signal of latch circuit 233 or the output signal of latch circuit 235 is at the H level.

Programming/verification control signal generation circuit 201 further includes: an inverter to 256 that receives the signal from internal output node NA of latch circuit 233; a NAND gate circuit 257 that receives the signal from internal output node NB of latch circuit 236, verification start instruction signal START and the output signal of inverter 256; an inverter 258 that receives the output signal of NAND gate circuit 257; an inverter 259 that receives the output signal of inverter 258; a metal switch 260 that selects either the output signal of inverter 259 or power supply voltage Vdd to generate verification sense amplifier activation signal IMLC_SA2; a NAND circuit 261 that receives the output signal of latch circuit 236, verification start instruction signal START and the output signal of latch circuit 233; an inverter 262 that receives the output signal of NAND gate circuit 261 and a metal switch 263 that selects either the output signal of inverter 262 or the ground voltage to generate latch instruction signal MLC_LE. Metal switch 263 selects the output signal of inverter 262 in the MLC configuration. This latch instruction signal MLC_LE corresponds to latching instruction signal LE in the timing chart shown in FIG. 28 and latches the read-out data from a memory cell and the data of the verification result.

The data generated in the second sensing operation is latched in accordance with sense amplifier activation signal IMLC_SA2. This sense amplifier activation signal IMLC_SA2 may determine the time period of the second sensing operation.

Programming/verification control signal generation circuit 201 further includes: an inverter 264 that receives the output signal of latch circuit 236; a composite logic gate circuit 265 that generates its output signal in accordance with an output signal of inverter 256, an output signal of latch circuit 234 and an output signal of inverter 264; an inverter 266 that inverts the output signal of composite logic gate circuit 265; and a NAND gate circuit 267 that receives the output signal of inverter 266 and verification operation start instruction signal START to generate access timing signal MLC_ATD to a memory cell. Composite logic gate circuit 265 adjusts the clock period and outputs a signal at the L level when the output signal of latch circuit 233 is at the L level and the output signal of latch circuit 234 is at the H level or when the output signal of latch circuit 234 is at the H level and the output signal of latch circuit 236 is at the L level.

Metal switch 244 selects array activation timing signal MLC_ATD from NAND gate circuit 267 in the MLC configuration to generate timing signal ATDSA and thereby, the sensing period for the array is determined by clock signals PK1 and PK2 as shown in FIG. 28.

Figure 32:
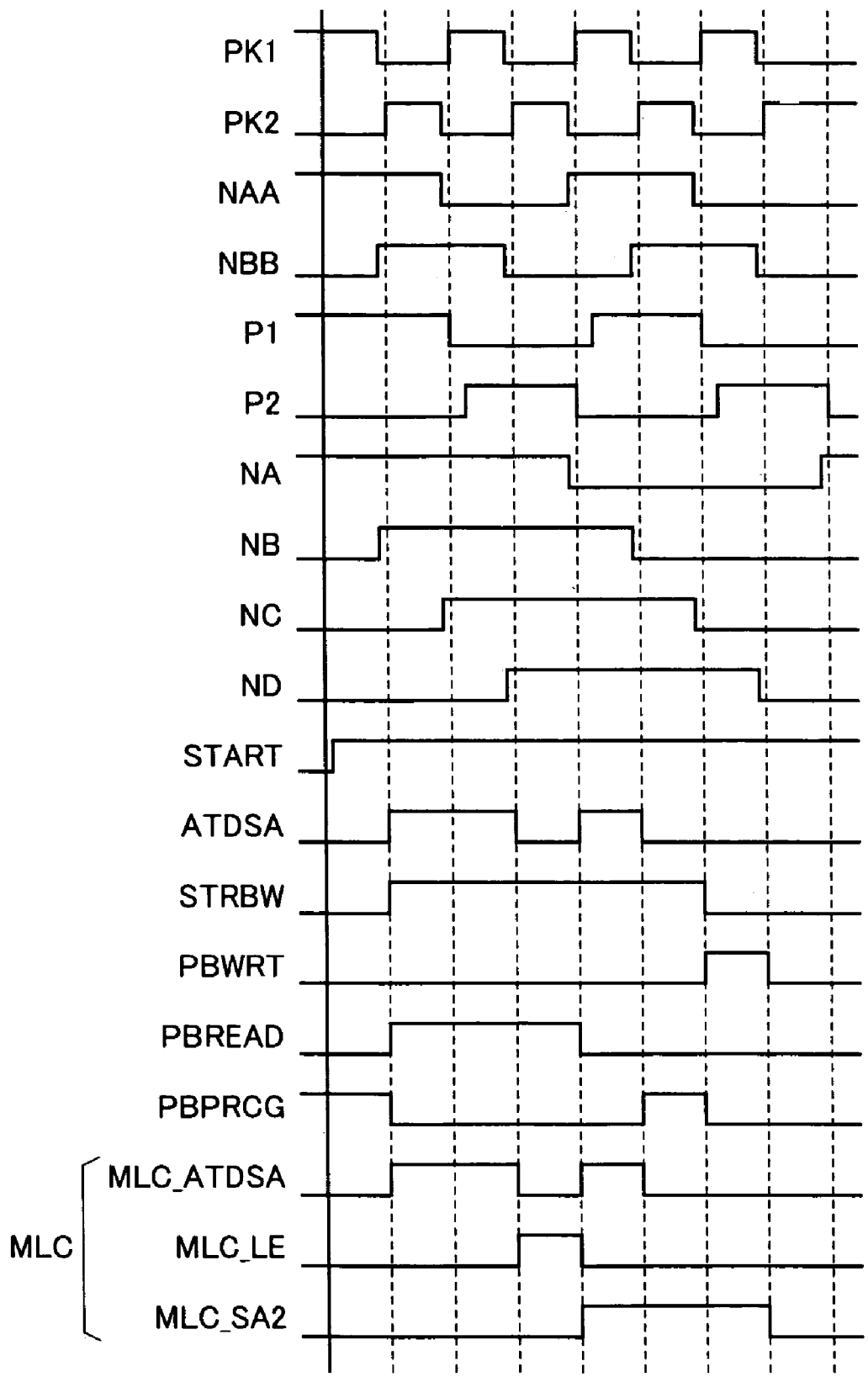
FIG. 32 is a signal waveform diagram representing an operation of the circuit shown in FIG. 31 in the verification operation.

FIG. 32 is a timing chart representing the operations of clock generation circuit 199 and programming/verification control signal generation circuit 201 shown in FIGS. 30 and 31. In the following, the operation of the OSC circuit shown in these FIGS. 30 and 31 is described with reference to FIG. 32.

When it is necessary to generate a clock signal in accordance with a command externally supplied, oscillator enable signal IOSCE is activated so that oscillator 220 performs the oscillation operation to generate 2-phase clock signals PK1 and PK2. As shown in FIG. 30, latch circuits 222 and 223 carries out the signal latching/transferring operation in accordance with clock signals PK1 and PK20 and the voltage levels of their internal nodes NAA and NBB change for each clock cycle of clock signals PK1 and PK2. Accordingly, flip flop 226 is set/reset in accordance with the signal from the internal node NAA shown in FIG. 30 and, therefore, non-overlapping, 2-phase clock signals P1 and P2 having a doubled period of clock signals PK1 and PK2 (PK20) are generated. These clock signals P1 and P2 determine the clock cycle of the internal operation.

The timings for word line selection and the column selection in the memory cell array are determined by these clock signals P1 and P2. In addition, the generation timing of the control signals in the verification operation is set by these clock signals P1 and P2.

The latching state and the through state are repeated in latch circuits 233 to 236 shown in FIG. 31 according to clock signals PK1 and PK2. At the start of the verification operation, verification operation start instruction signal START is activated and when data is read-out from the page buffer to be written in memory cells, page buffer sense amplifier activation signal MLCPDSEAEN is activated.

In this programming operation or in the verification operation, the output signal of OR circuit 240 is at the H level and the output signal of latch circuit 233 is transmitted to latch circuit 234 by composite logic gate circuit 241 and thereby, the voltage change sequence of the internal nodes NB to ND, NDD and NA of these latch circuits 234, 235, 236 and 233 is initialized. When the output signal of OR gate circuit 240 is at the L level, internal node NB of latch circuit 234 is initialized at the L level and therefore, the output signal of composite logic gate circuit 241 is set at the L level independent of the voltage level of the internal node of latch circuit 233.

When clock signals PK1 and PK2 are generated, latch circuits 233 to 236 are connected to operate as a frequency-dividing circuit and at this time, the voltage level of internal node NB is initialized. When the output signal of OR gate circuit 240 is at the H level and one of the output signals of latch circuits 234 and 235 is at the H level, page buffer strobe control signal STRBW from inverter 247 is at the H level. This strobe control signal STRBW determines the activation period of the sense amplifier in the verification operation of the page buffer. During the period when the voltage level of node NB is at the H level and the output signal of OR gate circuit 240 is at the H level and the voltage level of node NA is at the H level, page buffer read-out control signal PBREAD from inverter 251 is at the H level. The data of 32 bits to be verified or to be written is read out from the page buffer in accordance with page buffer read-out control signal PBREAD.

When verification operation start instruction signal START attains the H level, NAND gate circuit 267 operates as an inverter. When node NB is at the H level and when node ND or NA is at the L level, the output signal of composite gate circuit 265 is at the L level, the output signal of inverter 265 attains the H level and output signal MLC_ATD of NAND gate circuit 267 attains the L level. Responsively, access activation signal ATDSA is activated to be at the H level. The sense amplifier is activated (signal MLC_ATDSA is activated) in the memory cell array, the sensing operation is performed in the memory array and 2-bit data is read out in sequence from one memory cell, in accordance with the access activation signal ATDSA. The activation of the sense amplifier in the page buffer is performed, as shown in FIG. 18, in accordance with strobe control signal STRBW after the completion of bit line precharging.

When the voltage level of node ND is at the H level, the voltage level of node NC is at the L level and verification start instruction signal START is at the H level, page buffer write-in control signal PBWRT is at the L level. Verification start instruction signal START is set at the H level during the period of the verification operation of the external 32 words. Accordingly, when the strobe signal STRBW is at the L level, page buffer write-in control signal PBWRB is activated, writing of data into the page buffer is performed and writing of the data of the verification result into the page buffer is performed.

When the voltage level of node NA is at the H level and the voltage level of node NB is at the H level or when the voltage level of node NC is at the H level and the voltage level of node NB is at the L level, the output signal of composite logic gate circuit 253 is at the L level, the output signal of AND gate circuit 254 is at the L level, accordingly, page buffer precharge control signal PBPRCG is at the H level and bit line precharging in the page buffer is performed. After the completion of precharging in the page buffer, page buffer write-in control signal PBWRT is activated and writing of the data of the verification result or of the page buffer data into the page buffer is performed.

In addition, when the voltage level of node ND is at the H level and the voltage level of node NA is at the H level, the output signal of inverter 262 is at the H level, latch instruction signal MLC_LE is activated and the first data read out from memory cells through the first sensing operation is latched.

Subsequently, during the period when the voltage level of node NA is at the L level and the voltage level of node ND is at the H level, MLC sensing activation signal MLC_SA2 is activated and latching of the data read out through the second sensing operation or the second sensing operation is performed.

Accordingly, write-in/read-out control signals to the page buffer are sequentially generated in accordance with these clock signals PK1 and PK2 and address generation/update is controlled in accordance with clock signal P1_AD (P2) to the CPU and thereby, external data of 32 words (16 word data of the internal memory cells) can be read out from the page buffer successively in synchronization with the clock signals, in synchronization with the data read-out from the memory cell array.

Here, when read-out of data from a memory cell array is performed, as described above, the activation period of sense amplifier activation signal MLC_ATDS is shortened in the second sensing operation.

Figure 33:
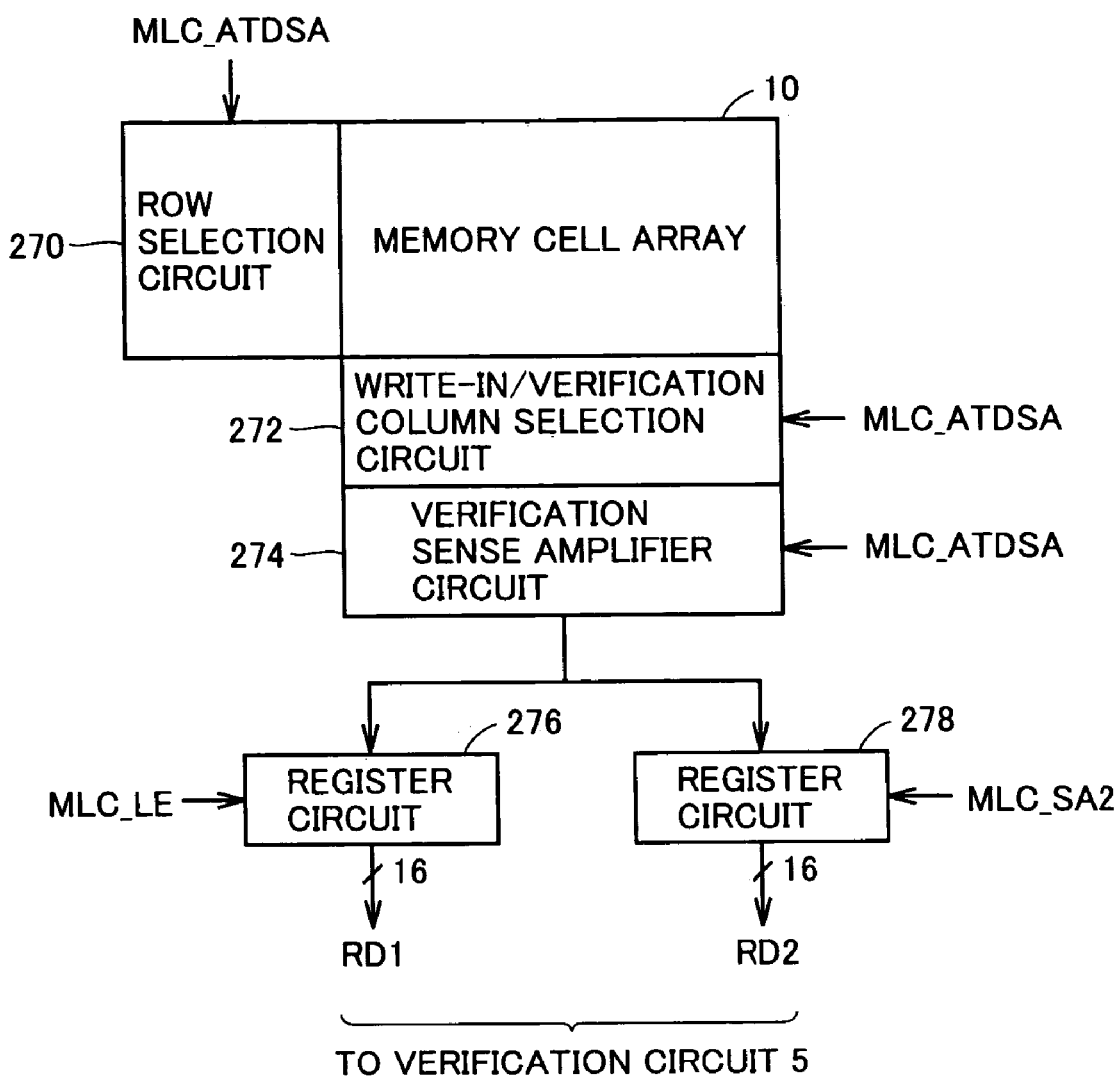
FIG. 33 is a diagram schematically showing the configuration of a verification data read-out part of the nonvolatile semiconductor memory device according to the present invention.

FIG. 33 is a diagram schematically showing the configuration of the part related to the verification for memory cell array 10. In FIG. 33, to memory cell array 10, there are provided a row selection circuit 270, a write-in/verification column selection circuit 272 and a verification sense amplifier circuit 274. The verification sense amplifier circuit 274 includes 16 sense amplifiers and write-in/verification column selection circuit 272 selects 16 pairs of bit lines simultaneously.

Row selection circuit 270 drives one word line to the selected state. The activation timings of the row selection circuit 270, write-in/verification column selection circuit 272 and verification sense amplifier circuit 274 are determined by access activation timing signal MLC_ATDSA. The activation timings of these circuits are set by CPU 4 shown in FIG. 4. Signal MLCATD shown in FIG. 31 or timing signal ATDSA may be used as access activation timing signal MLC_ATDSA.

Two register circuits 276 and 278 are provided to verification sense amplifier circuit 274. Register circuit 276 latches the output data of verification sense amplifier circuit 274 in accordance with latching instruction signal MLC_LE and register circuit 278 latches the output data of verification sense amplifier circuit 274 in accordance with sense amplifier activation signal MCL_SA2. Read-out data RD1 and RD2 from these register circuits 276 and 278 are supplied to verification circuit 5 shown in FIG. 4. As described later in detail, the verification sense amplifier circuit 274 maintains the word line voltages at the same level for the columns (bit lines) and sets the second sense reference current for each bit line (column) on the basis of the data read out in the first time sensing carry out the second data read-out (sensing operation).

Here, write-in/verification column selection circuit 272 and verification sense amplifier circuit 274 are provided separately from the column selection circuit for data read-out. This is to prevent the collision between the bus that transmits the external read-out data and the bus that transmits the verification data as data reading is performed on one bank while another bank is subject to programming. However, verification sense amplifier circuit 274 and the page buffer may be provided in common to the respective banks with the bus transmitting the verification data and the internally read out data bus being separately provided.

In addition, the page buffer may be arranged for each respective bank or may be arranged in common to a predetermined number of banks. In the case where a page buffer is arranged to be shared by banks, such a configuration may be utilized that an external access to the page buffer is prohibited during the programming operation to a certain bank while read-out of data from another bank is performed.

Figure 34:
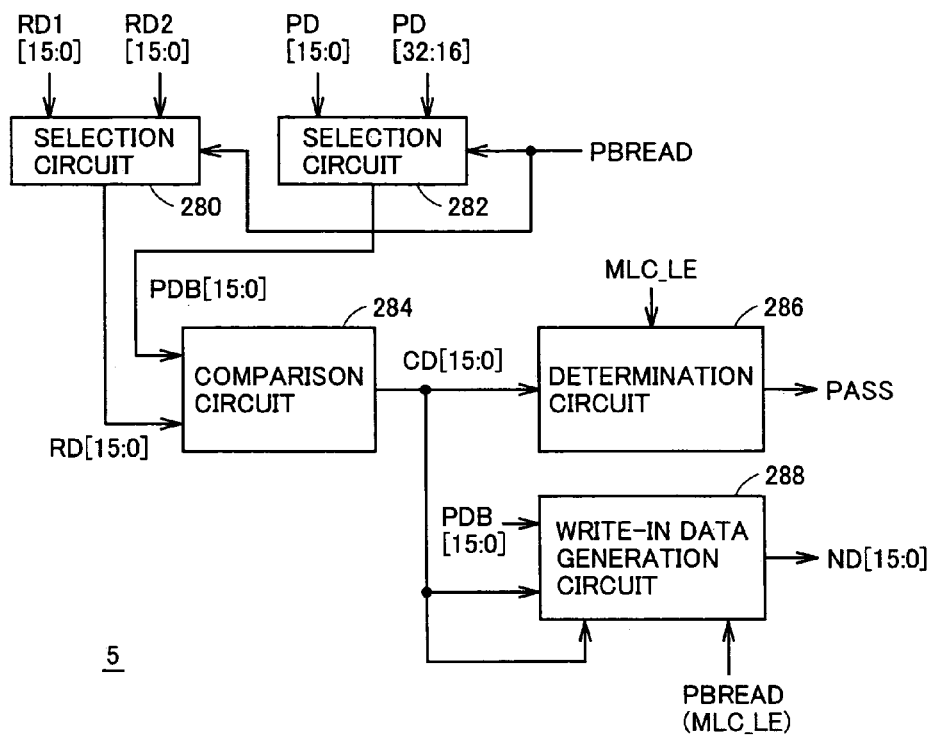
FIG. 34 is a diagram schematically showing the configuration of the verification circuit shown in FIG. 4.

FIG. 34 is a diagram schematically showing the configuration of the verification circuit 5 shown in FIG. 4. In FIG. 34, verification circuit 5 includes: a selection circuit 280 that selects 16-bit data RD1 [15:0] and RD2 [15:2] read out from memory cells in accordance with page buffer read-out control signal PBREAD; a selection circuit 282 that selects data PD [15:0] and PD [32:16] read out in parallel from the page buffer in accordance with page buffer read-out control signal PBREAD; a comparison circuit 284 that compares 16-bit memory cell data RD [15:0] read out from selection circuit 280 with 16-bit page buffer data PDB [15:0] outputted from selection circuit 282 bit by bit; a determination circuit 286 that receives comparison result signal CD [15:0] of 16 bits from comparison circuit 284 to generate verification result signal PASS of one bit indicating the result of write-in pass/failure determination; and a write-in data generation circuit 288 that selects either page buffer data PDBD [15:0] or comparison result signal CD[15:0] in accordance with comparison result signal CD [15:0] from comparison result 284 to generate write-in data ND [15:0] to the page buffer.

Selection circuits 280 and 282 select first time memory cell read-out data RD1 [15:0] when page buffer read-out control signal PBREAD is at the H level and the first sensing operation is performed. Data RD1 [15:0] read out from this memory cell array is the upper bit data in the 2-bit data stored in each memory cell and selection circuit 282 selects upper 16-bit data PD [32:16] from the page buffer in the first time.

Comparison circuit 284 determines whether the memory cell data ranges in the lower side threshold voltage and the upper side threshold voltage in accordance with its internal logic to generate 16-bit signal CD [15:0] indicating the determination result.

Determination circuit 286 latches first comparison result signal CD [15:0] from comparison circuit 284 in accordance with latch instruction signal MLC_LE and determines whether the final 32-bit data is good or defective in accordance with comparison result signal CD [15:0] that is generated in the second time to generate verification result signal PASS.

Write-in data generation circuit 288 latches first comparison result signal CD [15:0] in accordance with page buffer read-out control signal PBREAD (or latch instruction signal MLC_LE) and selects read-out data for the page buffer in accordance with this first determination result. In the case wherein this first comparison result signal indicates failure, the data of the page buffer is not changed with respect to the second verification result (write-in of the verification result data is prohibited). This is done for the following reasons.

Figure 35:
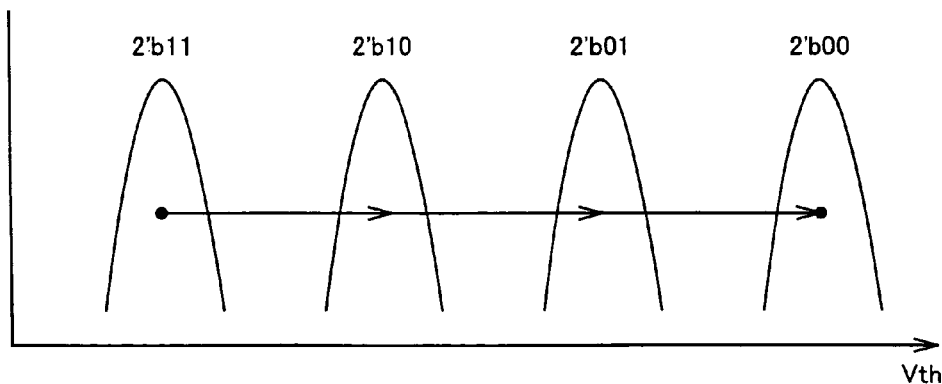
FIG. 35 is a diagram schematically illustrating a conversion sequence of the threshold voltage and the verification operation in the programming operation.

Now, it is considered, as shown in FIG. 35, the operation of over-writing data "00" into a memory cell that stores data "11". In programming operation, the threshold voltage of a memory cell sequentially increases and therefore, the storage data of the memory cell sequentially changes to the states of "11", "10", "01" and "00". The data stored in the page buffer is "00" and this data serves as the expected value data. Accordingly, in the condition where data "11" is stored, the first and second verification operations indicate both the defective state.

In the condition where the memory cell stores data "10", the first verification operation indicates the defective and the second verification operation indicates the good state. In the condition where data "01" is stored, the first verification operation indicates the good state and the second verification operation indicates the defective state. In the condition where data "00" is stored, the first and second verification operations both indicate the good state.

In this verification sequence, when the second verification result indicates the good state in the condition where data "10" is stored, data "10" is converted to data "11" to be stored in the page buffer. In the verification after write-in of data "01" is performed, in the case where the first verification operation indicates the good, the data bit from the page buffer at the time of the second verification is "1", which is determined to be good and the programming operation on this memory cell completes. Accordingly, the state is achieved where data "01" is written in place of data "00" into a write-in memory cell and therefore, there is a possibility that a write-in error may occur. Therefore, only when the first verification is determined to be good, the second verification result is reflected in the storage data of the page buffer. As a result, when a memory cell stores data "10", even when the first verification proves defective and the second verification proves good, the data of the page buffer is prevented from being rewritten and thus, accurate write-in of data is achieved.

Figure 36:
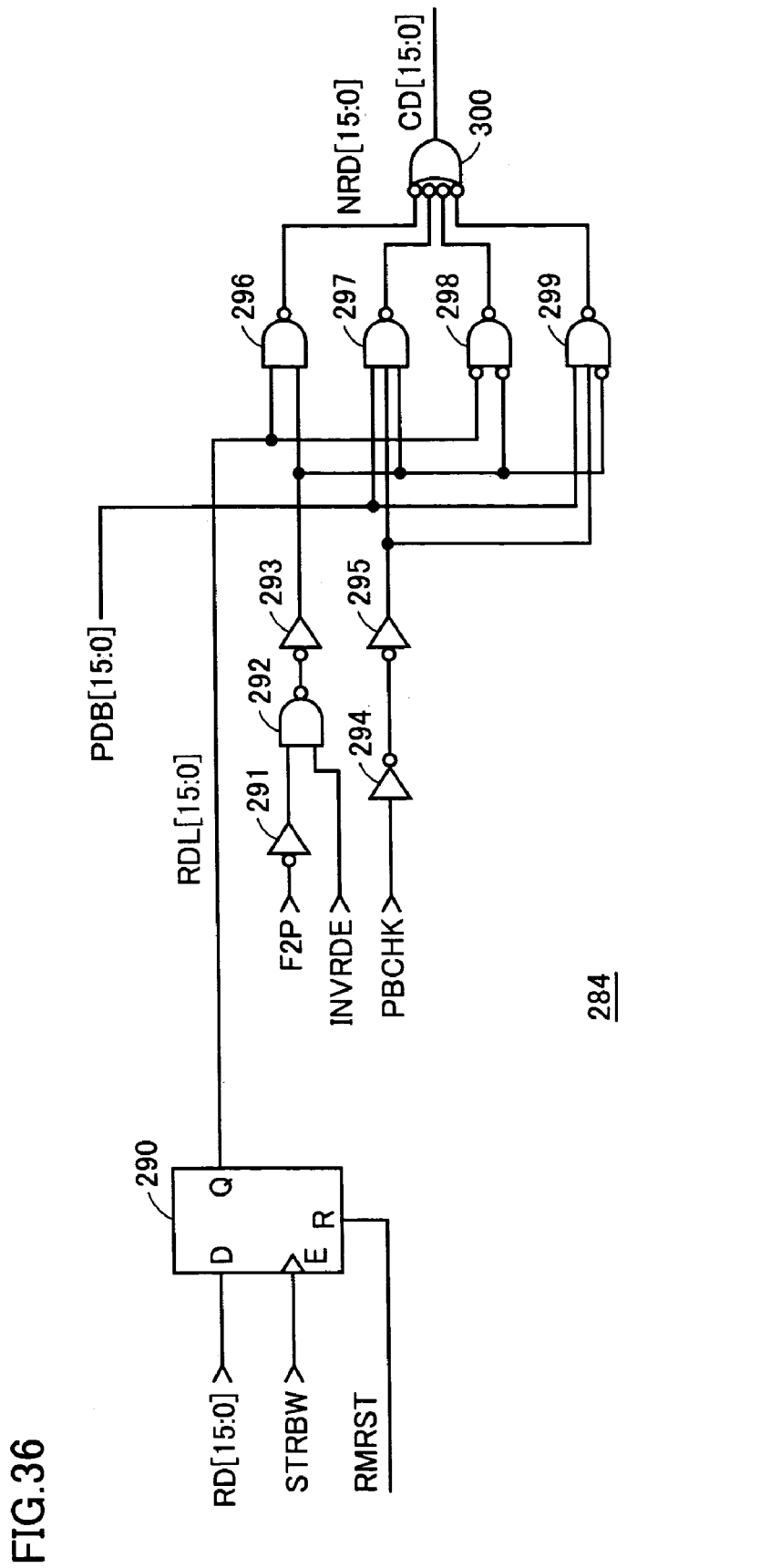
FIG. 36 is a diagram showing an example of the configuration of a comparison circuit shown in FIG. 34.

FIG. 36 is a diagram showing an example of the configuration of comparison circuit 284 shown in FIG. 34. In FIG. 36, comparison circuit 284 includes: a register circuit 290 that takes in and outputs data RD [15:0] read out from memory cells in accordance with strobe control signal STRBW; an inverter 291 that receives page buffer write-in instruction signal F2P; a NAND gate circuit 292 that receives read-out data inversion mode instruction signal INVRTE and an output signal of inverter 291; an inverter 293 that receives an output signal of NAND gate circuit 292; cascaded inverters 294 and 295 of two stages that receive page buffer check control signal PBCHK; a NAND gate circuit 296 that receives data RDL [15:0] from register circuit 290 and the output signal of inverter 293; a NAND gate circuit 297 that receives page buffer read-out data PDB [15:0], the output signal of inverter 295 and the output signal of inverter 293; an OR gate circuit that receives memory cell read-out data RDL [15:0] and the output signal of inverter 293; a gate circuit 299 that receives page buffer read-out data PDB [15:0] as well as the output signals of inverters 293 and 295; and a NAND gate circuit 300 that receives the output signals of these gate circuits 296 to 299 to generate a determination result signal CD [15:0].

These gate circuits 296 to 300 each process the data of 16 bits. Register circuit 290 takes in and outputs data RD [15:0] read out from memory cells when strobe signal STRBW is at the H level, to generate data RDL [15:0]. When the strobe signal STRBW is at the L level, this register circuit 290 is in the latching state.

The types of verification operations include: over-erasure verification mode; program verification mode for fixing the memory cell data at 1; lower side Vth checking mode for checking the threshold voltage of the lower side in the distribution of the threshold voltages of the storage data; and in this verification circuit, page buffer write-in mode for writing data in the page buffer, and the signals F2P, INVRDE and PBCHK as well as control signal PBLOAD not shown are set in accordance with these modes.

Figures 37, 38:
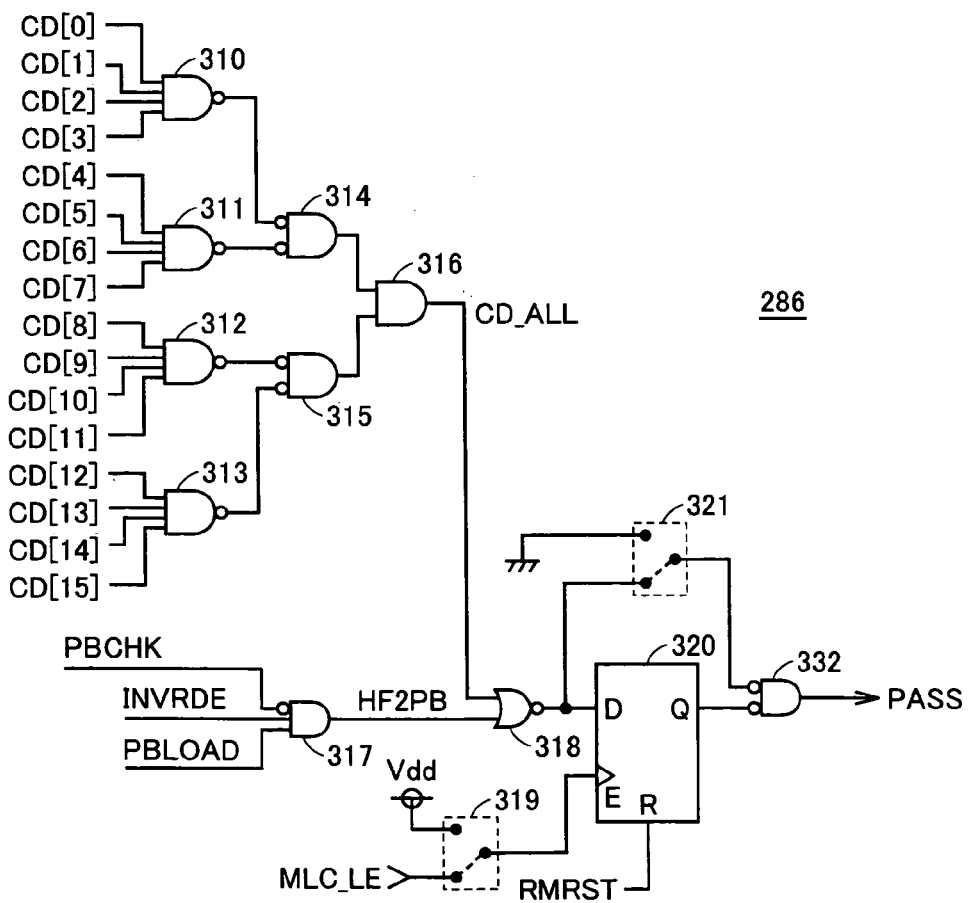
FIG. 37 is a diagram showing the relationship between the operation modes of the comparison circuit shown in FIG. 36 and the control signals in the respective mode.
FIG. 38 is a diagram showing an example of the configuration of a determination circuit shown in FIG. 34.

FIG. 37 is a diagram showing, in a list, the logic levels of mode setting signals INVRDE, PBCHK and PBLOAD shown in FIG. 36 in the verifying modes. In the over-erasure verification mode, page buffer load control signal PBLOAD is set at the L level while read-out data inversion mode instruction signal INVRDE and page buffer check control signal PBCHK are both set at the L level.

In the 0 fixing verification mode of fixing memory cell data at "0", read-out data inversion mode instruction signal INVRDE is set at the-L level and the remaining control signals PBLOAD and PBCHK are set at the H level.

In the lower side Vth checking mode, the signal PBCHK is set at the L level while the remaining control signals PBLOAD and INVRDE are set at the L level.

In the 1 fixing verification mode of fixing the memory cell data at "1", control signal INVRDE is set at the H level while control signals PBLOAD and PBCHK are set at the L level. In the upper side Vth verification mode, the control signals PBLOAD, INVRDE and PBCHK are set at the H level.

In the mode of writing read-out data from the memory cell array or verification result data in the page buffer (PB), the signals PBLOAD and INVRDE are set at the H level while the signal PBCHK is set at the L level. In addition, when page buffer write-in control signal F2P is set at the H level, the data read out from memory cells is stored in the page buffer (PB).

In the verification mode, the word line voltage is set at a predetermined read-out voltage level independent of the threshold voltage in the memory cell array and the comparison reference current is set at the level that corresponds to the threshold voltage of the detection object in the sense amplifier. The state where a current flows through a bit line is the erased state and corresponds to the state where data "1" is stored. On the other hand, when the verification read-out voltage is applied to a word line, data "0" is read out to be made corresponding to the programmed state when the amount of the current that flows through a bit line via a memory cell is smaller than that of the comparison reference current supplied from the sense amplifier.

Here, in the operation of reading out the data from a memory cell in the verification, with a word line being set to a corresponding threshold voltage, memory cell storage data may be read depending on whether the amount of the current flowing through a bit line is greater or smaller than that of the reference current.

In the lower side Vth checking mode, the control signal PBCHK is at the H level while the control signals INVRDE and F2P are at the L level. In this condition, the output signal of inverter 293 is at the L level while the output signal of NAND gate circuit 296 and the output signal of NAND gate circuit 297 are both fixed at the H level. On the other hand, OR gate circuit 298 is enabled to output memory cell data RDL [15:0]. In addition, gate circuit 299 is enabled to invert and output page buffer data PDB [15:0]. When one of the bits at the same position of data RDL [15:0] and PDB [15:0] is at the L level, NAND gate circuit 300 sets the corresponding verification result signal at the H level ("1").

Accordingly, in the lower side Vth verification operation, when a memory cell is correctly programmed, the memory cell is in the state of having a threshold voltage higher than the corresponding lower side threshold voltage, and a large current does not flow and data "0" is read out. On the other hand, gate circuit 299 inverts page buffer data PDB [15:0]. If the verification operation has already been completed and correctly, data "1" is stored as the data of page buffer data PDB [15:0], the corresponding verification result signal CD is at the H level ("1"). Accordingly, when the memory cell data is correctly programmed or when the data read out from the page buffer indicates the verification completion, verification result signal CD [i] (i=0 to 15) is at the H level, and if all 16 bits of the memory cell data are correct, all bits of verification result signal CD [15:0] are "1".

In the upper side Vth verification mode, control signals PBCHK and INVRDE are set at the H level. In this case, control signal F2P is at the L level, the output signal of inverter 293 is at the H level and the output signal of inverter 295 is also at the H level. Thus, NAND gate circuits 296 and 297 are enabled, the output signal of OR gate circuit 298 is at the H level (for all the bits) and the output signal of gate circuit 299 is also fixed at the H level. In this state, if either data PDB [i] read out from the page buffer or the inverted value of memory cell data RDL [i] is "1" (H level), verification result signal CD [i] is at the H level ("1").

In this upper side Vth verification mode, a large current flows through a memory cell correctly programmed and data "1" is read out. Accordingly, when the memory cell data is correctly programmed or when the verification completion is set in the page buffer, the corresponding verification result signal CD [i] is set at "1" (H level).

In the over-erasure verification mode, control signals INVRDE and PBCHK are both at the L level, the verification operation is performed in accordance with the output signal of gate circuit 298, the output signal of logic gate circuit 299 that receives page buffer data PDB [15:0] is fixed at the H level and verification result signal CD [15:0] is generated in accordance with memory cell data RDL[15:0]. In the over-erasure, it is determined whether data "0" is read out when a word line is at the L level. A current flows through a memory cell in the over-erased state so that data "1" is read out, verification result signal CD [i] is at the L level ("0") indicating the over-erased state and rewriting is performed in order to restore the over-erased state to the erased state again.

In the upper side Vth verification, rewriting is performed while narrowing the write-in pulse width to a word line after applying an erasure pulse again if an error is determined.

As described later, the programming operation and the verification operation are performed on the 16 words of memory cells successively and programming and verification are performed in units of 16 words. In other words, even if only one word is erroneously programmed, addresses are generated again for the 16 words so as to carry out programming and verification.

In the 0 fixing verification mode, the conditions of control signals INVRDE and PBCHK are the same as in the lower side Vth checking mode and it is determined whether data "0" is read out from a memory cell.

In the 1 fixing verification mode, the control signal INVRDE is set at the H level and the control signal PBCHK is set at the L level. In this case, the output signals of NAND gate circuit 297 and logic gate circuit 299 are fixed at the L level and the output signal of OR gate circuit 298 is fixed at the L level. Accordingly, it is determined whether data "1" exists in memory cell data RDL [15:0] in accordance with the output signal of NAND gate circuit 296. In this 1 fixing verification, since data "1" (1 bit) is written into a memory cell in accordance with the bit value of page buffer data PDB [15:0], and the corresponding page buffer data PDB [15:0] is set at "1" similarly and therefore, the verification operation is performed by utilizing only the memory cell data.

When control signal F2P is set at the H level, it is indicated that the memory cell data is written in the page buffer and the verification determination result signal is not utilized.

FIG. 38 is a diagram showing an example of the configuration of determination circuit 286 shown in FIG. 34. In FIG. 38, determination circuit 286 includes: NAND gate circuits 310 to 313 each receiving different 4 bits of 16-bit verification determination result signal CD [15:0] from comparison circuit 284 shown in FIG. 36; a NOR gate circuit 314 that receives the output signals of NAND gate circuits 310 and 311; a NOR gate circuit 315 that receives the output signals of NAND gate circuits 312 and 313; and an AND gate circuit 316 that receives the output signals of NOR gate circuits 314 and 315 to generate verification determination signal CD_ALL on 16 bits.

Gate circuits 310 to 316 compress 16-bit verification result signal CD [15:0] to verification determination result signal CD_ALL of 1 bit. When all the bits are "1" in 16-bit verification result signal CD [15:0], 1-bit verification determination result signal CD_ALL is at the H level ("1"). In the case wherein at least 1 bit of the verification result signal of "0" exists, the corresponding output signal of NAND gate circuits 310 to 313 attains the H level and accordingly, verification determination result signal CD_ALL attains the L level.

Determination circuit 286 further includes a gate circuit 317 that receives control signals PBCHK, INVRDE and PBLOAD; a NOR gate circuit 318 that receives output signal BF2PB of gate circuit 317 and verification determination result signal CD_ALL; a metal switch 319 that transmits either power supply voltage Vdd or latching instruction signal MLC_LE; a register circuit 320 that takes in the output signal of NOR gate circuit 318 when the output signal of metal switch 319 is at the H level; a metal switch 321 that selects either the output signal of NOR gate circuit 318 or the ground voltage; and a NOR gate circuit 332 that receives the output signal of metal switch 321 and the output signal of register circuit 320 to generate a final determination result signal PASS.

Gate circuit 317 sets its output signal HF2PB at the H level when control signal PBCHK is at the L level and control signals INVRDE and PBLOAD are at the H level.

Metal switch 319 selects latching instruction signal MLC_LE in the MLC configuration, and metal switch 321 selects the output signal of NOR gate circuit 318 in the MLC configuration. Register circuit 320 resets its storage content in accordance with reset signal RMRST.

Latching instruction signal MLC_LE is kept active for a predetermined period in response to the first sensing operation in data read-out from the memory cell array and during this period of time, register circuit 320 takes in and stores the output signal of NOR gate circuit 318. In the verification operation, either control signal PBLOAD or INVRDE is at the L level or control signal PBCHK is at the H level while output signal HF2PB of logic gate circuit 317 is at the L level and NOR gate circuit 318 operates as an inverter to invert and output verification determination result signal CD_ALL. Accordingly, when verification determination result signal CD_ALL is generated in accordance with the first sense data, this generated verification determination result signal CD_ALL is stored in register circuit 320 in accordance with latching instruction signal MLC_LE. The verification operation is performed again on the data read out in the second sensing operation, so that verification determination result signal CD_ALL is transmitted to NOR gate circuit 332 via metal switch 321 when verification determination result signal CD_ALL is generated.

When the verification determination results of the first-time memory cell data and the second-time memory cell data are both "1" (the signal CD_ALL is inverted in NOR gate circuit 318), final determination signal PASS is set at the H level ("1") in NOR gate circuit 332. In the case where final determination result signal PASS is at the H level and all the 16-word data read out from memory cells are correctly programmed, programming for these 16 words is completed. In the case wherein even at least one erroneously programmed word is present, the programming and verification operation is again performed in the 16 word unit (it is determined whether or not a programming failure exists in the 16 words by resetting flags in accordance with the signal PASS). Such operation is controlled by the CPU.

Here, when output signal HF2PD of logic gate circuit 317 is at the H level, the output signal of NOR gate circuit 318 is fixed at the L level and final determination result signal PASS is fixed at the H level. In this mode, the operation of writing the data read out from memory cells in the page buffer (PB) is performed.

Figure 39:
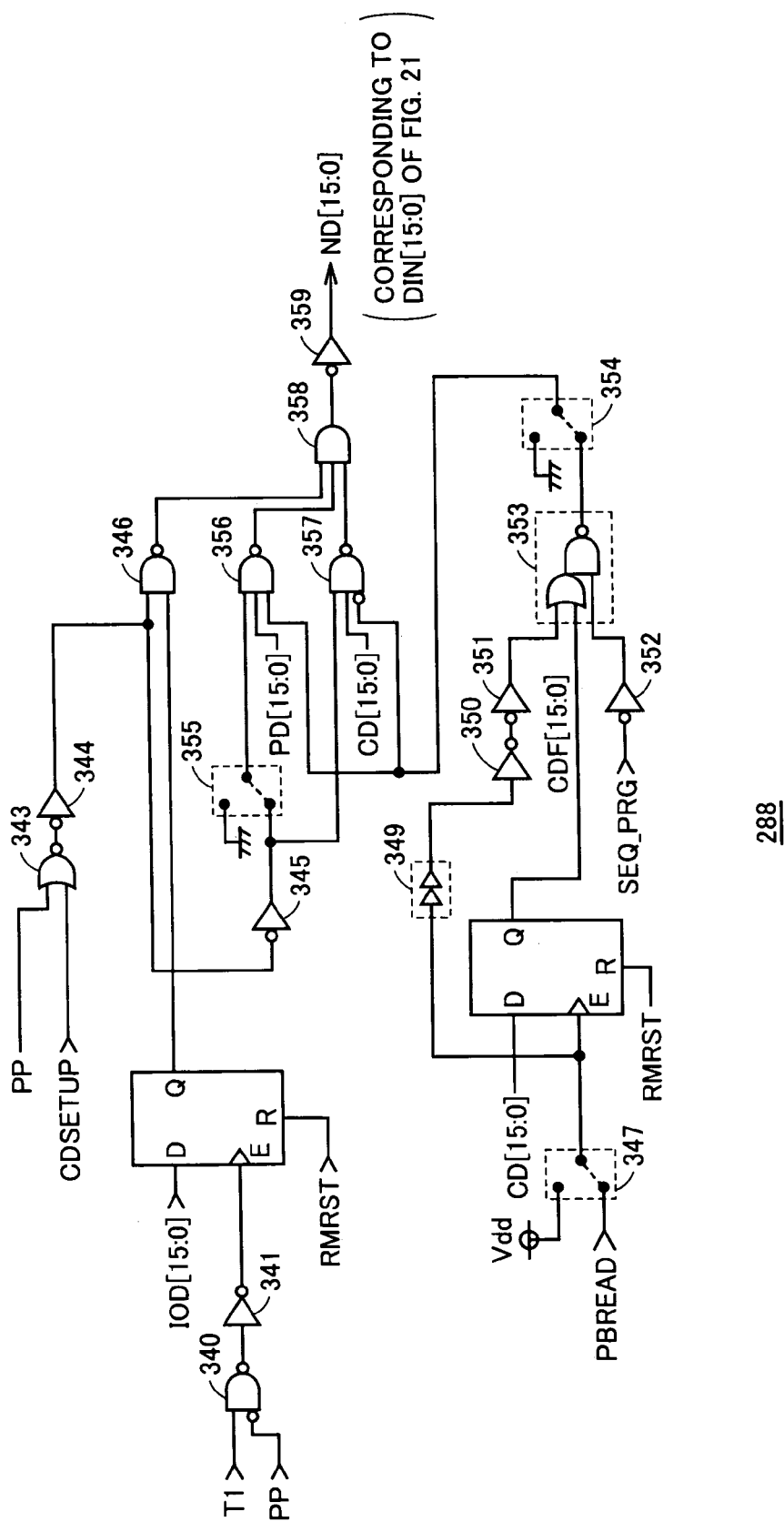
FIG. 39 is a diagram showing an example of the configuration of a write-in data generation circuit shown in FIG. 34.

FIG. 39 is a diagram showing an example of the configuration of write-in data generation circuit 288 shown in FIG.

34. In FIG. 39, write-in data generation circuit 288 includes: a gate circuit 340 that receives internal clock signal P1 and programming mode instruction signal PP; an inverter 341 that receives an output signal of gate circuit 340; a register circuit 342 that takes in external input data IOD [15:0] in accordance with an output signal of inverter 341; a NOR gate circuit 343 that receives programming mode instruction signal PP and data setup instruction signal CDSETUP; an inverter 344 that receives an output signal of NOR gate circuit 343; an inverter 345 that receives an output signal of inverter 344; a NAND gate circuit 346 that receives the output signal of inverter 344 and the output signal of register circuit 342; a metal switch 347 that selects either power supply voltage Vdd or page buffer read-out control signal PBREAD; a register circuit 348 that takes in verification result signal CD [15:0] when the output signal of metal switch 347 is at the H level; a delay circuit 349 that delays the output signal of metal switch 347; cascaded inverters 350 and 351 of two stages that further delay an output signal of delay circuit 349; an inverter 352 that receives program sequence control signal SEC_PRG; a composite logic gate circuit 353 that receives the output signal of register circuit 348 and the output signals of inverters 351 and 352; a metal switch 354 that selects either the output signal of composite logic gate circuit 353 or the ground voltage; a metal switch 355 that selects either the output signal of inverter 345 or the ground voltage; a NAND gate circuit 356 that receives the output signal of metal switch 354, page buffer data PD [15:0] and the output signal of metal switch 355; a logic gate circuit 357 that receives the output signal of metal switch circuit 354, the output signal of inverter 345 and Verification result signal CD [15:0]; an AND gate circuit 358 that receives the output signals of NAND gate circuits 346 and 356 as well as logic gate circuit 357; and an inverter 359 that inverts the output signal of AND gate circuit 358 to generate page buffer write-in data ND [15:0].

Composite logic gate circuit 353 equivalently includes: an OR gate circuit that receives the output signal of inverter 351 and output data CDF [15:0] of register circuit 348; and the output signal of this OR gate circuit and the output signal of inverter 352.

Logic gate circuit 357 is enabled when the output signal of metal switch 354 is at the L level, to select and invert verification result signal CD [15:0] when the output signal of inverter 345 is at the H level. Logic gate circuit 357 outputs a signal at the H level when the output signal of metal switch 354 is at the H level.

Metal switch 347 selects page buffer read-out control signal PBREAD in the MLC configuration and metal switch 354 selects the output signal of composite logic gate circuit 353 in the MLC configuration. Metal switch 355 selects the output signal of inverter 345 in the MLC configuration.

Data setup instruction signal CDSETUP is set at the L level when data setup (write-in of 32-word data) is performed on the page buffer. Programming mode instruction signal PP is set at the H level in the programming mode including the verification operation. When programming mode instruction signal PP is at the L level, register circuit 342 takes in and outputs external input data IOD [15:0] in accordance with internal clock signal T1. Here, internal clock signal T1 is a clock signal that is generated in accordance with an externally applied control signal in accessing to this nonvolatile semiconductor memory device and determines the input cycle of external data. In the case where data setup is not performed on the page buffer and the programming mode is also not set, the output signal of inverter 344 is at the H level and data from register circuit 342 is inverted and transmitted via NAND gate circuit 346.

On the other hand, in the programming mode, register circuit 348 takes in verification result signal CD [15:0] in accordance with page buffer read-out control signal PBREAD, to generate first verification result signal CDF [15:0]. Register circuit 348 enters the latching state when page buffer read-out control signal PBREAD is at the L level. Accordingly, a signal indicating the verification result of the memory cell data read out in the first sensing operation is outputted from this register circuit 348.

Program sequence instruction signal SEQ_PRG is set at the L level in the programming verification operation and is set at the H level in the programming operation. Accordingly, in the programming operation, the output signal of the inverter 352 is at the H level and the output signal of composite logic gate circuit 353 is at the H level when page buffer read-out control signal PBREAD is at the H level. On the other hand, when page buffer read-out control signal PREAD is at the L level and the verification result on the second read-out data from memory cells is indicated, the logic level of the output signal of this composite logic gate circuit 353 is set in accordance with output data CDF [15:0] of register circuit 348.

In the verification operation, programming mode instruction signal PP and data setup instruction signal CDSETUP are at the L level, the output signal of NOR gate circuit 343 is at the H level, the output signal of inverter 344 is at the L level and the output signal of inverter 345 is at the H level. Accordingly, all the bits of the output signal of NAND gate circuit 346 are set at the H level. As for a result of the verification of the memory cell data read out in the first sensing operation, page buffer read-out control signal PBREAD is at the H level and the output signal of composite logic gate circuit 353 is at the L level and therefore, the output signal of gate circuit 357 is set in accordance with verification result signal CD [15:0] while the output signal of NAND gate circuit 356 is set at the H level. Accordingly, this first verification result signal CD [15:0] is selected as write-in data ND [15:0] to the page buffer.

On the other hand, in the second verification operation, when first verification result signal CDF [i] is "0" indicating a verification failure and the output signal of composite logic gate circuit 353 is at the H level ("1"), page buffer data PD [i] is selected. On the other hand, when first verification result signal CDF [i] indicates the correct verification and is data "1", the output signal of composite logic gate circuit 353 attains the L level ("0"), and verification result signal CD [i] is selected.

Accordingly, in the second sensing operation, in write-in data ND [15:0], data is set to "1", in accordance with the verification result signal, for a memory cell determined to be non-defective based on the verification, and for the memory cell determined to be defective based on the verification, data previously read out is again stored to prohibit the rewriting of corresponding storage data of the page buffer.

As a result, a problem of a programming error due to the erroneous determination in the verification can be prevented from occurring.

When the output signal of inverter 344 is at the H level and the output signal of inverter 345 is at the L level, the output signals of NAND gate circuit 356 and logic gate circuit 357 are at the H level, and write-in data ND [15:0] is generated in accordance with input data IOD [15:0]. Thus, external data can be written in the page buffer.

Here, this page buffer write-in data ND [15:0] may be configured to be supplied to register circuit 178 shown in FIG. 21 in the mode of selecting externally applied input data IOD [15:0] and to be assigned to write-in data DIN [15:0] and DIN [31:16] to the page buffer in the programming verification.

Although it is not clearly shown in FIG. 21, a selection circuit for selecting write-in data ND [15:0] in place of write-in data DIN [15:0] and DIN [31:16] shown in FIG. 21 is provided in this programming verification mode. This selection circuit has its selection path set in accordance with, for example, programming mode instruction signal PP. Alternatively, the selection circuit selects either external write-in data after the bit position conversion or write-in data from the verification circuit in accordance with data setup signal CDSETUP for transmission to the page buffer. Write-in-data ND [15:0] corresponds to write-in data DIN [15:0] after the bit position conversion to the page buffer shown in FIG. 21 and first write-in data ND [15:0] and second write-in data ND [15:0] are stored as the lower and upper data, respectively.

In addition, programming mode instruction signal PP and program sequence control signal SEQ_PRG are activated under the control of the CPU in the programming mode.

Figure 40:
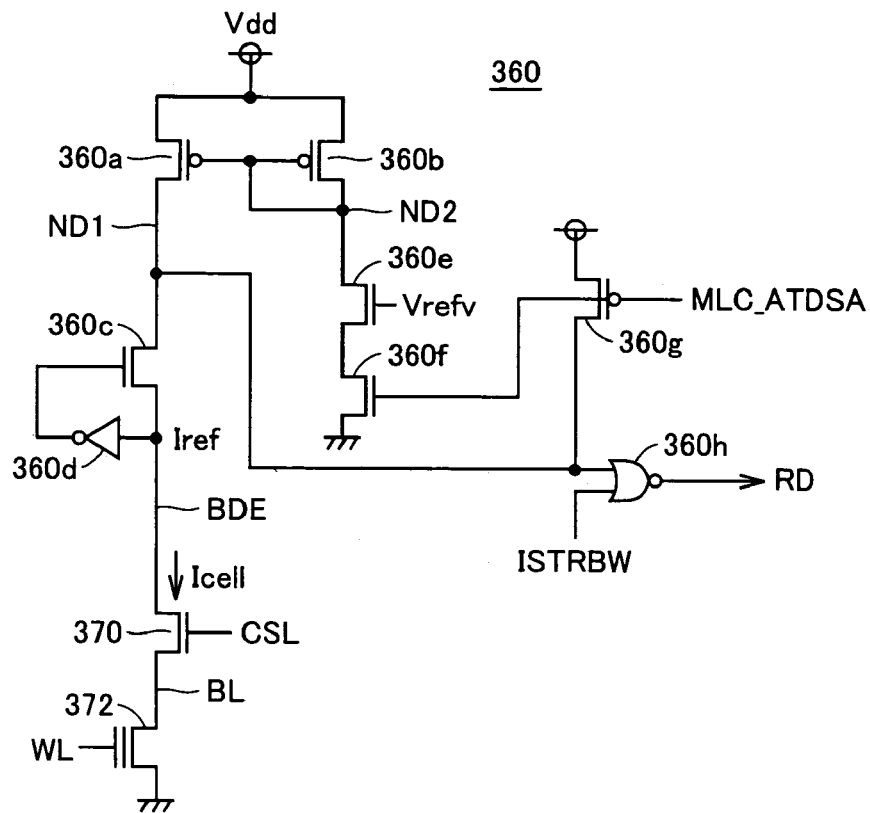
FIG. 40 is a diagram showing an example of the configuration of a verification sense amplifier.

FIG. 40 is a diagram showing an example of the configuration of verification sense amplifier 360. FIG. 40 shows the configuration of verification sense amplifier 360 for one memory cell. Since 16-bit data is read out, verification sense amplifier 360 shown in this FIG. 40 is arranged by 16 bits.

In FIG. 40, verification sense amplifier 360 includes: a P-channel MOS transistor 360a which is connected between the power supply node and internal node ND1 and has a gate connected to internal node ND2; a P-channel MOS transistor 360b which is connected between the power supply node and internal node ND2 and has a gate connected to internal node ND2; a NAND gate circuit 360d that receives a signal from verification data read-out line BDE and delayed sense amplifier activation signal MLC_ATDSA; an N-channel MOS transistor 360c that selectively connect node ND1 to verification data read-out line BDE in accordance with an output signal of NAND gate circuit 360d; and N-channel MOS transistors 360e and 360f which are connected in series between internal node ND2 and the ground node. A bias voltage Vrefv is supplied to the gate of MOS transistor 306e and sense amplifier activation signal MLC_ATDSA is applied to the gate of MOS transistor 360f.

Verification sense amplifier 360 further includes: an inverter 360d that inverts the voltage on verification read-out data line BDE for application to the gate of MOS transistor 360c; a P-channel MOS transistor 360g that precharges internal node ND1 to the power supply voltage level in accordance with sense amplifier activation signal MLC_ATDSA; and a NOR gate circuit 360h that receives strobe control signal ISTRBW and the signal from internal node ND1 to generate read-out data RD.

In the memory cell array, there are provided a verification column selection gate 370 selectively made conductive in accordance with verification column selection signal CSL, and a memory cell transistor 372 that is connected between bit line BL and the ground node and has a gate connected to word line WL. The memory cell transistor 372 has a floating gate and has the threshold voltage set in accordance with the amount of the charges stored in this floating gate.

Figure 41:
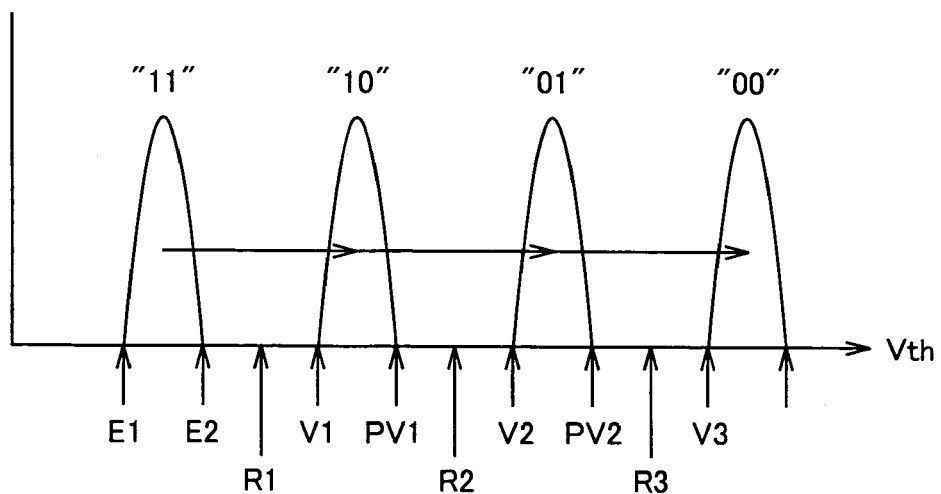
FIG. 41 is a diagram showing the reference voltage required in the verification operation.

FIG. 41 is a diagram showing the relationship between the threshold voltage of this memory cell 372 and the reference voltages generated for each region of storage data. The threshold voltage region of the memory cell that stores data "11" is determined by lower side threshold voltage E1 and upper side threshold voltage E2. The threshold voltage region of the memory cell that stores data "10" is determined by lower side threshold voltage V1 and upper side threshold voltage PV1. The threshold voltage region for storing data "01" is determined by lower side threshold voltage V2 and upper side threshold voltage PV2. Only lower side threshold voltage V3 is set for the threshold voltage region of the memory cell that stores data "00."

In the memory cell read-out, read-out voltages R1, R2 and R3 are set as reference voltages with margins for boundary regions of the threshold voltage regions of data, respectively.

Figure 42:
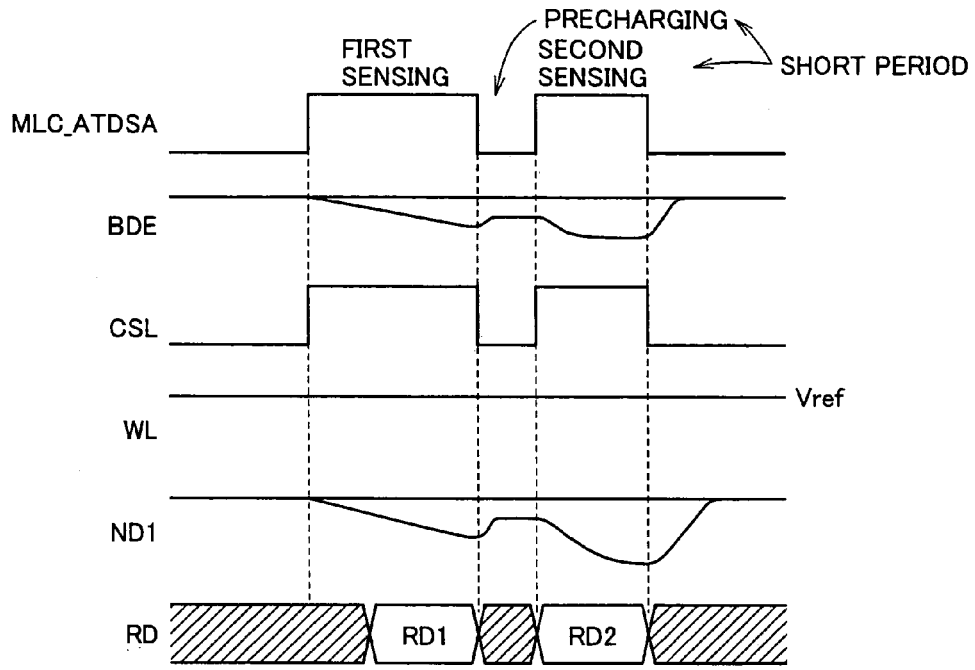
FIG. 42 is a signal waveform diagram representing an operation of a verification sense amplifier shown in FIG. 40.

FIG. 42 is a timing chart representing an operation of verification sense amplifier 360 shown in FIG. 40. In the following, the operation of this verification sense amplifier 360 is briefly described with reference to FIG. 42.

When sense amplifier activation signal MLC_ATDSA is at the L level, MOS transistor 360g is in the conductive state, and internal node ND1 is precharged to the power supply voltage level. In this state, verification read-out data line BDE is also at the L level while the output signal of inverter 360d is at a high level and MOS transistor 360c is in the conductive state so that verification data read-out line BDE is also precharged by the precharging MOS transistor 360e similarly. Under such condition, the voltage level of the output signal of inverter 360d lowers when the voltage level of verification data read-out line BDE increases, and MOS transistor 360c has the conductance reduced to suppress the increase of the voltage level of verification read-out data line BDE. Accordingly, MOS transistor 360c operates in the source follower mode and maintains the voltage level of verification read-out data line BDE at an intermediate voltage level.

In accordance with the output signal of inverter 360d, MOS transistor 360c operates in the source follower mode to prevent the bit line voltage from rising. As a result, channel hot electrons due to a drain high electrical field in the memory cell are prevented from generating at the time of data reading out in the verification.

The sensing operation period is set by complementary strobe control signal ISTRBW. Here, the signals ISTRBW and STRBW are signals complementary to each other. A complementary signal indicates a signal that is activated when set at the logic low level (L level). When sense amplifier activation signal MLC_ATDSA is activated, MOS transistor 360g turns non-conductive so that precharging of internal node ND1 is completed and precharging of verification read-out data line BDE is also completed.

In the sensing operation, in parallel, verification column selection signal CSL is also driven to the selected state so that bit line BL connected to a selected memory cell and verification data read-out line BDE are electrically coupled. The read-out voltages in the verification are set to word line WL in accordance with the respective operation modes. The voltage level of reference voltage Vrefv is set in accordance with the word line voltage.

When MOS transistor 360f is made conductive in accordance with the activation of sense amplifier activation signal MLC_ATDSA, currents flow through MOS transistors 360b, 360e and 360f. The mirror current of the current that flows through this MOS transistor 360b flows through MOS transistor 360a and is supplied to verification data read-out line BDE via MOS transistor 360c as reference current Iref. In this state, the output signal of inverter 360d is at a high level so that MOS transistor 360c is in the conductive state.

Cell current Icell flows in accordance with the storage data of the memory cell. In the case where this cell current Icell is greater than reference current Iref, the voltage level of verification data read-out line BDE lowers so that the output signal of the inverter attains the H level and MOS transistor 360c is set in the deeply conductive state. Responsively, the voltage level of node ND1 lowers so that output signal RD of NOR gate circuit 360h is set to the state ("1") corresponding to the voltage level (L level) of the node ND1.

In the case where reference current Iref is greater than cell current Icell, the voltage level of verification data read-out line BDE does not lower so that the output signal of inverter 360d lowers below the voltage level in the precharged stare and node ND1 is charged by this reference current Iref and maintains the precharged state substantially at the H level. Accordingly, in this case, the output signal of NOR circuit 360h attains the L level. As a result, first-time read-out of data of the memory cell is performed.

In the verification operation, the voltage level (Vref) of word line is changed in accordance with the program data for the first and second sensing operations and accordingly, the voltage level of reference voltage Vrefv is also varied. In this case, in the verification operation, the word line voltage may be fixed at the read-out voltage level as in the normal data read out and the voltage level of reference voltage Vrefv may be set in accordance with the data of the result of the first sensing operation. Either scheme can be used for the setting of the word line voltage level in this verification operation. In either scheme, the sensing operation is performed on the basis of the comparison of reference current Iref with cell current Icell. FIG. 42 shows the condition where verification read-out voltage of word line WL is fixed at reference voltage Vref. The voltage level of reference voltage Vref may be changed in accordance with each sensing operation.

In the case where the word line verification voltage is changed in accordance with the threshold voltage of the program data, reference voltage Vrefv is also changed similarly and therefore, the relationship between cell current Icell and reference current Iref at the first sensing operation are the same as at the second sensing operation. Even in the case where the precharging period between the first sensing operation and the second sensing operation is short, the change in the read-out voltage of bit line BL is small and a voltage change from the precharged voltage level is also small. Therefore, even in the case where the precharging period at the time of the second sensing is short, the second sensing operation can be performed by accurately precharging bit line BL to the read-out voltage level.

Figure 46:
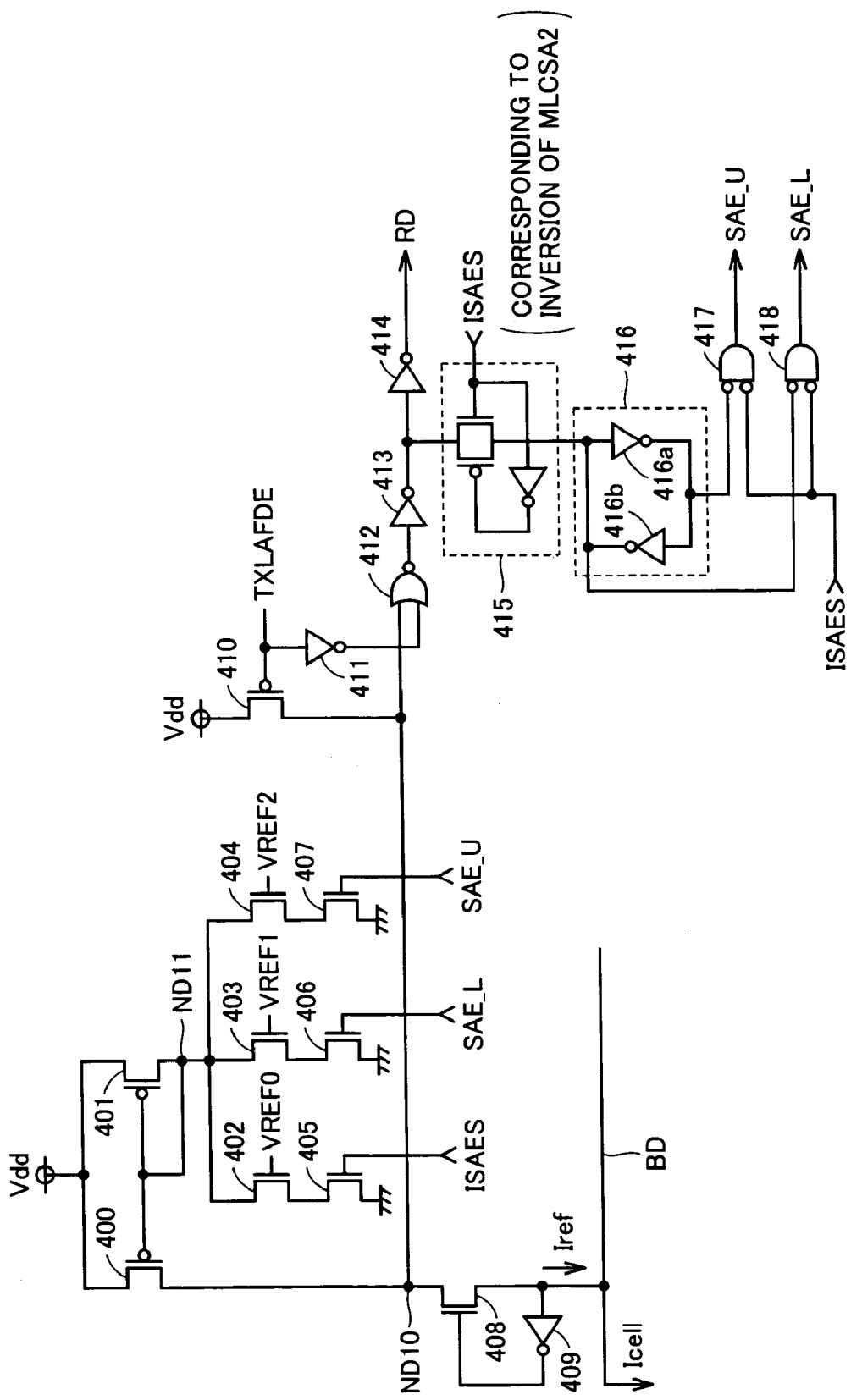
FIG. 46 is a diagram showing another modification of the verification sense amplifier.

In addition, as shown in FIG. 46, in the second sensing operation, even if the voltage level of verification data read-out data line BDE differs from the precharged voltage level or is at a level of an insufficient precharged voltage (case where the voltage level lowers), the voltage level of internal verification data read-out data line BDE further changes in a direction of lowering of the voltage level and therefore, the sensing operation can be sufficiently performed even in the case where the activation period of sense amplifier activation signal MLC_ATDSA is short. Thus, even in the case where the precharging period of internal node ND1 is short, the verification operation can be performed accurately and an accurate sensing operation can be performed in the second sensing operation.

In the verification operation, the voltage level of bias voltage Vrefv is set under the control of the CPU.

As a memory cell data reading out scheme in verification, such procedure may be employed that the word line voltage is be fixed at the voltage level higher than the maximum threshold voltage of the memory cell, and reference voltages Vrefv is set at the voltage levels corresponding to the upper side threshold voltage and the lower side threshold voltage of the threshold voltage region of the verification object. They may be switched between the first sensing operation and the second sensing operation. Even in this case, the change in the voltage level of internal verification data read-out line BDE is small and therefore, the sensing operation can be performed in a sufficiently precise manner. However, in this case, cell current Icell is decreased as the threshold voltage of the memory cell is increased and therefore, it is necessary to set the reference voltage for the reference current Iref such that reference current Iref is also decreased as the threshold voltage is increased.

First Modification of Verification Sense Amplifier

Figure 43:
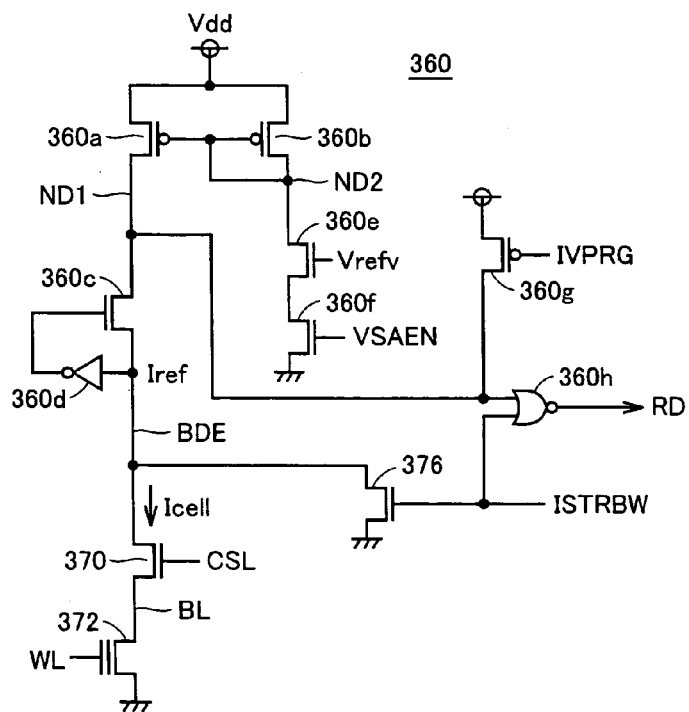
FIG. 43 is a diagram schematically showing the configuration of another verification sense amplifier.

FIG. 43 is a diagrams schematically showing the configuration of a first modification of the verification sense amplifier. In the configuration of a verification sense amplifier 360 shown in this FIG. 43, a verification sense precharging signal VPRG is supplied to the gate of MOS transistor 360G for precharging internal node ND1 and a verification sense amplifier enabling signal VSAEN is supplied to the gate of MOS transistor 360f that activates the sensing operation.

An N-channel MOS transistor 376 selectively rendered conductive in response to the output signal of inverter 375 that receives complementary strobe timing control signal ISTRBW is provided to verification read-out data line BDE. MOS transistor 376 precharges verification read-out data line BDE to the ground voltage level when made conductive. The other configuration of verification sense amplifier 360 shown in this FIG. 43 is the same as the configuration of the verification sense amplifier shown in FIG. 40, and the same reference numerals are attached to the corresponding components, and the detailed description thereof will not be repeated.

Figure 44:
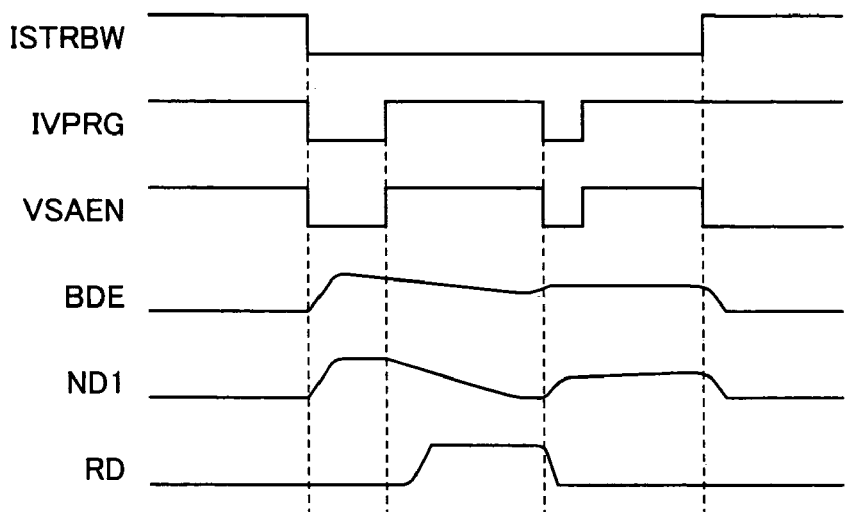
FIG. 44 is a signal waveform diagram representing a showing the signal wave operation of a verification sense amplifier shown in FIG. 43.

FIG. 44 is a timing chart representing an operation of verification sense amplifier 360 shown in FIG. 43. In the following, the operation of the verification sense amplifier shown in FIG. 43 is described in reference to FIG. 44.

Complementary strobe timing control signal ISTRBW is an inverted signal of strobe control signal STRBW and determines the sensing operation period. When the sense amplifier operates, complementary strobe timing control signal ISTRBW makes transition from the H level to the L level. When the precharging operation by MOS transistor 376 on verification read-out data line BDE is completed, verification data read-out data line BDE attains the floating state at the ground voltage level.

When complementary strobe timing signal ISTRBW attains the L level, precharging instruction signal IBPRG is set at the L level for a predetermined period and internal node ND1 is precharged by MOS transistor 360g. In the precharging operation, MOS transistor 360c is in the conductive state in accordance with the output signal of inverter 360d and operates in the source follower mode and therefore verification read-out data line BDE is also precharged to an intermediate voltage level.

When this precharging operation is completed, verification sense amplifier activation signal VSAEN is activated (at the H level), so that reference current Iref determined by reference voltage Vrefv flows onto verification read-out data line BDE. At this time, as in the timing shown in FIG. 42, in the activation of the sense amplifier, column selection signal CSL rises to the H level and cell current Icell flows into bit line BL. If cell current Icell that is driven by the memory cell 372 is greater than reference current Iref, the voltage level of verification read-out data line BDE lowers and the voltage level of internal node ND1 having a small load capacitance drops rapidly. Read-out data RD from NOR gate circuit 360h attains the H level in accordance with the drop of the voltage level of internal node ND1 and thus data "1" is read out.

Subsequently, when the sense amplifier activation signal VSAEN is deactivated, precharging instruction signal IVPRG attains the L level at the same time, and the precharging of internal node ND1 is performed. At this time, the activated period of precharging instruction signal IVPRG is shorter than the activated period in the first time and therefore the voltage levels of verification read-out data line BDE and internal node ND1 are not completely recovered to the power supply voltage level, but are maintained at an intermediate voltage level. When the precharging operation is completed, verification sense amplifier activation signal VSAEN is again activated and a corresponding reference current Iref is supplied. When reference current Iref is larger than cell current Icell, the voltage level of internal node ND1 rises so that data "0" is read out as data RD.

The voltage level of verification read-out data line BDE in the precharged state is an intermediate voltage level and the output signal of inverter 360d is at the H level or at an intermediate voltage level so that MOS transistor 360c maintains the conductive state.

When this sensing operation is completed, complementary strobe timing control signal ISTRBW attains H level and verification sense amplifier activation signal VSAEN is deactivated so that precharging of verification read-out data line BDE to the ground voltage level is again performed. Precharging instruction signal IVPRG is at the H level and internal node ND1 is precharged to the ground voltage level via MOS transistor 360c (the output signal of inverter 360d is at the H level).

Even in the case where the second precharging period is shorter than the first precharging period, the change in the voltage level of verification read-out data line BDE is still small due to the cell current in the memory cell selection, and therefore verification-read-out data line BDE is sufficiently precharged to a level in the vicinity of a predetermined voltage level even when this second precharging period is short.

Figure 45:
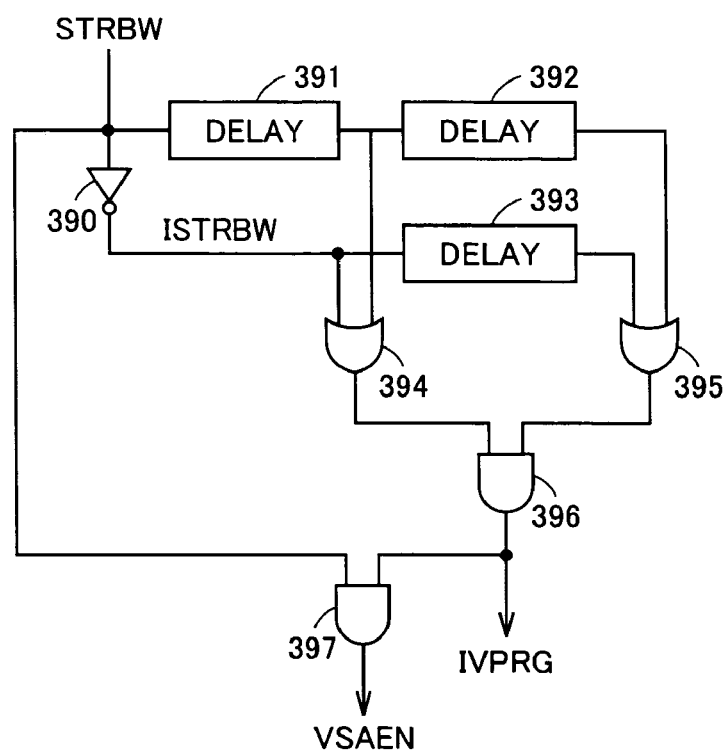
FIG. 45 is a diagram showing an example of the configuration of the part that generates a sense control signal for the verification sense amplifier shown in FIG. 43.

FIG. 45 is a diagram showing an example of the configuration of the part that generates the control signals to the verification sense amplifier shown in FIG. 43. In FIG. 45, the verification sense amplifier control signal generation circuit includes: an inverter 390 that receives strobe timing control signal STRBW; a delay circuit 391 that delays strobe timing control signal STRBW by a predetermined period of time; a delay circuit 392 that further delays the output signal of delay circuit 391; a delay circuit 393 that delays the output signal of inverter 390; an OR circuit that receives output signal ISTRBW of inverter 390 and the output signal of delay circuit 391; an OR circuit 395 that receives the output signals of delay circuits 392 and 393; an AND circuit 396 that receives the output signals of OR circuits 394 and 395 to generate precharge control signal IVPRG; and an AND circuit 397 that receives strobe timing control signal STRBW and the output signal of AND circuit 396 to generate verification sense enable signal VSAEN.

The first precharging period is determined by the delay time set by delay circuit 391 and the second precharging period is determined by delay circuits 392 and 393. The first sensing period is determined by delay circuit 392 and the second sensing period is determined by the output signal of delay circuit 392 and strobe timing control signal STRBW.

In the sensing operation, strobe timing control signal STRBW is at the H level, AND circuit 397 operates as a buffer circuit, and generates verification sense enable signal VSAEN in accordance with precharging instruction signal IVPRG. As a result, the verification sensing operation can be achieved in which the second precharging period and the second sensing period are shorter than the first precharging period and the first sensing period, respectively.

Second Modification of Verification Sense Amplifier

FIG. 46 is a diagram showing the configuration of a second modification of the verification sense amplifier. In FIG. 46, the verification sense amplifier includes: a P-channel MOS transistor 400 which is connected between the power supply node and node ND10 and has a gate connected to node ND11; a P-channel MOS transistor 401 which is connected between the power supply node and node ND11 and has a gate connected to nod eND11; N-channel MOS transistors 402, 403 and 404 which are coupled to node ND11 and have the respective gates receiving reference voltages VREF0, VREF1 and VREF2; and N-channel MOS transistor 405, 406 and 407 which are respectively connected between MOS transistors 402 to 404 and the ground node. Activation signals ISAES, SAE_L and SAE_U are supplied to the gates of N-channel MOS transistor 405, 406 and 407, respectively.

The verification sense amplifier further includes: a P-channel MOS transistor 410 which receives, at a gate, sense activation signal TXLATDE and precharges node ND10 to the level of power supply voltage Vdd when made conductive; a NOR gate circuit 412 that receives the output signal of inverter 411 and the signal from node ND10; an inverter 413 that receives the output signal of NOR gate circuit 412; an inverter 414 that inverts an output signal of inverter 413 to generate internal read-out data RD; a transfer gate circuit 415 that is rendered conductive when complementary second sense enable signal ISAES is inactive (H level), to transmit the output signal of inverter 413; an inverter latch circuit 416 for latching an output signal of inverter 413 transmitted via transfer gate circuit 415; a NOR gate circuit 417 that receives the latch signal of inverter latch circuit 416 and complementary second sense enable signal ISAES to activate upper sense enable signal SAE_U; and a NOR gate circuit 418 that generates lower sense enable signal SAE_L in accordance with complementary second sense enable signal ISAES and the latch data of inverter latch circuit 416.

Inverter latch circuit 416 includes: an inverter 416a that receives the output signal of inverter 413 via transfer gate circuit 415; and an inverter 416b that inverts the output signal of this inverter 416a for transmission to the input of inverter 416a. The output signal of inverter 416a is supplied to NOR gate circuit 417 and the output signal of inverter 416b is supplied to NOR gate circuit 418.

The verification sense amplifier further includes: an N-channel MOS transistor 408 which is connected between node ND10 and verification data transmission line BD; and an inverter 409 that inverts and amplifies the signal from verification data transmission line BD for transmission to the gate of MOS transistor 408. Inverter 409 lowers the gate voltage level of MOS transistor 408 when the voltage level of internal data line BD rises, to prevent the voltage level of this verification data transmission line BD from rising to the level of power supply voltage Vdd. As a result, the bit line voltage is prevented from rising when a read-out current is supplied to the bit line, to prevent channel hot electrons from being generated and injected into floating gate of a memory cell transistor (soft program) in the verification read-out.

Sense amplifier activation signal TXLATDE is activated at the time of data read-out of a memory cell in the verification and in when the data accessing and is a signal equivalent to the sense amplifier activation signal ATDSA in the verification.

Figure 47:
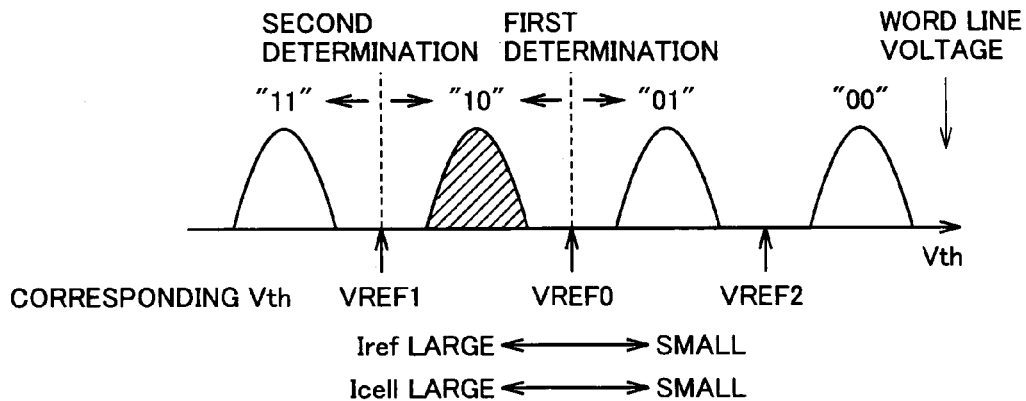
FIG. 47 is a diagram illustrating the reference voltages utilized in the verification sense amplifier shown in FIG. 46.
Figure 48:
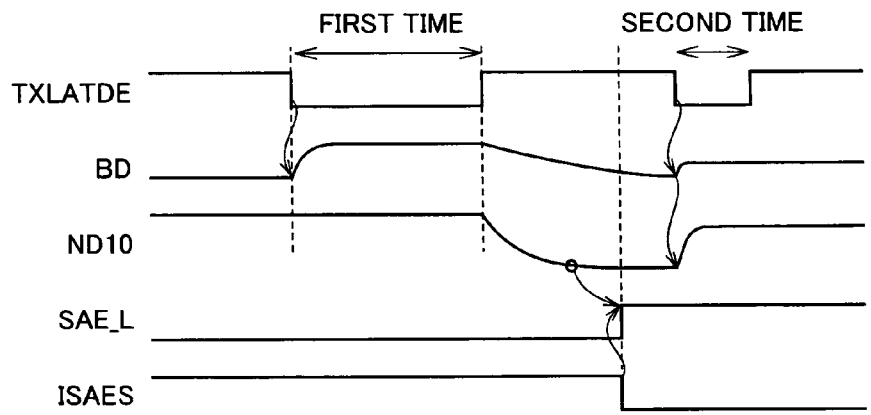
FIG. 48 is a signal waveform diagram representing an operation of a verification sense amplifier shown in FIG. 46.

The operation of the verification sense amplifier shown in this FIG. 46 in the data read-out is described with reference to FIGS. 47 and 48. Here, as shown in FIG. 47, a case is considered where storage data "10" of a memory cell is read out. In a normal data read-out, a voltage higher than any of the distributed threshold voltages of the memory cells is applied to a word line of memory cells so that all the memory cells are set to the conductive state. The amount of the drive current differs for different threshold voltage of a memory cell. The higher the threshold voltage is, the smaller is the amount of the drive current of a memory cell.

In the verification sense amplifier shown in FIG. 46, node ND10 is first precharged to the power supply voltage level by MOS transistor 410 before the start of the sensing operation. Verification read-out data transmission line BD is precharged to a predetermined voltage level (set by the voltage limiting function of MOS transistor 408). When this precharging operation is completed, second sense enable signal ISAES is at the H level and therefore upper sense enable signal SAE_U and lower sense enable signal SAE_L from NOR gate circuits 416 and 418 are both at the L level. Accordingly, MOS transistor 405 is made conductive to generate reference current Iref in accordance with reference voltage VREF0. This reference voltage VREF0 is set at the voltage level intermediate the threshold voltages. The threshold voltage of the memory cell is lower than this reference voltage VREF0 and therefore cell current Icell is larger than reference current Iref and the voltage level of verification read-out data transmission line BD is lowered and responsively, the voltage level of node ND10 also lowers. Complementary second sense enable signal ISAES is at the H level and therefore transfer gate circuit 415 is in the conductive state and the signal at the L level from inverter 413 is latched by inverter latch circuit 416.

When the first sensing operation is completed, complementary second sense enable signal ISAES falls to the L level, and responsively the lower sense enable signal SAE_L from NOR gate circuit 418 rises to the H-level. At this time, even if the first sensing operation and the second precharging operation are performed, transfer gate circuit 415 is in the non-conductive state, and therefore the latch data of this latch circuit 416 is not adversely affected. However, this complementary second sense enable signal ISAES may be driven to the L level in synchronization with the timing of the start of the second precharging operation so as to switch the reference voltages (here, it is necessary to adjust the timing such that the latch data of latch circuit 416 is not adversely affected by the second precharging operation).

MOS transistor 406 is made conductive by the lower sense enable signal SAE_L, to generate reference current Iref in accordance with reference voltage VREF1. This reference current Iref corresponds to the threshold voltage level that is lower than the threshold voltage of the memory cell and reference current Iref becomes greater than cell current Icell, so that node ND10 rises to the precharged voltage level while read-out data RD from inverter 414 attains the L level or "0". Accordingly, data "10" can be read out precisely with the word line voltage fixed.

This data read-out operation is utilized to perform the verification operation. In this verification operation, the level of the reference voltage is changed. In this case, when the word line voltage is set at a read-out voltage level the same as in a normal data reading, data read-out can be performed in accordance with the same sequence while performing the similar verification operation.

Modification of Verification Operation Sequence

Figure 49:
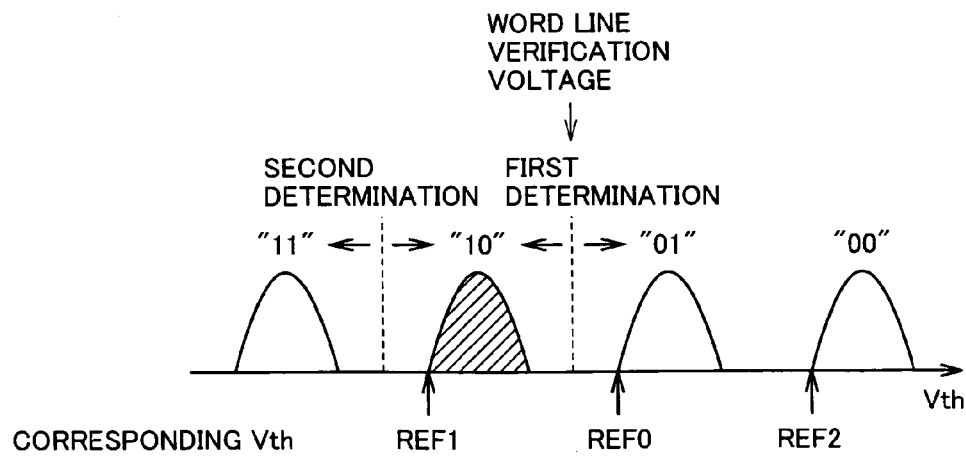
FIG. 49 is a diagram schematically representing another operation sequence of the verification sense amplifier shown in FIG. 46.

FIG. 49 is a diagram illustrating the data read-out operation in the verification operation. FIG. 49 also shows the verification reference voltages in the case where the programmed state of data "10" is verified. In this case, the respective lower side threshold voltage levels of the threshold voltage regions of data "01," "10" and "00" are utilized as reference voltages REF0, REF1 and REF2. First, a voltage that corresponds to the lower side threshold voltage of data "01" is selected as reference voltage REF0 and corresponding reference current Iref is generated. In this case, the word line verification voltage is at the level of the upper side threshold voltage of data "10" or at the voltage level having a margin relative to the same. In this first sensing operation, reference basis voltage REF0 generates reference current Iref that corresponds to the state of a higher threshold voltage than the threshold voltage of the memory cell that stores data "10". Accordingly, reference current Iref is an extremely small current. On the other hand, a memory cell is made conductive in accordance with the word line verification voltage and cell current Icell is larger than reference current Iref and therefore data "1" is read out in the first sensing operation.

Subsequently, a voltage level for supplying a cell current that corresponds to the lower side threshold voltage of data "10" is selected as reference voltage REF1 following the first sensing operation. This reference voltage REF1 generates reference current Iref larger than cell current Icell of the memory cell storing data "10" and therefore data "0" is read out in the second verification operation. In a memory cell that stores "11", a current that is larger than this reference current Iref is driven at the time of this second sensing operation and therefore data "1" is read out.

Upon the verification of data "01", the word line verification voltage is set at a voltage level between the threshold voltages of data "01" and data "00". As the reference voltage, such a reference voltage is used that a current driven by a threshold voltage the same as the voltage level between data "10" and data "01" is produced as the reference current. As for data "01", reference current Iref is larger than cell current Icell and therefore data "0" is read out in first sensing operation. As for memory cells that store data "11" and data "10," cell current Icell is larger than reference current Iref and therefore data "1" is read out. Accordingly, when data "0" is read out in the first sensing operation, then reference voltage REF2, for example, which is the same in voltage level as the word line voltage, is selected in the second sensing. In this case, in memory cells that store data "01", cell current Icell is larger than reference current Iref and therefore data "1" is outputted. In memory cells that store data "00", cell current Icell is smaller than reference current Iref and therefore, data "0" is read out. In this case, data "1" is read out also from the memory cells that store data "10." However, in the programming operation, the programming operation is performed such that the threshold voltage is sequentially increased and the verification operation is completed for the memory cells that store data "10", and therefore data bit "1" indicating the completion of verification is stored in the page buffer, raising no particular problems. Data of the memory cells to be verified need only to be precisely read out.

As a result, even in the case where the word line verification voltage is fixed in accordance with the verification data, data can be precisely read out to perform the accurate verification.

Here, if the word line voltage is changed in accordance with the reference voltage or is set at the word line read-out voltage level set in data accessing, these verification sense amplifiers can be used to precisely read out the memory cell data in accordance with the sequential sensing scheme even in the general verification operation in which no re-writing of data in the page buffer is performed.

The verification sense amplifier shown in FIG. 46 has been described as a sense amplifier for verification. However, it can be utilized as a sense amplifier for data read-out in external the data read-out. In addition, a sense amplifier for data read-out and a sense amplifier for verification may be formed into a common amplifier.

Configuration of Reference Voltage Generation Part

Figure 50:
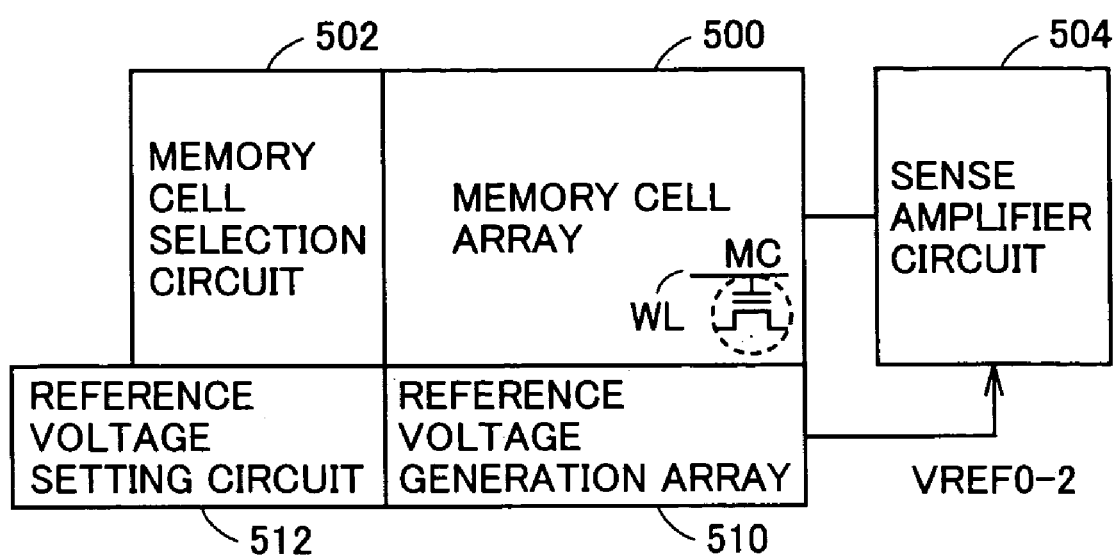
FIG. 50 is a diagram schematically showing the configuration of the portion that generates a reference voltage according to the present invention.

FIG. 50 is a diagram schematically showing the configuration of the part that generates reference voltages VREF0 to VREF2 (VREF0–2). In FIG. 50, this nonvolatile semiconductor memory device includes a memory cell array 500 and a memory cell selection circuit 502 for selecting a memory cell of memory cell array 500. In memory cell array 500, memory cells MC are formed of floating gate-type field effect transistors and memory cells MC are arranged in rows and columns. Word lines are arranged corresponding to respective rows and bit lines are arranged corresponding to the respective columns. In FIG. 50, one memory cell MC in memory cell array 500 and word line WL that is connected to this cell are representatively shown.

Memory cell selection circuit 502 includes a memory cell row selection circuit and a memory cell column selection circuit. In memory cell column selection circuit, a data read-out column selection circuit for a normal data accessing and a verification column selection circuit may be separately provided, or a common column selection circuit may be used for verification and for normal data read-out. In addition, a write-in column selection circuit for transferring the output signal of the data writing write driver to the selected bit line and a column selection circuit for data read-out may be provided separately. In programming, verification and programming are performed utilizing the verification column selection circuit, and data read-out may be performed by connecting a selected bit line to a sense amplifier via an internal read-out data line by the use of the data read-out column selection circuit. Accordingly, the configuration of the column selection circuit is appropriately determined in accordance with the array configuration.

A sense amplifier circuit 504 is provided to this memory cell array 500. This sense amplifier circuit 504 may include a sense amplifier for verification and a sense amplifier for data read-out separately. In the bank configuration, a sense amplifier for external read-out that reads out the data of the memory cell array may be provided in common to all the banks while a sense amplifier for verification may be arranged for each of the banks of the memory cell array. Accordingly, the configuration of this sense amplifier circuit 504 is also appropriately determined in accordance with the configuration of memory cell array 500.

A reference voltage generation array 510 and a reference voltage setting circuit 512 for setting the voltage levels of reference voltages VREF0 to VREF2 generated by this reference voltage generation array 510 are provided to this memory cell array 500. Reference voltage generation circuit 510 is formed by arranging memory cells of the same configuration as memory cells MC included in memory cell array 500. A reference voltage is generated on the basis of a current that flows through a selected memory cell in reference voltage generation array 510. Reference voltage generation array 510 and memory cell array 500 are the same in memory cell structure, and the variation of the characteristics of the memory cells in memory cell array 500 can be reflected in the reference voltage generated by reference voltage generation array 510, and thus the reference voltage can be precisely generated. The reference voltage generated by this reference voltage generation array 510 is utilized as the reference voltage sense amplifier circuit 504 and in addition, is utilized as the verification read-out voltage in the case where a selected word line is set at the verification read-out voltage corresponding to the threshold voltage level in the verification.

Reference voltage setting circuit 512 sets the voltage levels of reference voltages VREF0 to VREF2 generated by the reference voltage generation array 510 in accordance with the operation mode under the control of the CPU not shown (see FIG. 4).

Figure 51:
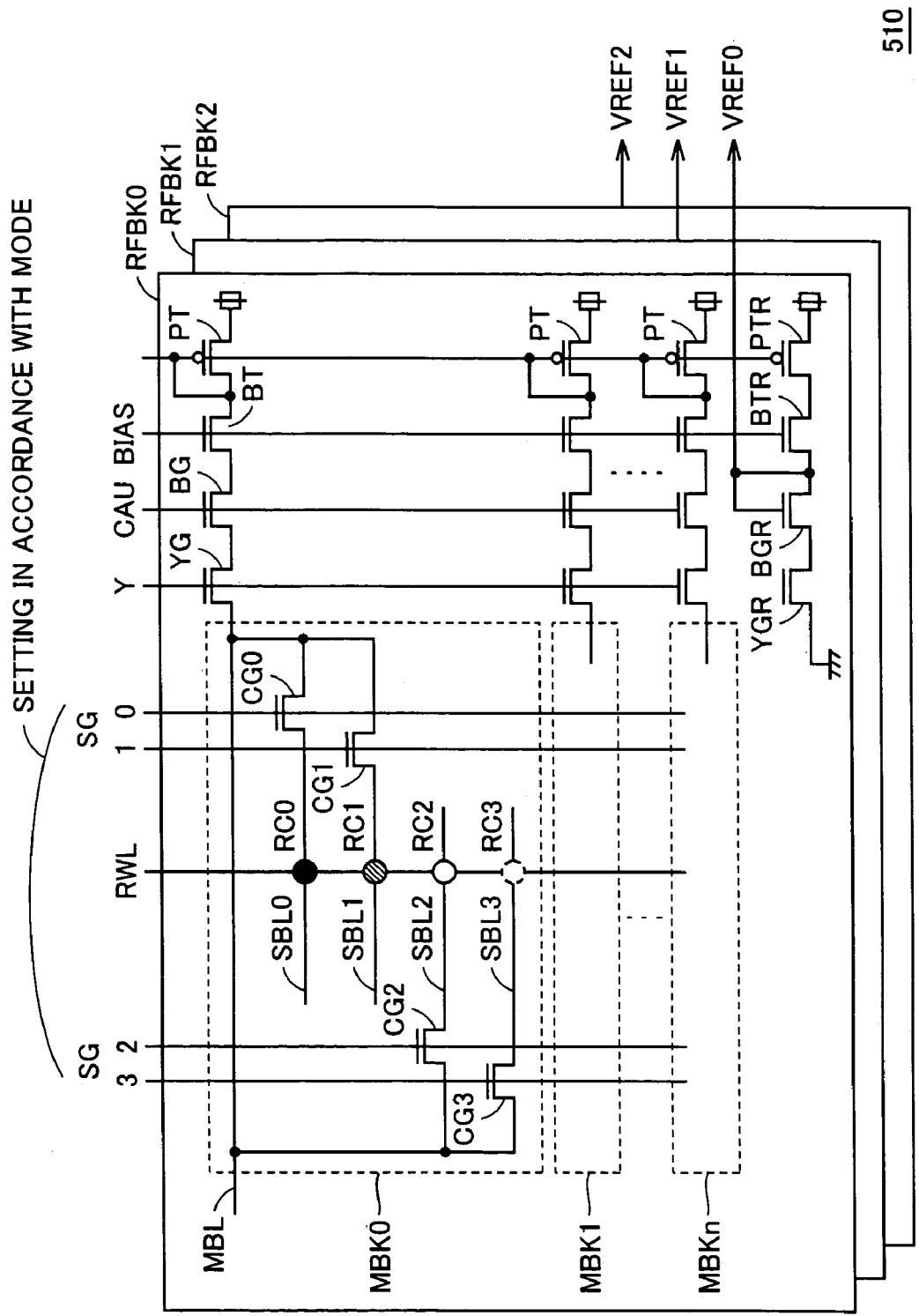
FIG. 51 is a diagram showing an example of the configuration of the reference voltage generation array shown in FIG. 50.

FIG. 51 is a diagram schematically showing an example of the configuration of reference voltage generation array 510 shown in FIG. 50. In FIG. 51, reference voltage generation array 510 includes reference voltage array blocks RFBK0 to RFBK2 provided corresponding to the respective reference voltages VREF0 to VREF2. These reference voltage array blocks RFBK0 to RFBK2 have the same configuration and therefore, FIG. 51 representatively shows the configuration of reference voltage array block RFBK0.

Reference voltage array block RFBK0 (RFBK1 and RFBK2) includes a plurality of memory blocks MBK0 to MBKn. 16 to 32 memory blocks are provided as these memory blocks MBK0 to MBKn. Memory blocks MBK0 to MBKn have the same configuration and therefore, FIG. 51 representatively shows the configuration of one memory block MBK0. Main bit line MBL is provided to these memory block MBK0 (MBK1 to MBKn). Four sub-bit lines SBL0 to SBL3 are provided to the main bit line MBL in memory block MBK0 and reference word line RWL is provided in the direction crossing the main bit line MBL and sub-bit lines SBL0 to SBL3. Sub-bit lines SBL0 to SBL3 are coupled to main bit line MBL via selection gates CG0 to CG3, respectively. These selection gates CG0 to CG3 are selectively made conductive in accordance with sub-bit line selection signals SG0 to SG3. Selection gates CG0 to CG3 for selecting the sub-bit lines are arranged on opposite sides of the sub-bit lines and the pitch of selection gates CG0 to CG3 can be mitigated.

Reference cells RC0 to RC3 of the floating gate-type the same in configuration as memory cells MC are arranged corresponding to the crossings of reference word line RWL and sub-bit lines SBL0 to SBL3. These reference cells RC0 to RC3 have threshold voltages made different from each other.

A column selection gate YG rendered conductive in response to column selection signal Y, a mat selection transistor BG that receives mat selection signal CAU indicating upper/lower array mat selection, a bias transistor BT that receives bias voltage BIAS for limiting a rise in voltage level of the main bit line, and a P-channel MOS transistor (insulating gate-type field effect transistor) P type which is connected between the power supply node and bias transistor B and having the gate and the drain interconnected, are connected in series to main bit line MBL of each of memory blocks MBK0 to MBKn.

The configuration in which column selection gate YG, mat selection gate BG and bias transistor BT are connected is the same as the configuration provided to main bit line MBL in memory cell array 500, and the main bit line is connected to the internal data read-out line (or verification data line) via this bias transistor BT in memory cell array 500.

Reference voltage array block RFBK (RFBK1 and RFBK2) further includes: a dummy gate transistor YGR that is made conductive by receiving the power supply voltage at its gate; a reference voltage generation transistor BGR for current/voltage conversion having the gate and the drain connected together, a bias transistor BTR that receives bias voltage BIAS at its gate, and a current source transistor PTR having a gate connected to all of the gates of MOS transistors PT (current source transistors) of each respective memory block. Transistors YGR, BGR and BTR, YG, BG and BT are formed of N-channel MOS transistors while current supply transistor PTR is formed of a P-channel MOS transistor. MOS transistors YGR, BGR, BTR and PTR are connected in series.

The size ratio (channel width to channel length ratio) of MOS transistor (current source transistor) PT to MOS transistor PTR is adjusted to an appropriate value.

Figure 52:
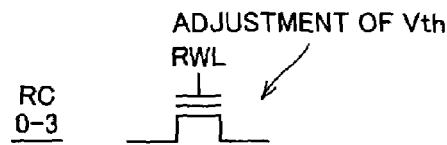
FIG. 52 is a diagram showing an example of the configuration of the reference cell shown in FIG. 51.

FIG. 51 shows that these reference array blocks RFBK0 to RFBK2 are arranged in separate blocks. However, these reference array blocks RFBK0, RFBK1 and RFBK2 may be arranged so as to share reference word line RWL and to include different groups of main bit lines;

FIG. 52 is a diagram showing an example of the configuration of reference cells RC0 to RC3 shown in FIG. 51. As shown in this FIG. 52, reference cells RC0 to RC3 are formed of floating gate-type transistors having the same configuration as memory cells MC and have the threshold voltage Vth adjusted in accordance with the level of the reference voltage to be generated. A threshold voltage according to the storage data of a memory cell may be used as this threshold voltage Vth.

Figure 53:
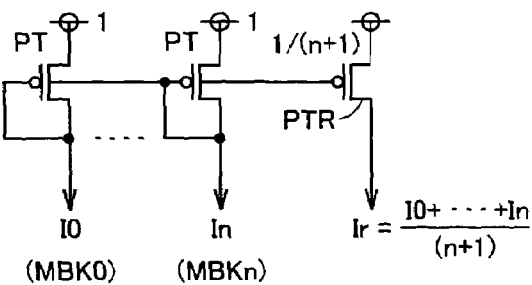
FIG. 53 is a diagram schematically showing the configuration of a reference current generation part of the reference array block shown in FIG. 51.

FIG. 53 is a diagram schematically showing the size ratio of current source transistor PT to current source transistor PTR shown in FIG. 51. As shown in FIG. 53, the size ratio of current source transistor PT, which is provided to each of memory blocks MBK0 to MBKn, to current source transistor PTR for reference voltage generation is set at 1:1/(n+1). Current source transistors PT and PTR form a current mirror circuit with current source transistor PT being a master transistor, and therefore a current which is 1/(n+1) times larger than the sum of the currents flowing through current source transistors PT in memory blocks MBK0 to MBKn flows via current source transistor PTR. Accordingly, in the case where current source transistors PT corresponding to memory blocks MBK0 to MBKn generate currents I0 to In, respectively, current Ir generated by current source transistor PTR for reference voltage generation assumes (I0+ . . . +In)/(n+1). The variation of the threshold voltages of reference cells RC (RC0 to RC3) in memory blocks MBK0 to MBKn can be averaged so that reference current Ir at a desired stable level can be generated to generate reference voltage VREF.

Selection signals SG0 to SG3 are set in accordance with the operation mode and a reference cell generating a reference current corresponding to the operation mode is selected in reference cells RC0 to RC3, and accordingly, reference current Ir has the current flow level set at the current level according to the operation mode, so that the voltage level of reference voltage VREF can be set. The reference voltages VREF0–2 can be utilized as reference voltages for the sense amplifiers shown in FIG. 40 et. seq., and in addition, can be utilized as the reference voltages transmitted onto a word line in the case where the word line is set at the verification voltage according to the threshold voltage.

Reference currents in the respective operation modes, such as in the data read-out mode, in programming, erasure and verification, can be generated in the same circuit configuration, and therefore control is simplified and the circuit occupation area can be reduced.

Here, the configuration of the reference voltage generation part shown in FIG. 51 can be utilized as a circuit that generates a reference voltage for the cell array of the SLC configuration, in addition to the MLC configuration.

First Modification of Reference Voltage Generation Part

Figure 54:
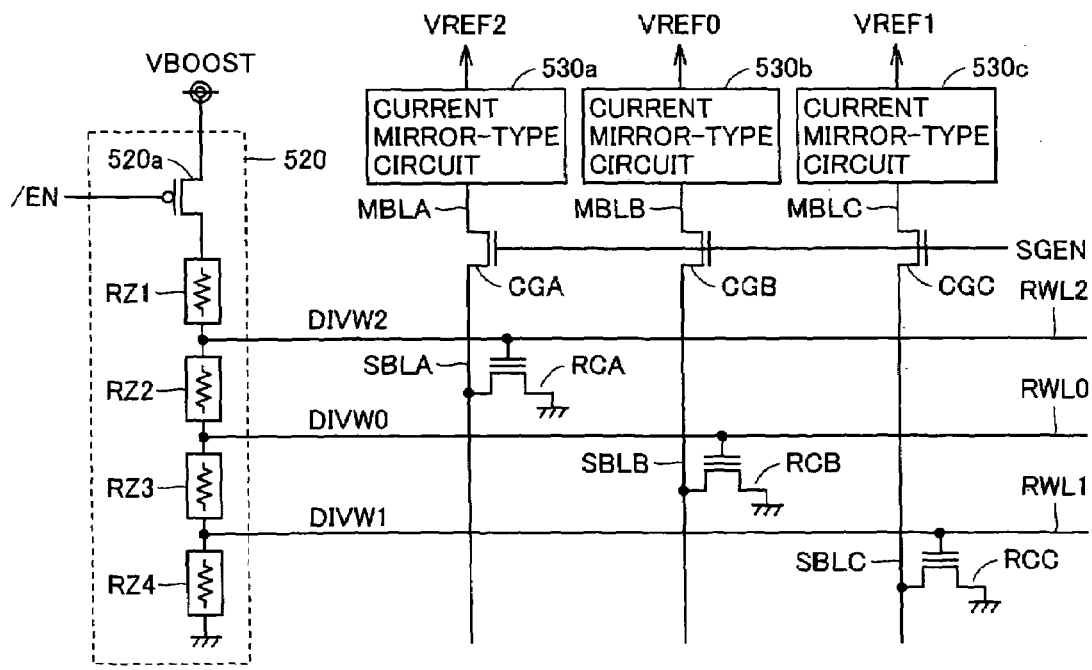
FIG. 54 is a diagram showing another configuration of the reference voltage generation part.

FIG. 54 is a diagram schematically showing the configuration of a first modification example of the reference voltage generation part. In FIG. 54, reference word lines RWL2, RWL0 and RWL1 are provided corresponding to reference voltages REF2, REF0 and REF1, respectively. Drive voltages DIVW0 to DIW2 are supplied to these reference word lines RWL0 to RWL2 from reference word line drive voltage generation circuit 520. This reference word line drive voltage generation circuit 520 includes: an activation transistor 520a formed of a P-channel MOS transistor and coupled to the node supplying a word line read-out voltage VBOOST, and made selectively conductive in accordance with activation signal/EN; and resistance elements RZ1 to RZ4 connected in series between activation transistor 520a and the ground node.

Divided voltages DIVW2, DIVW0 and DMV1 are generated from the respective connection nodes of these resistance elements RZ1 to RZ4, and are supplied to reference word lines RWL2, RWL0 and RWL1, respectively, as the drive voltages.

Word line read-out voltage VBOOST is generated in accordance with the operation mode from an internal voltage generation circuit not shown, is a voltage that is transmitted onto a selected word line in data read-out access of memory cell array 500 and is set at a voltage level higher than the maximum threshold voltage of the multi-level data. The word line may be set at the read-out voltage VBOOST level in the verification operation.

Reference cells RCA, RCB and RCC are connected to reference word lines RWL2, RWL0 and RWL1, respectively, and are connected to sub-bit lines SBLA, SBLB and SBLC, respectively. These sub-bit lines SBLA to SBLC are coupled to main bit lines MBLA to MBLC via selection gates CGA to CGC, respectively. These selection gates CGA to CGC enter the conductive state at the same time in accordance with selection signal SGEN.

Main bit lines MBLA to MBLC are coupled to current mirror-type circuits 530a to 530c. Current mirror-type circuits 530a to 530c convert mirror currents of the currents flowing through corresponding main bit lines MBLA to MBLC, to voltages to generate reference voltages VREF2, VREF0 and VREF1, respectively.

Reference cells RCA to RCC are each in the erased state and have the same threshold voltage. Accordingly, drive currents are changed in accordance with divided voltages DIVW0 to DIVW2 transmitted onto the corresponding word lines. Corresponding reference voltages VREF0 to VREF2 can be generated in accordance with drive voltages DIVW0 to DIVW2 generated from reference word line drive voltage generation circuit 520.

Here, main bit lines MBLA to MBLC each may be an assembly of main bit lines MBL of reference array blocks RFBK0 to RFBK2, respectively, shown in FIG. 51 (in this case, the reference voltage is generated on the basis of the averaged current), or may be a single main bit line (no averaged current is generated).

In the case where reference array blocks RFBK0 to RFBK2 shown in FIG. 51 are utilized, current mirror-type circuits 530a to 530c each correspond to the combination of transistors YGR, BGR, BTR and PTR. Required reference voltages VREF0 to VREF2 can be generated by dividing read-out voltage VBOOST transmitted onto a word line.

Here, activation signal /EN is activated in the operation mode that requires a reference voltage in the data access or verification. A reference voltage at another voltage level generated in program verification and in erasure verification is also generated from another reference cell. A plurality of groups of selection gates CGA to CGC are provided to select a group of the selection gates for a required reference voltage in accordance with the selection signal.

In addition, a circuit the same in configuration as reference word line drive voltage generation circuit 520 but different in dividing factor of the resistors is provided in parallel to generate reference word line drive voltages DIVW0 to DIVW2, and reference voltages required for the verification voltage in programming and in erasure can be generated.

In addition, reference memory cells having different threshold voltages are connected to the same reference word line RWL, and a plurality of reference voltages may be generated from one selected reference word line. A reference word line is selected in accordance with the operation mode and thus a plurality of reference voltages according to the operation mode are generated. In this case, in the configuration shown in FIG. 51, divided voltage DIVW may be supplied to reference word line RWL as the drive voltage.

Figure 55:
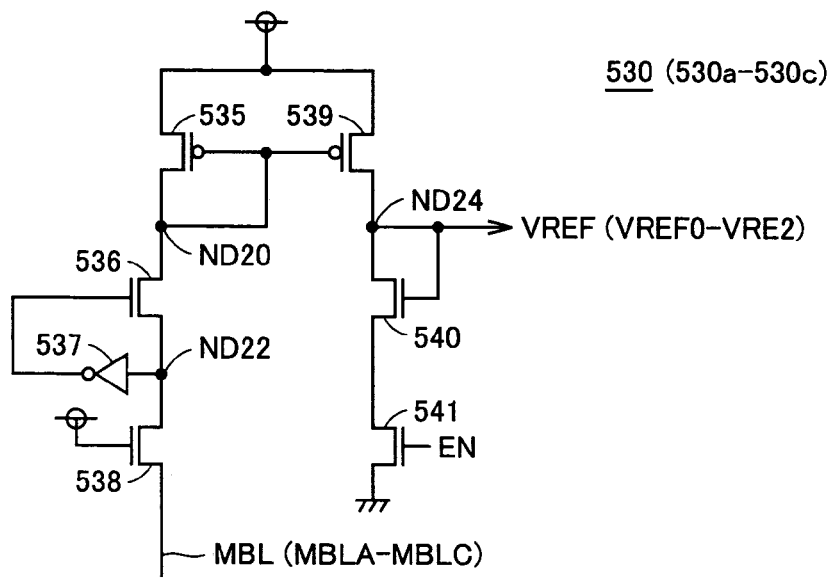
FIG. 55 is a diagram schematically showing still another configuration of the reference voltage generation part.

FIG. 55 is a diagram showing an example of the configuration of current mirror-type circuits 530a to 530c shown in FIG. 54. These current mirror-type circuits 530a to 530c have the same configuration, and therefore FIG. 55 representatively shows these current mirror-type circuits 530a to 530c as a current mirror-type circuit 530.

Current mirror-type circuit 530 includes: a P-channel MOS transistor 535 which is connected between the power supply node and node ND20 and has a gate connected to node ND20; an N-channel MOS transistor 536 which is connected between node ND20 and node-ND22; an inverter 537 that inverts the voltage level of node ND22 for transmission onto the gate of MOS transistor 536; an N-channel MOS transistor 538 which is connected between node ND22 and main bit line MBL (MBLA to MBLC) and has a gate connected to the power supply node and serves as a dummy gate; a P-channel MOS transistor 539 which is connected between the power supply node and node ND24 and has a gate connected to node ND20; and N-channel MOS transistors 540 and 541 which are connected in series between node N24 and the ground node.

MOS transistor 540 has a gate connected to node ND24, and functions as a current/voltage conversion element to generate reference voltages VREF (VREF0 to VREF2). MOS transistor 541 receives activation signal EN at its gate and activates current mirror-type circuits 530a to 530c at a timing at which this reference voltage VREF is generated.

In current mirror-type circuit 530, MOS transistors 535 and 539 form a current mirror circuit with MOS transistor 535 being the master, and MOS transistor 539 generates a mirror current of the current flowing through main bit line MBL. MOS transistor 540 converts the mirror current supplied from this MOS transistor 539 to a voltage to generate reference voltage VREF. Accordingly, reference voltages corresponding to the currents flowing through corresponding reference cells RCA to RCC from main bit line MBL are precisely generated. In particular, this current mirror-type circuit 530 has the same configuration as the sense amplifier, as shown in FIGS. 43 to 46, and can generate reference voltage VREF while precisely reflecting (compensating for) the amount of fluctuation in the resistance components of the reference current in the sense amplifier.

Here, in the configuration shown in FIG. 55, the averaged current generated by current source transistor PTR may also be supplied to MOS transistor 538, as shown in FIG. 51. Current source transistor PTR may be connected to MOS transistor 538 or may be connected to node ND22. The reference voltage VREF can be generated while averaging the characteristics of the reference cells.

Modification of Reference Cell

Figure 56:
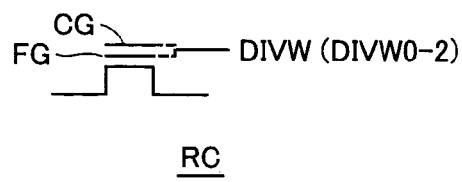
FIG. 56 is a diagram showing further another configuration of the reference cell.

FIG. 56 is a diagram showing a modification of reference cell RC. In the configuration of reference cell RC shown in this FIG. 56, a control gate CG and a floating gate FG are connected together and are supplied with a divided voltage (drive voltage) DIVW. Control gate CG and floating gate FG of the transistor having the same structure as the memory cell transistor are connected to each other and thus, the memory cell transistor of the stacked gate can be operated as a single gate MOS transistor and a reference current can be generated in accordance with divided voltage DIVW while reflecting the characteristics of the memory cell transistors.

Even if the threshold voltage of reference cell RC is the same for all the reference cells, the threshold voltage is equivalently adjusted by divided voltage DIVW so that the drive current can be adjusted. Moreover, the threshold voltage may be adjusted in accordance with the required reference voltage. In this case, the drive current of the reference cell is determined in accordance with divided voltage DIVW and the threshold voltage of the reference cell, so that a wide variety of kinds of reference voltages can be generated.

Reference cell RC shown in FIG. 56 may be arranged in reference voltage generation array block RFBK0–2 shown in FIG. 51. In addition, the size of reference cell RC may be changed in accordance with the reference voltage to be generated.

Second Modification of Reference Cell

Figure 57:
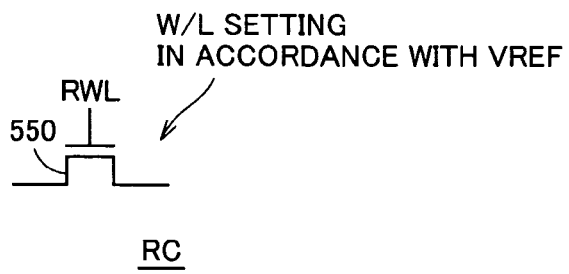
FIG. 57 is a diagram showing still another configuration of the reference cell.

FIG. 57 is a diagram showing the configuration of a second modification of reference cell RC. In FIG. 57, reference cell RC is formed of a single gate MOS transistor 550. This MOS transistor 550 does not have a floating gate, and has only a control gate. The size of MOS transistor 550, or the ratio W/L of the channel width to the channel length is set in accordance with reference voltage VREF.

Divided voltage DIVW of word line read-out voltage VBOOST or an appropriate reference word line selection voltage is supplied to reference word line RWL and thereby, drive current differs in accordance with reference voltage VREF, so that the corresponding reference voltage can be generated.

Accordingly, when MOS transistor 550 shown in FIG. 57 are arranged as reference cells RC0-RC as shown in FIG. 51 with sizes (W/L) made different, reference voltages required in the MLC configuration and in the SLC configuration can be generated even in the case wherein the threshold voltages of the reference cells are all the same.

In the configuration of reference cell RC shown in this FIG. 57, MOS transistor 550 that forms reference cell RC is fabricated in the same fabrication process of peripheral transistors such as the column selection gates of the memory cell array and thus, MOS transistors having sizes according to the respective reference voltages can be formed without increasing the number of manufacturing steps.

Configuration of Read-out/Output Circuit

Figure 58:
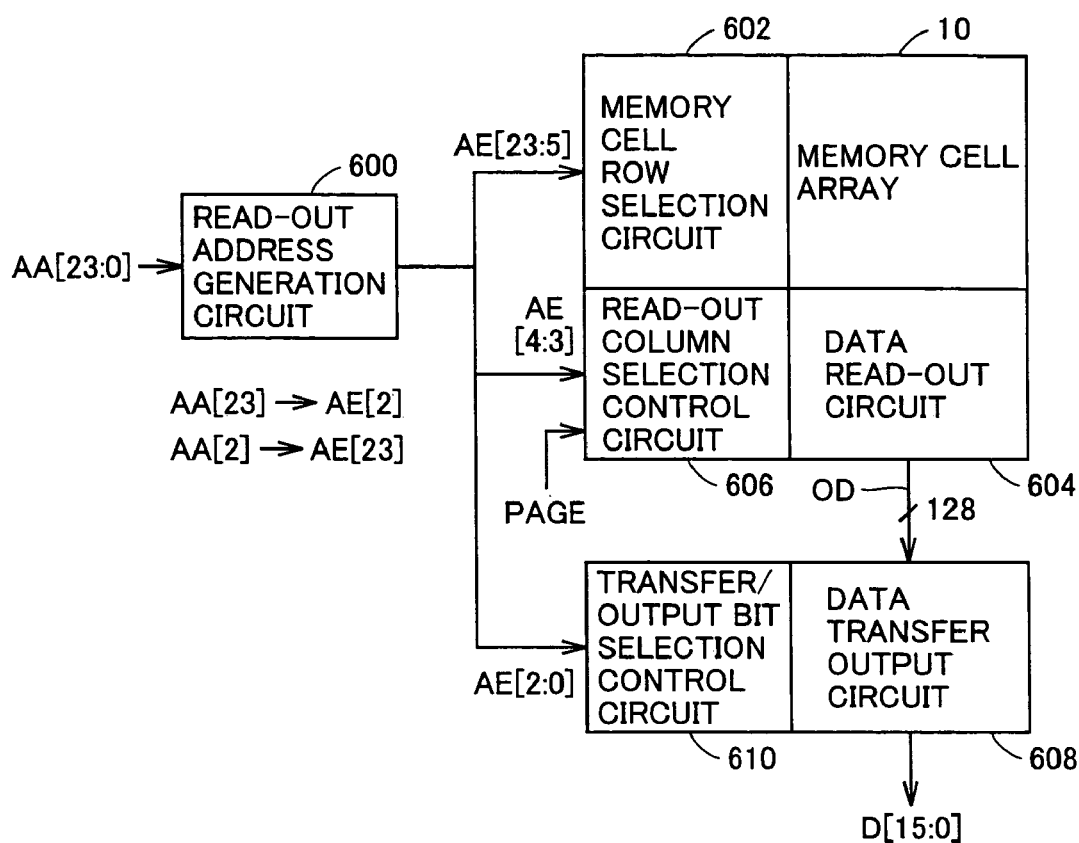
FIG. 58 is a diagram schematically showing the configuration of the part related to an external data reading out in the semiconductor memory device according to the present invention.

FIG. 58 is a diagram schematically showing the configuration of read-out/output circuit 11 shown in FIG. 4. In FIG. 58, the nonvolatile semiconductor memory device includes: a read-out address generation circuit 600 that is activated in data read-out to generate internal read-out address bits AE [23:0] from external address bits AA [23:0]; a memory cell row selection circuit 602 that selects a memory cell row of memory cell array 10 in accordance with internal address bits AE [23:5] from read-out address generation circuit 600; a read-out column selection control circuit 606 that controls the column selection of the memory cell array and the data read-out operation in accordance with internal read-out address bits AE [4:3] from read-out address generation circuit 600; a data read-out circuit 604 that selects a memory cell column from the selected memory cell row of memory cell array 10 to read out data under the control of the above read-out column selection control circuit 606; a data transfer output circuit 608 that sequentially transfers the data read out from data read-out circuit 604 to generate 16-bit data D [15:0]; and a transfer/output bit selection control circuit 610 that controls the data transfer bit under the data transfer operation of data transfer output circuit 608 in accordance with internal read-out address bits AE [23] and AE [1:0] from read-out address generation circuit 600.

Data read-out circuit 604 is coupled to data transfer output circuit 608 via the internal output data bus of 128 bits. This data transfer output circuit 608 selects the data transferred from the internal output data bus of 128 bits via the data bus of 16 bits to generate final 16-bit data D [15:0].

Memory cell row selection circuit 602 is also used in the data write-in and performs the row selection operation in accordance with internal address AO [22:0] in data writing.

Page mode instruction signal PAGE is supplied to read-out column selection control circuit 606. In a normal operation mode, memory cell data of 16 bits is read out in a random sequence in accordance with an address signal in data read-out circuit 604. On the other hand, In the page mode, data of eight words (128 bits) at the successive 4 addresses is read out from this data read-out circuit 604 and ⅛ selection is sequentially performed in data transfer output circuit 608 to generate 16-bit data. In memory cell array 10, data is stored in the MLC configuration.

Figure 59:
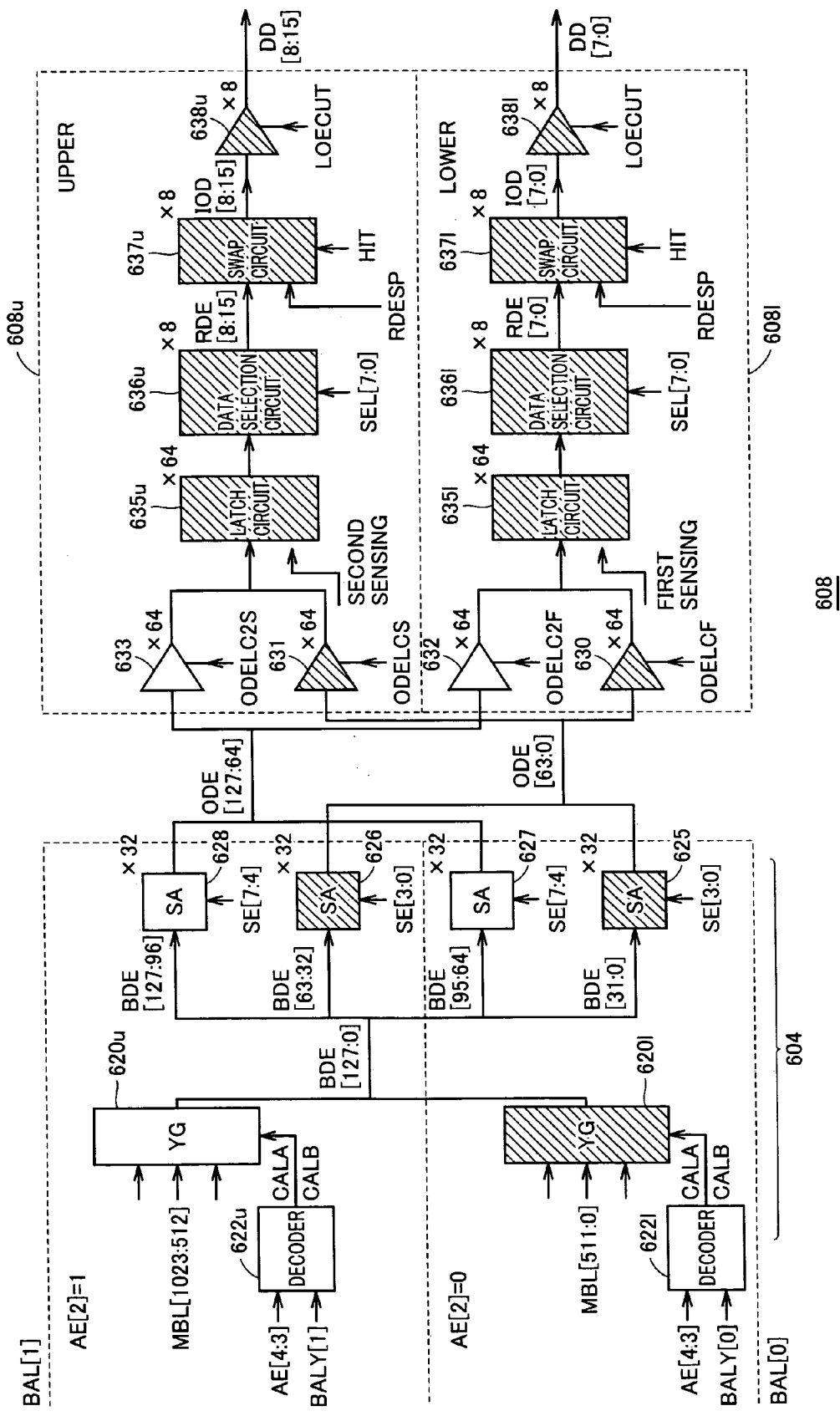
FIG. 59 is a diagram schematically showing the configurations of a data read-out circuit and a data transfer output circuit shown in FIG. 58.

FIG. 59 is a diagram schematically showing the configurations of data read-out circuit 604 and data transfer output circuit 608 shown in FIG. 58. In FIG. 59, data read-out circuit 604 includes: column selection gates circuits (YG) 620u and 620l provided corresponding to blocks BAL [0] and BAL [1], respectively; a decoder 622u that generates ¼ column selection signals CLA and CLB to column selection gate circuit 620u in accordance with internal address bits AE [4:3] and block column selection signal BALY [1]; and a decoder 622l that generates ¼ column selection signals CLA and CLB to column selection gate circuit 620l in accordance with internal address bits AE [4:3] and block column selection signal BALY [0].

Main bit lines MLB [1023:512] are provided to column selection gate circuit 620u and main bit lines MBL [511:0] are provided to column selection gate circuit 620l. Column selection signals BLY [1] and BLY [0] are signals of the same logic and decoders 622u and 622l each carry out ⅛ selection to select 64 main bit lines from 512 main bit lines MBL. Column selection gate circuit 620u couples the selected main bit lines to internal read-out data lines BDE [127:64] while column selection gate circuit 620l couples the selected 64 main bit lines to internal read-out data lines BDE [63:0].

Sense amplifier circuits (SA) 625 to 628 each 32-bit wide are provided to this internal read-out data lines BDE [127:0] of 128 bits. Sense amplifier circuit 625 is activated to perform the sensing of the data on internal read-out data line BDE [31:0] in accordance with selection signal SE [3:0] to transmit the read-out data to internal output data lines ODE [31:0]. Sense amplifier circuit 626 carries out the sensing operation of the data on internal read-out data lines BDE [63:32] when activated in accordance with sense selection signal SE [3:0], to transmit the read-out data of 32 bits to internal output data lines ODE [63:32]. Sense amplifier circuit 627 is activated in accordance with sense activation signal SE [7:4] to sense the data on internal read-out data lines BDE [95:64] for transmitting the read-out data to internal output data lines ODE [95:64]. Sense amplifier circuit 628 is activated in accordance with sense selection signal SE [7:4], to perform the sensing of the data on internal read-out data lines BDE [127:96] for generating and transmitting the read-out data to internal output data lines ODE [127:96].

Each of sense amplifier circuits 625 to 628 has 32 sense amplifiers each being the same as that shown in FIG. 46.

Data transfer output circuit 608 includes: an upper transfer/output circuit 608U for outputting upper byte data DD [8:15]; and a lower transfer/output circuit 608 L for generating lower 8-bit data DD [7:0].

Upper transfer/output circuit 608u includes: a buffer circuit 631 that is activated when transfer control signal ODELCS is activated, to transfer the data on internal output data lines ODE [63:0]; a buffer circuit 633 that transfers the 64 bit data on internal output data lines ODE [127:64] upon activation of transfer control signal ODELC2S; a latch circuit 635u for latching the output data of buffer circuits 631 and 633; a data selection circuit 636u for selecting 8-bit data from the 64-bit data of the latch circuit in accordance with selection signal SEL [7:0]; a swap circuit 637u for selecting either spare data RDESP or internal data IDE [8:15] from data selection circuit 636U in accordance with spare hit instruction signal HIT; and an output buffer 638u for generating output data DD [8:15] in accordance with transfer output control signal LOECUT.

Redundancy cells are arranged for replacing with a defective cell to repair the defective cell in the memory cell array. Spare hit signal HIT is activated when a defective cell is selected and the selected memory cell data is replaced with data RDESP from a redundancy cell. The arrangement of such redundancy cells are not shown.

Lower transfer/output circuit 608L includes: a buffer circuit 630 which is activated upon activation of transfer control signal ODELCF, to transfer the data of internal output data lines ODE [63:0]; a buffer circuit 632 which is activated upon activation of transfer control signal ODELC2F, to transfer the 63 bit data of internal output data lines ODE [127:64]; a latch circuit 6351 of 64 bits that latches the transfer data of buffer circuits 630 and 632; a data selection circuit 6361 for selecting 8-bit data from the 64-bit data of latch circuit 6351 in accordance with data selection signal SEL [7:0]; a swap circuit 6371 that selects either output data ID [7:0] of data selection circuit 6361 or spare data RDESP in accordance with spare hit signal HIT; and an output buffer circuit 6381 that buffers the 8-bit output data of swap circuit 6371 in accordance with output control signal LOECUT, to generate data DD [7:0].

Block BAL [1] corresponds to the region where internal address bit AE [2] (AA [23]) is "1", and block BAL [0] corresponds to the region where the internal address bit AE [2] is "0". Data of external two words is stored in 16-bit memory cells of the same address in each of blocks BAL [0] and BAL [1]. In the data storage, upper word and lower word are stored in the upper byte region and the lower byte region, respectively.

Read-out address generation circuit 600 shown in FIG. 58 converts address bit AA [23] externally applied to internal read-out column address bit AE [2] and allocates address bit AA [2] externally applied to internal read-out column address bit AE [23]. This internal read-out column address-bit AE [2] is used to perform selection between block BAL [1] and BAL [0]. Lower byte data and upper byte data of the 16-bit word in the selected block are sensed by 2 sets of sense amplifier circuits provided to the selected block.

Figure 60:
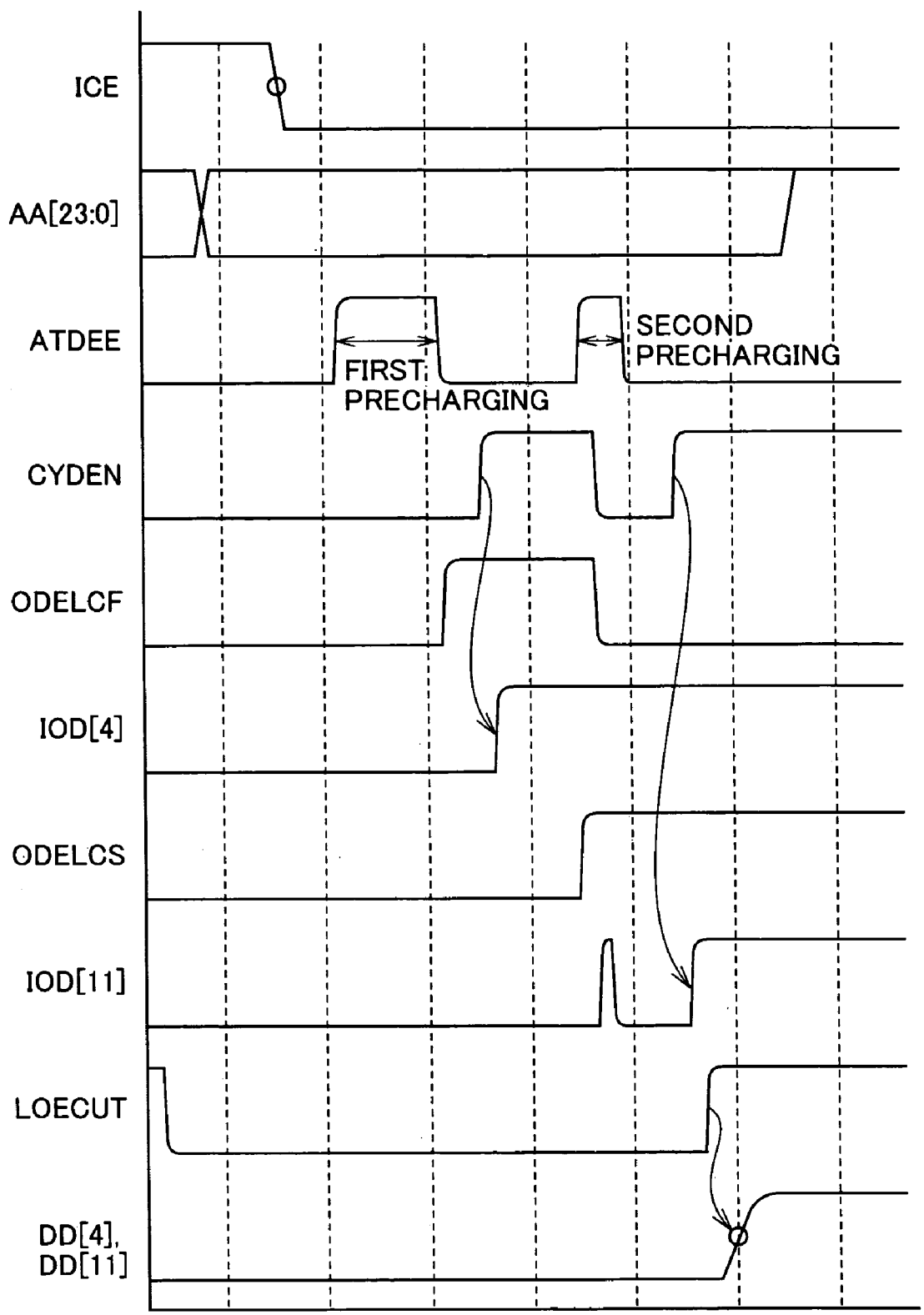
FIG. 60 is a signal waveform diagram representing an operation of a read-out circuit and a data output transfer circuit shown in FIG. 59.

FIG. 60 is a timing chart representing the operations of read-out circuit 604 and data transfer output circuit 608 shown in FIG. 59. In the following, the operations of these circuits shown in FIG. 59 are described with reference to FIG. 60.

Data read-out/output circuit shown in FIG. 59 has a random access mode for selecting 16-bit data in a random sequence and a page mode for reading out 8 words in successive addresses in a sequential manner. The number of sense amplifiers, which are simultaneously activated, is different between the page mode operation and the random access mode, and the data read-out and transfer sequence is the same for the page mode operation and for the random access mode operation. In either case, multi-level data stored by a memory cell is read out in accordance with the serial sense scheme. In the following, the data read-out operation in the page mode is described.

As shown in FIG. 60, when data read-out access instruction ICE from the command user interface turns L level in accordance with the data read-out command externally supplied, the operation of selecting memory cells is started in accordance with external address AA [23:0] currently applied. First, precharging of the internal nodes to the power supply voltage level is performed in sense amplifier circuits 625 to 628 in accordance with sense amplifier precharging instruction signal ATDEE. In this precharging operation, the column selection operation is performed by decoders 622l and 622u while column selection gate circuits 620l and 620u each carry out the ⅛ selection operation to select 64 main bit lines MBL and connect the selected 64 main bit lines to internal read-out data lines BDD [127:0]. The precharging operation is performed on the selected main bit lines by the activated sense amplifiers, so that the percharging current is supplied to the main bit lines selected by column selection gate circuit 620l and each main bit line is set at a predetermined read-out voltage level.

When the precharging operation is completed, one of sense activation signals SE [3:0] and SE [7:4] is activated in accordance with internal address bit AE [2] (=AA [23]) in sense amplifier circuits 625 to 628. Here, as shown in FIG. 59, the state is assumed in which internal address bit AE [2] is "0" and sense amplifier activation signal SE [3:0] is activated.

When the precharging operation is completed, a sense amplifier is activated to supply a reference current to the selected memory cell via the selected main bit line, and the reference current and the cell current are compared and the data read-out is effected. Data transfer control signal ODELCF is activated in accordance with the deactivation of the precharging instruction signal ATDEE, and buffer circuit 630 transfers the 64-bit sense data from sense amplifier circuits 625 and 626 to latch circuit 635l.

Subsequently, the column selection operation is performed in accordance with column selection activation signal CYDEN and one of data selection signals SEL [7:0] is driven to the selected state so that 8-bit data RDE [7:0] is outputted from data selection circuit 636l to generate internal output data IOD [7:0] via swap circuit 637l. In FIG. 60, internal output data bit IOD [4] is representatively shown.

When the first sensing operation is completed, output data transfer control signal ODELCF enters the non-active state and buffer circuit 630 is deactivated so that latch circuit 635l enters the state of latching the supplied data. In addition, column selection activation signal CYDEN is also deactivated so that data selection signals SEL [7:0] are all deactivated. According to this first sensing operation, lower byte data of successive two words stored in 16-bit memory cells is read out and thus each byte data of eight words at successive addresses is read out.

Precharging activation signal ATDEE is again activated and the second precharging operation is performed on the selected main bit lines and the sense amplifiers. In this precharging operation, output transfer control signal ODELCS is activated and buffer circuit 631 is activated so that the output data of sense amplifier circuits 625 and 626 is transferred to latch circuit 636u. During the period of this precharging operation, data selection circuit 636u carries out the column selection operation in accordance with the active state of column selection activation signal CYDEN and therefore, internal data bits IOD [8:15] from swap circuit 637u are set to the state corresponding to the data read out in the first sensing operation. In FIG. 60, the change of data bit IOD [11] is representatively shown.

When column selection activation signal CYDEN is deactivated, data bit IOD [11] attains the unselected state. Data bit IOD [4] also falls to the L level because the output signal of data selection circuit 636l is deactivated. In FIG. 60, the output data bit of this lower data block 608L is shown, and the data sensed at the time of the first sensing is shown being outputted from swap circuit 637l continuously. According to the second sensing operation, the upper byte data of the sequential two-word data stored in 16-bit memory cells is read out and accordingly the upper byte data of 8 words in total is read out.

When the second precharging operation is completed in accordance with the deactivation of precharging activation instruction signal ATDEE and the sensing operations of sense amplifier circuits 625 and 626 are again activated, the output data of these sense amplifier circuits 625 and 626 is transferred to latch circuit 635u via buffer circuit 631 and are latched therein.

When column selection activation signal CYDEN is again activated, one of data selection signals SEL [7:0] is driven to the selected state and the output signal of data selection circuit 636u is driven to the state corresponding to the data read out according to the second sensing operation.

Subsequently, when data output control signal LOECUT is activated, output buffer circuits 638l and 638u are activated so that 8-bit data IOD [7:0] and 8-bit data IOD [8:15] are outputted as data DD [7:0] and DD [8:15]. By utilizing this output control signal LOECUT, upper byte data and lower byte data set in the definite state can be generated at the same timing by output buffer circuits 630u and 630l precisely.

Here, data bit DD [8:15] is shown indicating that the data bit positions are changed when the data is stored in the memory cell array and the data of IO0 is compressed with the data of IO15 to be stored in the same memory cell.

In the case where data is read out from block BAL [1], sense amplifier circuits 628 and 627 are activated and buffer circuits 633 and 632 are activated in the first sensing operation and in the second sensing operation, in accordance with output transfer control signals ODELC2F and ODELC2S, and in the same manner, 64-bit data is stored in latch circuits 635*l* and 635*u*.

Here, precharging instruction signal ATDEE is a signal corresponding to sense amplifier activation signal TXLATD shown in FIG. 46 and is activated at a predetermined timing in accordance with the instruction from the command user interface in the external read-out mode of data.

In the case where data read-out is performed in a random sequence, one of sense amplifier activation signals SE [7:0] is activated in accordance with address bit AE [4:2]. In the case where internal address bit AE [2] is "0", for example, eight sense amplifiers are activated in each of sense amplifier circuits 625 and 626 so that the sensing operation of 16-bit data is performed. At this time, the data transfer is performed in accordance with the serial sense scheme and therefore output transfer control signals ODELCF and ODELCS are activated in the first sensing operation and in the second sensing operation, respectively, in accordance with internal read-out address bit AE [2]. Subsequently, 8-bit data is selected from the 16-bit data transferred from the selected sense amplifiers in each of data selection circuits 636*l* and 636*u* in accordance with selection signals SEL [7:0] to generate external output data DD [8:15] and external output data DD [7:0]. In the page mode, addresses may sequentially be supplied externally and address bits AE [1:0] and AE [23] may be internally changed sequentially to drive selection signals SEL [7:0] to the selected state sequentially. Data latched by the latch circuit is sequentially read out, and therefore it is not necessary to carry out row and column selections in the memory array, and thus data can be read out at high speed. In the case where addresses are changed internally, address signal bits may be updated in accordance with the clock signal and selection signals SEL [7:0] may be sequentially driven to the selected state.

Main bit line MBL and the internal read-out data line are divided into groups in accordance with external data terminals (IO) to carry out the selection operation in each group. Thus, data can be read out precisely in the page mode and in the random access mode.

Figure 61:
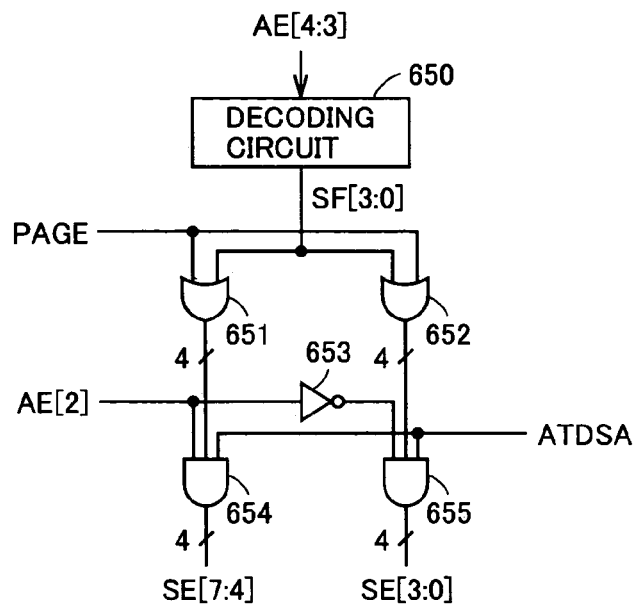
FIG. 61 is a diagram showing an example of the configuration of the part that generates the sense amplifier selection activation signal shown in FIG. 59.

FIG. 61 is a diagram showing an example of the configuration of the part that generates sense amplifier activation signals SE [7:0] shown in FIG. 59. In FIG. 61, the sense amplifier activation signal generation part includes: a decoding circuit 650 for decoding internal read-out column address bits AE [4:3]; OR gate circuits 651 and 652 that receive output signal SF [3:0] of decoding circuit 650 and page mode instruction signal PAGE; an inverter 653 that receives internal read-out column address bit AE [2]; an AND gate circuit 654 that receives the output signal of OR gate circuit 651, internal read-out column address bit AE [2] and sense amplifier activation signal ATDSA; and an AND gate circuit 655 that receives the output signal of inverter 653, sense amplifier activation signal ATDSA and the output signal of OR gate circuit 652.

Sense amplifier selection activation signal SE [7:4] is outputted from AND gate circuit 654 and sense amplifier selection activation signal SE [3:0] is outputted from AND gate circuit 655.

Sense amplifier activation signal ATDSA is activated in the data read-out at the same timing as sense amplifier activation signal MLC_ATD that is generated in the verification.

In a normal operation mode, page mode instruction signal PAGE is at the L level and OR gate circuits 651 and 652 operate as buffer circuits. In this case, decoding circuit 650 decodes internal read-out address AE [4:3] of 2 bits to drive one of 4-bit selection signal SF [3:0] to the selected state. In the case where internal read-out column address bit AE [2] is at the L level, AND gate circuit 655 generates sense amplifier selection activation signal SE [3:0] on the basis of the selection signal SF [3:0] from OR gate circuit 652. At this time, sense amplifier selection activation signals SE [7:4] are all at the L level. In the case where internal read-out column address bit AE [2] is at the H level, the output signal of inverter 653 is at the L level and sense amplifier selection activation signal SE [7:4] is generated on the basis of selection signal SF [3:0] from OR gate circuit 651. At this time, sense amplifier selection activation signals SE [3:0] are all at the L level of the non-selected state.

When a page mode is designated, page mode instruction signal PAGE attains the H level and the output signals of OR gates 651 and 652 both attains the H level. At this time, when internal read-out column address bit AE [2] is at the H level, sense amplifier selection activation signal SE [7:4] is driven to the selected state in accordance with sense amplifier activating signal ATDSA while sense amplifier selection activation signal SE [3:0] is maintained in the inactive state. When internal read-out column address bit AE [2] is at the L level, sense amplifier selection activation signals SE [3:0] are all at the H level while sense amplifier selection activation signals SE [7:4] are all at the L level of the inactive state.

Figure 62:
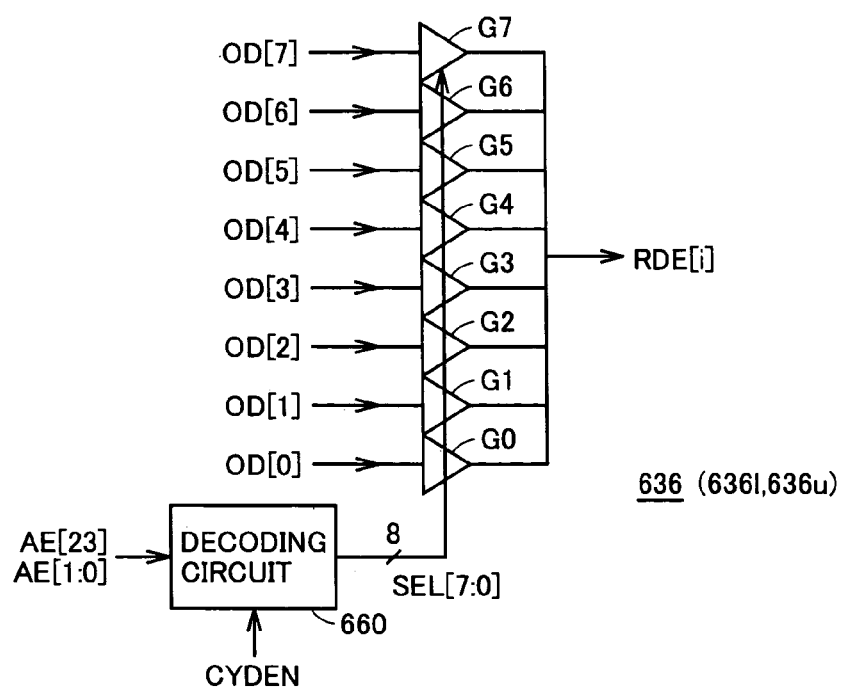
FIG. 62 is a diagram showing an example of the configuration of the data selection circuit and selected signal generation part shown in FIG. 59.

FIG. 62 is a diagram showing an example of the configurations of data selection circuits 636*u* and 636*l* as well as the part that generates selection signal SEL [7:0] shown in FIG. 59. The above data selection circuits 636*l* and 636*u* have the same configuration, and therefore FIG. 62 representatively shows a data selection circuit 636. In addition, FIG. 62 shows the configuration of the part that corresponds to output data RDE [i] of one bit. Data selection circuit 636 is activated in accordance with selection signals SEL [7:0], respectively, and selects 1 bit of data bit OD [7:0] of 8 words at the time when activated, and includes selection gate circuits G7 to G0 for generating data bit RDE [i].

Word data bits OD [7] to OD [0] supplied from the latch circuit in the previous stage shown in FIG. 59 show the bits of the same position in 8 words. Selection gate circuits G7 to G0 may be formed of a tri-state buffer circuit or may be formed of a transmission gate circuit. One word out of 8 words is designated by selection signal SEL [7:0] so that the corresponding 1 bit is selected from data bits OD [7:0] so as to generate internal read-out data RDE [i]. The basic configuration of the data selection circuit shown in this FIG. 62 is provided to each of output data bits RDE [7:0] and RDE [8:15].

Selection signal SEL [7:0] is generated by a decoding circuit 660 activated when column selection activation signal CYDEN is activated, to decode internal 25 read-out column address bits AE [23] and AE [1:0]. Internal read-out column address bit AE [23] corresponds to external address bit AA [2] and designates the upper word or the lower word. One bit of 8-bit selection signal SEL [7:0] is driven to the selected state by decoding internal read-out column address bits AE [23] and AE [1:0] of 3 bits.

In the configuration shown in this FIG. 59, upper word (16-bit external data) and lower word (16-bit external data) of 32-bit word are stored in each of blocks BAL [1] and BAL [0], and thereby the lower word and the upper word of 8 words can be successively read out in the page mode.

Figure 63:
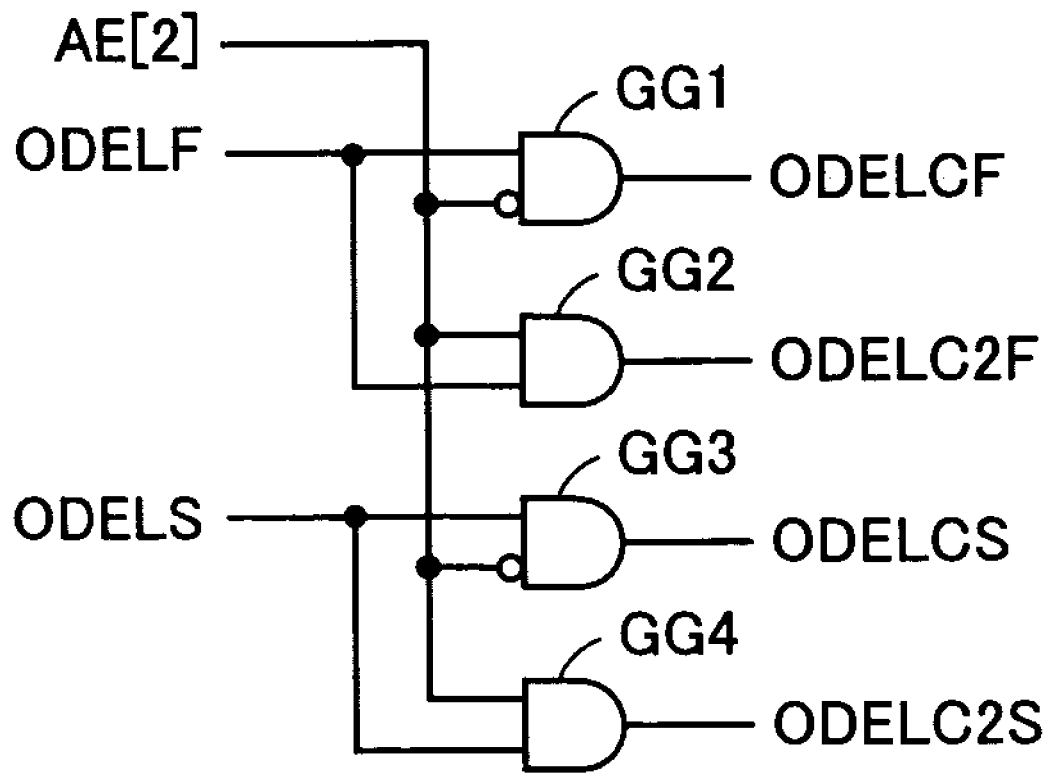
FIG. 63 is a diagram showing an example of the configuration of the part that generates the data transfer control signal shown in FIG. 59.

FIG. 63 is a diagram schematically showing the configuration of the part that generates a signal for carrying out operation controls of buffer circuits 630 to 633 shown in FIG. 59. In FIG. 63, the transfer control signal generation part includes: a gate circuit GG1 that receives basic first sense transfer control signal ODELF and internal read-out column address bit AE [2] to generate data transfer control signal ODELCF; an AND gate circuit GG2 that receives internal read-out column address bit AE [2] and basic first sense transfer control signal ODELF to generate transfer control signal ODELC2F; a gate circuit GG3 that receives basic second sense transfer control signal ODELS and internal read-out column address bit AE [2] to generate second sense transfer control signal ODELCS; and an AND gate circuit GG4 that receives basic second sense transfer control signal ODELS and internal read-out column address bit AE [2] to generate second sense transfer control signal ODELC2S.

Gate circuits GG1 and GG2 operate as buffer circuits when internal read-out column address bit AE [2] is "0" and gate circuits GG2 and GG4 operate as buffer circuits when internal read-out column address bit AE [2] is "1". In the buffer circuit operation, these gate circuits GG1 and GG2 generate first sense transfer control signals ODELCF and ODELC2F in accordance with basic first sense transfer control signal ODELF, and gate circuits GG3 and GG4 generate second sense transfer control signals ODELCS and ODELC2S in accordance with second sense transfer control signal ODELS. As a result, data can be transferred from the sense amplifier circuits arranged for the selection block of memory array blocks BAL [1] and BAL [0].

Here, first sense transfer control signals ODELF and ODELS in the circuit shown in this FIG. 63, as well as sense amplifier precharging activation signal ATDEE and column selection activation signal CYDEN shown in FIG. 60 are generated from the CPU shown in FIG. 4 in accordance with the activation of read-out mode activation signal ICE. However, these transfer control signals may be generated on the basis of the internal clock-signals by means of the hardware circuit as in the verification operation. The configuration of the sense activation circuit in the verification operation can be utilized as an activation circuit in the data read-out.

In addition, in the case where sense amplifier circuits 625 to 628 shown in FIG. 59 are utilized as sense amplifiers for verification, data read-out in the random mode is performed in units of 16 bits, to be compared with the data read out from the page buffer. However, sense amplifiers 625 to 628 shown in FIG. 59 may be provided separately from the verification sense amplifiers and may be the sense amplifiers for outputting the final data provided in common to all the banks in the case of the multi-bank configuration inside the memory device.

In addition, as for the write driver for data write-in, write drive circuits are provided respectively to internal read-out data lines BDE, and data write-in is performed in 16-bit units by selectively activating the write drivers in accordance with an address signal. The write drive circuit is selectively activated at the time of the data write-in through the utilizing of the configuration similar to the configuration for generating sense amplifier selection activation signal SE [7:0].

In addition, the number of address bits is not limited to 24 bits. It is merely required that the first address bit that designates the array block in the SLC configuration is exchanged with the most significant address bit in the MLC configuration, and this first address bit is utilized for identification of the upper word or lower word in the word data stored in 16-bit memory cells in the MLC configuration.

In addition, the memory cell configuration is not limited to that of the NOR-type memory, but the present invention can be applied to any other type of memory such as AND-type memory and NAND-type memory.

The present invention can be applied to a nonvolatile semiconductor memory device for storing multi-level data in a nonvolatile manner. In particular, the nonvolatile semiconductor memory device according to the present invention can be utilized in the application requiring storage of data in a nonvolatile manner in a small area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory blocks and inputting and outputting multi-bit data, comprising:
   address switching circuitry for using a first bit of an address signal of multi-bits as a block selection address bit designating a memory block in a first operation mode, and using said first bit of said address signal, in a second operation mode, as an address bit indicating an order of supplied multi-bit data while using a second bit of said address signal as said block selection address bit in said second operation mode.

2. The semiconductor memory device according to claim 1, wherein
   said first operation mode is an operation mode for storing binary data in one memory cell, and
   said second operation mode is an operation mode for storing multi-level data of more than tri-level in one memory cell.

3. The semiconductor memory device according to claim 1, further comprising:
   a page buffer for successively storing data in accordance with said address signal; and
   a data conversion circuit for changing the order and bit positions of the data externally supplied and writing changed data in said page buffer in said second operation mode.

4. The semiconductor memory device according to claim 3, wherein
   said data conversion circuit changes bit positions such that different bits in a same data are stored in the one memory cell in said second operation mode.

5. The semiconductor memory device according to claim 1, further comprising:
   data compression circuitry for compressing data of a plurality of addresses read out from said page buffer, into data of one address in said second operation mode; and
   cell write-in circuitry for writing the data from said data compression circuitry in memory cells in accordance with an address signal other than said first bit in said address signal of multi-bits.

6. The semiconductor memory device according to claim 5, wherein
said cell write-in circuitry sequentially changes the address signal and successively writes, into memory cells of a plurality of addresses, corresponding compressed data sequentially.

7. The semiconductor memory device according to claim 6, further comprising:
verification circuitry for sequentially and successively reading out the data written from said cell write-in circuitry and verifying whether the read out data coincide with written data.

8. The semiconductor memory device according to claim 7, wherein
said verification circuitry includes:
a sense amplifier for reading out data of a selected memory cell;
a sense activation circuit for activating said sense amplifier a plurality of times for one address; and
determination circuit for comparing the data sensed and read out by said sense amplifier with a corresponding data from said page buffer and determining whether the data is accurately written, in accordance with a result of comparison.

9. The semiconductor memory device according to claim 8, wherein
said sense activation circuit further generates a control signal for precharging an output of said sense amplifier between successive activations of a sensing operation and at least one of said control signal and a signal activating said sense amplifier has such activation periods for one address that a following activation period is shorter than a first activation period.

10. The semiconductor memory device according to claim 8, wherein
said verification circuitry prohibits subsequent writing of data for corresponding memory cell into said page buffer when non-coincidence is detected.

11. The semiconductor memory device according to claim 8, wherein
said verification circuitry sets, when coincidence is detected, a value of a corresponding bit in said page buffer to a bit value prohibiting subsequent write-in to a corresponding memory cell.

12. The semiconductor memory device according to claim 5, further comprising:
buffer read circuitry for reading out, in synchronization with a transition of the address signal to said page buffer, corresponding data from said page buffer.

13. The semiconductor memory device according to claim 12, wherein
said buffer read circuitry includes:
an oscillator oscillating at a predetermined period when activated;
a counter for changing an address signal in accordance with an output signal of said oscillator to generate said address signal to said page buffer; and
a page buffer read-out activation circuit for activating a read out activation signal to said page buffer in accordance with said output signal from said oscillator.

* * * * *